(12) United States Patent
Murakami et al.

(10) Patent No.: US 10,175,557 B2
(45) Date of Patent: Jan. 8, 2019

(54) OPTICAL WAVELENGTH CONVERSION ELEMENT CONTAINING IONIC LIQUID, AND ARTICLE EQUIPPED WITH SAID OPTICAL WAVELENGTH CONVERSION ELEMENT

(71) Applicants: Nippon Kayaku KabushikiKaisha, Chiyoda-ku, Tokyo (JP); Tokyo Institute Of Technology, Meguro-ku, Tokyo (JP)

(72) Inventors: Yoichi Murakami, Tokyo (JP); Toshiyuki Ito, Tokyo (JP); Ryoutarou Morita, Tokyo (JP); Kazuki Niimi, Tokyo (JP); Noriko Kiyoganagi, Tokyo (JP)

(73) Assignees: Nippon Kayaku KabushikiKaisha, Tokyo (JP); Tokyo Institute Of Technology, Tokyo (JP)

(*) Notice: Subject to any disclaimer, the term of this patent is extended or adjusted under 35 U.S.C. 154(b) by 302 days.

(21) Appl. No.: 15/113,962

(22) PCT Filed: Jan. 29, 2015

(86) PCT No.: PCT/JP2015/052549
§ 371 (c)(1),
(2) Date: Jul. 25, 2016

(87) PCT Pub. No.: WO2015/115556
PCT Pub. Date: Aug. 6, 2015

(65) Prior Publication Data
US 2017/0084758 A1    Mar. 23, 2017

(30) Foreign Application Priority Data

Jan. 31, 2014  (JP) .................................. 2014-017103
Feb. 10, 2014  (JP) .................................. 2014-023668

(51) Int. Cl.
*G02F 1/35*      (2006.01)
*G02F 1/361*     (2006.01)
(Continued)

(52) U.S. Cl.
CPC .......... *G02F 1/361* (2013.01); *B01J 31/0244* (2013.01); *B01J 31/0281* (2013.01);
(Continued)

(58) Field of Classification Search
CPC .......... G02F 1/353; G02F 1/355; G02F 1/361; H01L 31/02162; H01L 31/055;
(Continued)

(56) References Cited

U.S. PATENT DOCUMENTS 7,683,363 B2   3/2010  Miteva et al.
9,429,681 B2*  8/2016  Murakami ........... H01G 9/2013
(Continued)

FOREIGN PATENT DOCUMENTS

JP   2005-89313 A    4/2005
JP   2008-506798 A   3/2008
(Continued)

OTHER PUBLICATIONS

International Search Report and Written Opinion dated Feb. 10, 2015 in co-pending PCT application No. PCT/JP2014/080937.
(Continued)

*Primary Examiner* — Daniel Petkovsek
(74) *Attorney, Agent, or Firm* — Nields, Lemack & Frame, LLC

(57) ABSTRACT

There is provided an optical wavelength conversion element with a good temporal stability and such a high optical wavelength conversion efficiency that the element is viable even under sunlight or similar, low intensity light. Owing to these properties, the element is suited for use in solar cells, photocatalysts, photocatalytic hydrogen and oxygen gener-
(Continued)

ating devices, photon upconversion filters, and like articles. The optical wavelength conversion element is visually homogeneous and transparent and produced by dissolving and/or dispersing in an ionic liquid (C) a combination of organic photosensitizing molecules (A) and organic light-emitting molecules (B) that exhibits triplet-triplet annihilation. The organic photosensitizing molecules (A) have either an only one local maximum absorption wavelength or a plurality of local maximum absorption wavelengths, and either the single local maximum absorption wavelength or a maximum one of the plurality of local maximum absorption wavelengths is from 250 nm to 499 nm.

18 Claims, 26 Drawing Sheets

(51) Int. Cl.
  *H01L 31/055* (2014.01)
  *H01B 1/12* (2006.01)
  *B01J 31/02* (2006.01)
  *B01J 35/00* (2006.01)
  *H01L 31/0216* (2014.01)
(52) U.S. Cl.
  CPC ......... *B01J 31/0282* (2013.01); *B01J 35/004* (2013.01); *G02F 1/353* (2013.01); *H01B 1/122* (2013.01); *H01L 31/02162* (2013.01); *H01L 31/055* (2013.01); *Y02E 10/52* (2013.01)
(58) Field of Classification Search
  CPC ........................ B01J 31/0244; B01J 31/0281; B01J 31/0282; B01J 35/004; H01B 1/122; Y02E 10/52
  See application file for complete search history.

(56) References Cited

U.S. PATENT DOCUMENTS

| 2008/0103279 | A1 | 5/2008 | Heun et al. | |
|---|---|---|---|---|
| 2013/0274090 | A1 | 10/2013 | Murakami et al. | |
| 2014/0358198 | A1* | 12/2014 | Buchholz ............... | C09K 11/06 607/88 |
| 2016/0053168 | A1 | 2/2016 | Kamada et al. | |
| 2016/0312113 | A1 | 10/2016 | Murakami et al. | |

FOREIGN PATENT DOCUMENTS

| JP | 4518313 B2 | 8/2010 |
|---|---|---|
| JP | 2011-505479 A | 2/2011 |
| JP | 2013-168424 A | 8/2013 |
| JP | 2014-96419 A | 5/2014 |
| JP | 5750770 B2 | 7/2015 |
| WO | 2012/050137 A1 | 4/2012 |
| WO | 2014/136619 A1 | 9/2014 |

OTHER PUBLICATIONS

International Preliminary Report on Patentability dated Jul. 23, 2016 in co-pending PCT application No. PCT/JP2014/080937.
International Search Report and Written Opinion dated Apr. 28, 2015 in corresponding PCT application No. PCT/JP2015/052549.
International Preliminary Report on Patentability dated Aug. 11, 2016 in corresponding PCT application No. PCT/JP2015/052549.
"Screening of an Ionic Liquid as Medium for Photochemical Reactions," Chemical Physics Letters, vol. 362, Aug. 26, 2002, pp. 435-440, Alvaro et al.
"Up-Conversion Fluorescence: Noncoherent Excitation by Sunlight," Physical Review Letters, vol. 97, Iss.14, Oct. 6, 2006, Baluschev, et al.
"Upconversion with Ultrabroad Excitation Band: Simultaneous Use of Two Sensitizers," Applied Physics Letters, vol. 90, 2007, Baluschev et al.
"A General Approach for Non-Coherently Excited Annihilation Up-Conversion: Transforming the Solar-Spectrum," New Journal of Physics, vol. 10, 2008, Baluschev, et al.
"New 2,6-modified BODIPY sensitizers for dye-sensitized solar cells," Dyes and Pigments, vol. 94, 2012, pp. 224-232, Mao Mao, et al.
"Annihilation assisted upconversion: all-organic, flexible and transparent multicolour display," New Journal of Physics, vol. 10, 2008, Miteva, et al.
"Multicomponent Polymeric Film for Red to Green Low Power Sensitized Up-Conversion," The Journal of Physical Chemistry A, vol. 113, No. 7, 2009, pp. 1171-1174, Monguzzi, et al.
"Photochemical photon upconverters with ionic liquids," Chemical Physical Letters, vol. 516, Nov. 2011, pp. 56-61, Murakami, et al.
"Development of High-Efficiency Photon Upconverters and their Mechanism Elucidations," Dai 48 Kai National Heat Transfer Symposium of Japan Koen Ronbunshu (Jun. 2011), Murakami.
"Dynamics of the photon upconverter: Energy and molecular transport in ionic liquids," Dai 49 Kai National Heat Transfer Symposium of Japan Koen Ronbunshu (May 2012), Murakami.
"Development of Phase-Stable Photon Upconverters for Efficient Solar Energy Utilization," Thermal Science & Engineering, vol. 20, No. 2, 2012, pp. 15-26, Murakami.
"Influence of Temperature on Low-Power Upconversion in Rubbery Polymer Blends," Journal of the American Chemical Society, vol. 131, No. 33, 2009, pp. 12007-12014, Singh-Rachford, et al.
"Organic Triplet Sensitizer Library Derived from a Single Chromophore (BODIPY) with Long-Lived Triplet Excited State for Triplet-Triplet Annihilation Based Upconversion," The Journal of Organic Chemistry, vol. 76, No. 17, 2011, pp. 7056-7064, Wu, et al.
Nagasawa et al., "Highly Efficient and Specific Gelation of Ionic Liquids by Polymeric Electrolytes to Form Ionogels with Substantially High Gel-Sol Transition Temperatures and Rheological Properties Like Self-Standing Ability and Rapid Recovery," ACS Macro Letters, vol. 1, Issue 9, pp. 1108-1112, 2012.
Xinglin et al., "Development of Energy Upconversion Based on Triplet-Triplet Annihilation," Progress in Chemistry, vol. 24, No. 10, pp. 1880-1889, Oct. 2012.
Hanabusa et al., "Specialist Gelator for Ionic Liquids", Langmuir, vol. 21, No. 23, pp. 10383-10390, 2005.
Loudet et al., "BODIPY Dyes and their Derivatives: Syntheses and Spectroscopic Properties", Chemical Reviews, vol. 107, No. 11, pp. 4891-4932, 2007.
Wang et al., "High Efficiency Dye-Sensitized Nanocrystalline Solar Cells Based on Ionic Liquid Polymer Gel Electrolyte", Chemical Communications, pp. 2972-2973, 2002.
Office action dated Aug. 21, 2018 in co-pending U.S. Appl. No. 15/102,748.

* cited by examiner

OPTICAL WAVELENGTH CONVERSION ELEMENT CONTAINING IONIC LIQUID, AND ARTICLE EQUIPPED WITH SAID OPTICAL WAVELENGTH CONVERSION ELEMENT

TECHNICAL FIELD

The present invention relates to an optical wavelength conversion element containing an ionic liquid and also relates to solar cells, photocatalysts, photocatalytic hydrogen and oxygen generating devices, photon upconversion filters, and like articles equipped with such an optical wavelength conversion element.

BACKGROUND ART

In efforts to prevent global warming amid strong demands for clean alternative energy, new technology is urgently needed that is capable of efficiently converting sunlight to secondary energy (electric power, hydrogen, and the like). Expectations are growing for light-to-secondary energy conversion elements (i.e., elements converting light to secondary energy), such as solar cells and hydrogen generating photocatalysts, that exhibit a high light-to-secondary energy conversion efficiency (i.e., efficiency with which light is converted to secondary energy). In energy conversion, typical solar cells, hydrogen generating photocatalysts, and like light-to-secondary energy conversion elements utilize only part of the broad spectrum of sunlight below a certain threshold wavelength that is unique to the individual light-to-secondary energy conversion elements, failing to utilize those components that have longer wavelengths than the threshold wavelength. Thus, photon upconversion, in which the wavelengths of light are converted by absorbing relatively long wavelengths of light and emitting relatively short wavelengths of light, is being studied as one of technologies for effectively utilizing the broad spectrum of sunlight.

Research on photon upconversion by means of multiphoton absorption by rare-earth elements has a history of more than 50 years. Rare-earth elements, however, generally need very high incident light intensity for multiphoton absorption, which makes it difficult to target weak light, such as sunlight, for conversion in this method.

Several publications have been made recently about organic molecules capable of photon upconversion by means of light absorption and emission.

Patent Document 1 describes compositions by which photon energy upconversion takes place that contain at least a first component (e.g., phthalocyanine, a metal porphyrin, or a metal phthalocyanine) and a second component (e.g., a polyfluorene, an oligofluorene, a copolymer of these compounds, or a polyparaphenylene). The first component acts as a photon receptor that absorbs energy in a first wavelength range. The second component acts as a photon emitter that emits energy in a second wavelength range.

Non-patent Document 1 describes photon upconverters that exploit triplet-triplet annihilation (hereinafter, "TTA") in organic molecules for upconversion of sunlight or similar, relatively weak light in a toluene solvent.

Some existent photon upconverters contain a high molecular weight organic polymer as a medium for organic molecules (see Non-patent Documents 2 and 3).

Patent Document 2 describes a photon upconversion system made up of at least one polymer and at least one sensitizer containing at least one type of heavy atoms, where the sensitizer has a higher triplet energy level than the polymer.

Non-patent Document 2 describes a photon upconverter that uses a polymer of cellulose acetate (molecular weight: approximately 100,000) as a dispersion medium for organic molecules.

Non-patent Document 3 describes a photon upconverter that uses, as a medium, a rubbery polymer with a glass transition temperature (Tg) of 236 K ($-37°$ C.) that is soft at room temperature.

Non-patent Document 4 describes a photon upconverter that uses an oligomer of styrene (mixture of a trimer and a tetramer of styrene) as a medium for organic photosensitizing molecules and organic light-emitting molecules.

Non-patent Document 5 describes: metal porphyrins as organic photosensitizing molecules that can be used in TTA photon upconversion; diphenylanthracene, 9,10-bis(phenylethynyl)anthracene, and 9,10-bis(phenylethynyl)naphthacene as organic light-emitting molecules; and toluene as a medium for the organic photosensitizing and light-emitting molecules.

Non-patent Document 6 describes: a boron-dipyrromethene (BODIPY) derivative as a sensitizer for TTA photon upconversion; perylene or 1-chloro-9,10-bis(phenylethynyl)anthracene as an acceptor; and toluene as a medium.

Non-patent Document 7 describes photon upconversion where biacetyl is used as a sensitizer, 2,5-diphenyloxazole (hereinafter, "PPO") as light-emitting molecules, and benzene as a medium.

Non-patent Document 8 describes photon upconversion by means of polymethyl methacrylate film where 2-methoxy thioxanthone is used as a sensitizer and PPO as light-emitting molecules.

The TTA-based photon upconverter, in principle, requires that organic molecules diffuse and collide with each other in a medium for energy transfer. Most prior art (Non-patent Documents 1, 4, 5, 6, and 7) uses as a medium either a volatile organic solvent, such as toluene or benzene, or a highly volatile medium, such as a styrene oligomer. These volatile organic solvents and highly volatile media (e.g., styrene oligomers), however, create safety issues due to their flammability. They also forbid use of resin materials that, when used in or as a container for an optical wavelength conversion element, may dissolve in the media or swell due to permeation of the media, which is inconvenient.

TTA-based photon upconverters that use a polymer compound, such as cellulose acetate or a soft rubber, as a medium (Patent Document 2 and Non-patent Documents 2, 3, and 8) have a problem that the upconversion emission intensity markedly decreases at room temperature (300 K) or below because the polymer compound is flammable and either solid or poorly fluidic at normal temperature (300 K). Non-patent Document 3 describes that the upconversion emission intensity is sufficiently high at relatively high temperatures (>300 K) where the polymer is sufficiently fluidic, but very low at low temperatures ($\leq$300 K) where the medium is poorly fluidic because TTA photon upconversion requires that the organic molecules, responsible for producing triplet excitation energy, diffuse and collide with each other in a medium for energy transfer between the organic molecules.

To solve these issues/problems, the inventors of the present invention propose an optical wavelength conversion element for TTA photon upconversion produced by dissolving and/or dispersing organic photosensitizing molecules and organic light-emitting molecules in an ionic liquid. The proposed optical wavelength conversion element addresses conventional problems including the low upconversion emission intensity due to high viscosity of the medium, the flammability of the medium, and the volatility of the medium (Patent Document 3).

Patent Document 3, however, makes no specific proposals for an optical wavelength conversion element that converts ultraviolet-to-visible light to ultraviolet light.

Non-patent Documents 7 and 8 describe photon upconversion of visible light to ultraviolet light in the 350 nm to 440 nm region (this region is close to the visible region). No prior art, however, seems to disclose conversion to ultraviolet light with a local maximum emission wavelength of 360 nm or below.

There is hence a strong demand for optical wavelength conversion elements that exhibit a good temporal stability and a high optical wavelength conversion efficiency (upconversion emission intensity), that address conventional problems including the flammability and volatility of the medium, and that are capable of converting light in the ultraviolet-to-visible region to light in a shorter wavelength range (e.g., ultraviolet light).

CITATION LIST

Patent Documents

Patent Document 1: JP 4518313 B
Patent Document 2: JP 2008-506798 A
Patent Document 3: WO 2012/050137 A Non-Patent Documents Non-patent Document 1: S. Baluschev, et al., Physical Review Letters, vol. 97, pp. 143903-1-143903-3, 2006
Non-patent Document 2: A. Monguzzi, et al., Journal of Physical Chemistry A, vol. 113, pp. 1171-1174, 2009
Non-patent Document 3: Tanya N. Singh-Rachford, et al., Journal of the American Chemical Society, vol. 131, pp. 12007-12014, 2009
Non-patent Document 4: T. Miteva, et al., New Journal of Physics, vol. 10, pp. 103002-1-103002-10, 2008.
Non-patent Document 5: S. Baluschev, et al., New Journal of Physics, vol. 10, pp. 013007-1-013007-12, 2008
Non-patent Document 6: W. Wu, et al., J. Org. Chem., 2011, 76, pp. 7056-7064
Non-patent Document 7: T. N. Singh-Rachford, et al., Journal of Physical Chemistry A, vol. 113, pp. 5912-5917, 2009
Non-patent Document 8: P. B. Merkel, et al., Journal of Luminescence, vol. 129, pp. 303-306, 2009

SUMMARY OF THE INVENTION

Problems to Be Solved by the Invention

In view of these problems, it is an object of the present invention to provide an optical wavelength conversion element that has a good temporal stability and such a high optical wavelength conversion efficiency that the element is viable even under sunlight or similar, low intensity light, that is suited for use in solar cells, photocatalysts, photocatalytic hydrogen and oxygen generating devices, sterilization devices, photon upconversion filters, and like articles, and that is capable of converting light in the ultraviolet-to-visible region to light in a shorter wavelength range (e.g., ultraviolet light), and to provide a solar cell, photocatalyst, photocatalytic hydrogen and oxygen generating device, photon upconversion filter, or like article equipped with the optical wavelength conversion element.

Solution to Problem

The inventors of the present invention have diligently worked to solve the problems and as a result, have found that the object is achieved by a visually homogeneous and transparent optical wavelength conversion element that is produced by dissolving and/or dispersing in an ionic liquid (C) a combination of organic photosensitizing molecules (A) and organic light-emitting molecules (B) that exhibits TTA, where the organic photosensitizing molecules (A) are a particular kind of organic photosensitizing molecules, which has led to the completion of the invention.

More specifically, to address the problems, the present invention is directed to a visually homogeneous and transparent optical wavelength conversion element produced by dissolving and/or dispersing in an ionic liquid (C) a combination of organic photosensitizing molecules (A) and organic light-emitting molecules (B) that exhibits TTA, wherein the organic photosensitizing molecules (A) have either an only one local maximum absorption wavelength or a plurality of local maximum absorption wavelengths, and either the single local maximum absorption wavelength or a maximum one of the plurality of local maximum absorption wavelengths is from 250 nm to 499 nm.

According to this arrangement, the organic photosensitizing molecules (A) used have either an only one local maximum absorption wavelength or a plurality of local maximum absorption wavelengths, and either the single local maximum absorption wavelength or a maximum one of the plurality of local maximum absorption wavelengths is from 250 nm to 499 nm. Therefore, the element is capable of converting light in the 250 nm to 499 nm range, which falls in the ultraviolet-to-visible region, to light in a shorter wavelength range (e.g., ultraviolet light).

Additionally, the arrangement no longer uses the conventionally used media, such as flammable and highly volatile organic solvents (e.g., toluene and benzene), flammable, poorly fluidic, and highly viscous rubbery polymers, and flammable oligomers that have practically non-negligible vapor pressure. Instead, an ionic liquid is used that generally has extremely low vapor pressure (extremely low volatility), good flame retardance, and other favorable properties. The optical wavelength conversion element arranged as above is therefore relatively safe in practical use due to relatively low volatility and relatively high flame retardance thereof. In addition, the optical wavelength conversion element arranged as above is capable of sufficiently driving TTA by means of diffusion and mutual collision of the organic photosensitizing molecules (A) and the organic light-emitting molecules (B) because the element contains the organic photosensitizing molecules (A) and the organic light-emitting molecules (B) being dissolved and/or dispersed in the relatively highly fluidic ionic liquid (C). As a result, the optical wavelength conversion element arranged as above has a relatively high optical wavelength conversion efficiency.

The optical wavelength conversion element arranged as above also exhibits a good temporal stability because the element contains the organic photosensitizing molecules (A) and the organic light-emitting molecules (B) being dissolved and/or dispersed in the thermally stable ionic liquid (C) in a visually homogeneous and transparent state.

"Visually homogeneous and transparent," throughout this application, refers to visual absence of separation of a layer into two or more layers, visual absence of solids, visual homogeneousness, visual absence of turbidity and cloudiness, and visual transparency. "Dissolving and/or dispersing," throughout this application, refers to either "dissolve" or "disperse" or "concurrently dissolve and disperse."

The present invention is also directed to a solar cell equipped with the optical wavelength conversion element. According to this arrangement, the solar cell has a high photoelectric conversion efficiency because the optical wavelength conversion element used has a good temporal stability and such a high optical wavelength conversion efficiency that the element is viable even under sunlight or similar, low intensity light and also because the element is capable of converting light in the ultraviolet-to-visible region to light in a shorter wavelength range (e.g., ultraviolet light).

The present invention is further directed to a photocatalyst equipped with the optical wavelength conversion element. According to this arrangement, the photocatalyst has a high catalytic efficiency because the optical wavelength conversion element used has a good temporal stability and such a high optical wavelength conversion efficiency that the element is viable even under sunlight or similar, low intensity light and also because the element is capable of converting light in the ultraviolet-to-visible region to light in a shorter wavelength range (e.g., ultraviolet light).

The present invention is yet further directed to a photocatalytic hydrogen and oxygen generating device equipped with the optical wavelength conversion element. According to this arrangement, the photocatalytic hydrogen and oxygen generating device has a high hydrogen and oxygen generating efficiency because the optical wavelength conversion element used has a good temporal stability and such a high optical wavelength conversion efficiency that the element is viable even under sunlight or similar, low intensity light and also because the element is capable of converting light in the ultraviolet-to-visible region to light in a shorter wavelength range (e.g., ultraviolet light).

The present invention is further directed to a photon upconversion filter converting light of relatively long wavelengths to light of relatively short wavelengths, the filter being equipped with: the optical wavelength conversion element; and a cell that serves as a sealing/holder shell, wherein the optical wavelength conversion element is sealed in the cell.

According to this arrangement, the photocatalytic hydrogen and oxygen generating device has a high hydrogen and oxygen generating efficiency because the optical wavelength conversion element used has such a high optical wavelength conversion efficiency that the element is viable even under sunlight or similar, low intensity light.

Advantageous Effects of the Invention

The present invention provides an optical wavelength conversion element that has a good temporal stability and such a high optical wavelength conversion efficiency that the element is viable even under sunlight or similar, low intensity light and that is capable of converting light in the ultraviolet-to-visible region to light in a shorter wavelength range (e.g., ultraviolet light) and also provides articles equipped with the optical wavelength conversion element (solar cells, photocatalysts, photocatalytic hydrogen and oxygen generating devices, and photon upconversion filters).

MODE FOR CARRYING OUT THE INVENTION

Figure 1:
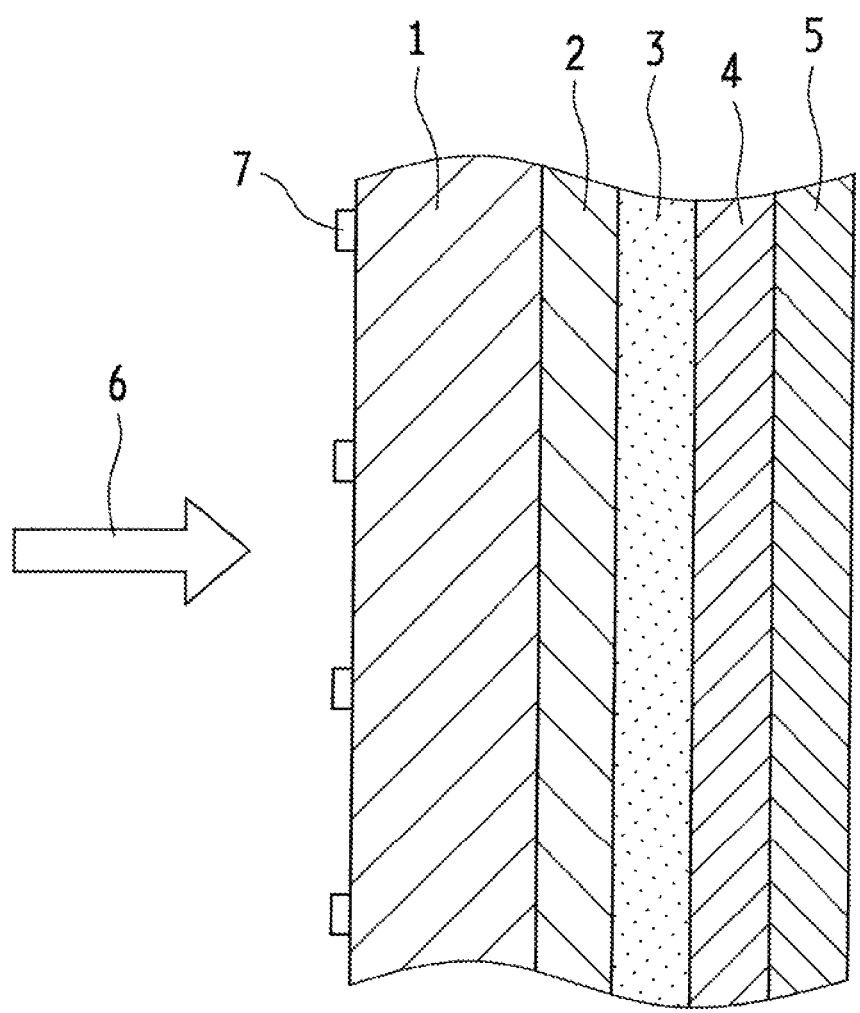
FIG. 1 is a cross-sectional view of a solar cell in accordance with an example of the present invention.

The following will describe the present invention in more detail.

An optical wavelength conversion element in accordance with the present invention is visually homogeneous and transparent and produced by dissolving and/or dispersing in an ionic liquid (C) a combination of organic photosensitizing molecules (A) and organic light-emitting molecules (B) that exhibits TTA, and the organic photosensitizing molecules (A) have either an only one local maximum absorption wavelength or a plurality of local maximum absorption wavelengths, and either the single local maximum absorption wavelength or a maximum one of the plurality of local maximum absorption wavelengths (hereinafter, will be collectively referred to as the "maximum one of local maximum absorption wavelengths" irrespective of whether there exists only one local maximum absorption wavelength or there exist a plurality of local maximum absorption wavelengths) is from 250 nm to 499 nm.

The organic photosensitizing molecules (A) and the organic light-emitting molecules (B) may be any molecular species provided that the combination of the molecules (A) and (B) exhibits TTA (TTA-based emission). The organic photosensitizing molecules (A) may be π-conjugated molecules that have an absorption band in the ultraviolet-to-visible region, and the organic light-emitting molecules (B) may be π-conjugated molecules that have an emission band in the ultraviolet-to-visible region. The organic photosensitizing molecules (A) and the organic light-emitting molecules (B) may be selected from a broad range of low to high molecular species including aromatic π-conjugated system compounds, especially polycyclic aromatic π-conjugated system compounds, and the compounds described in, for example, Non-patent Document 5.

The organic photosensitizing molecules (A) may be any molecular species that has a maximum one of local maximum absorption wavelengths in the 250 nm to 499 nm range, preferably in the 330 nm to 499 nm range, more preferably in the 350 nm to 499 nm range, and even more preferably in the 350 nm to 410 nm range.

The organic photosensitizing molecules (A) may be any molecular species, low molecular weight compound, high molecular weight compound (polymer compound), or supermolecules that, irrespective of whether being termed a pigment or not, have a maximum one of local maximum absorption wavelengths in the 250 nm to 499 nm range. Examples of the organic photosensitizing molecules (A) include, but are by no means limited to, acenaphthene derivatives, acetophenone derivatives, anthracene derivatives, diphenylacetylene derivatives, acridan derivatives, acridine derivatives, acridone derivatives, thioacridone derivatives, angelicin derivatives, anthracene derivatives, anthraquinone derivatives, azafluorene derivatives, azulene derivatives, benzyl derivatives, carbazole derivatives, coronene derivatives, sumanene derivatives, biphenylene derivatives, fluorene derivatives, perylene derivatives, phenanthrene derivatives, phenanthroline derivatives, phenazine derivatives, benzophenone derivatives, pyrene derivatives, benzoquinone derivatives, biacetyl derivatives, bianthranil derivatives, fullerene derivatives, graphene derivatives, carotin derivatives, chlorophyll derivatives, chrysene derivatives, cinnoline derivatives, coumarin derivatives, curcumin derivatives, dansylamide derivatives, flavone derivatives, fluorenone derivatives, fluorescein derivatives, helicene derivatives, indene derivatives, lumichrome derivatives, lumiflavin derivatives, oxadiazole derivatives, oxazole derivatives, periflanthene derivatives, perylene derivatives, phenanthrene derivatives, phenanthroline derivatives, phenazine derivatives, phenol derivatives, phenothiazine derivatives, phenoxazine derivatives, phthalazine derivatives, picene derivatives, porphyrin derivatives, porphycene derivatives, hemiporphycene derivatives, psoralen derivatives, angelicin derivatives, purine derivatives, pyrene derivatives, pyrromethene derivatives, pyridylketone derivatives, phenylketone derivatives, pyridylketone derivatives, thienylketone derivatives, furanylketone derivatives, quinazoline derivatives, quinoline derivatives, quinoxaline derivatives, retinal derivatives, retinol derivatives, rhodamine derivatives, riboflavin derivatives, stilbene derivatives, anthraquinone derivatives, pentacenequinone derivatives, thiophosgene derivatives, thioxanthene derivatives, thymine derivatives, triphenylene derivatives, triphenylmethane derivatives, triaryl derivatives, tryptophan derivatives, uracil derivatives, xanthene derivatives, xanthone derivatives, thioxanthone derivatives, ferrocene derivatives, azulene derivatives, biacetyl derivatives, terphenyl derivatives, terfuran derivatives, terthiophene derivatives, oligoaryl derivatives, fullerene derivatives, conjugated polyene derivatives, Group 14 element-containing condensed polycyclic aromatic compound derivatives, and condensed polycyclic heteroaromatic compound derivatives. Preferred among these examples are those which have a maximum one of local maximum absorption wavelengths in the 250 nm to 499 nm range, such as aromatic π-conjugated system compounds.

Specific examples of the organic photosensitizing molecules (A) include, but are by no means limited to, acridones, such as N-methyl acridone and N-butyl-2-chloro acridone; thioxanthones, xanthones, and xanthenes, such as 2,4-diethylthioxanthone; acridines, such as acridine yellow; coumarins, such as coumarin 6 and coumarin 314; biacetyls, such as 2,3-butanedione; anthracenes, such as 9,10-dibromoanthracene and 9,9'-bianthryl; oligoaryls, such as bifuran, bithiophene, and bis(benzoxazolyl)thiophene; and condensed polycyclic heteroaromatic compounds, such as chrysene, phenanthrene, and derivatives thereof.

The organic photosensitizing molecules (A) preferably have a structure containing no metal. The absence of metal precludes environmental metal contamination during the manufacture and disposal of the optical wavelength conversion element.

Preferred compound examples of the organic photosensitizing molecules (A) that have a structure containing no metal and that have a maximum one of local maximum absorption wavelengths in the 250 nm to 499 nm range include compounds of general formula (1)

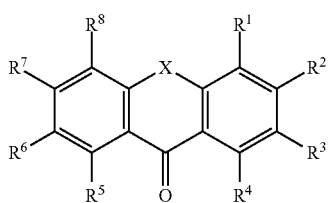

(1)

where each of $R^1$ to $R^8$ is independently any substituent including a hydrogen atom and may be identical to or different from each other, any pair of adjacent substituents in $R^1$ to $R^8$ may be joined together to form a five- or six-membered ring having any substituent including a hydrogen atom, X is a thio group (—S—), a sulfinyl group (—S(=O)—), a sulfonyl group (—S(=O)$_2$—), a divalent group of —N(R$^9$)—, or a divalent group of —C(R$^{10}$)(R$^{11}$)—, and each of $R^9$ to $R^{11}$ is independently any substituent including a hydrogen atom. "Any substituent including a hydrogen atom," throughout this specification, refers to a hydrogen atom and any substituent that is not a hydrogen atom.

Examples of $R^1$ to $R^8$ in general formula (1) include, but are by no means limited to, a hydrogen atom, an alkyl group (e.g., $C_1$-$C_{12}$ alkyl group), an alkenyl group, an alkynyl group, a halogen atom, a hydroxy group, an alkylcarbonyloxy group, an arylcarbonyloxy group, an alkoxycarbonyloxy group, an aryloxycarbonyloxy group, a carboxylate group, an alkylcarbonyl group, an arylcarbonyl group, an alkoxycarbonyl group, an aminocarbonyl group, an alkylaminocarbonyl group, a dialkylaminocarbonyl group, an alkylthiocarbonyl group, an alkoxyl group, a phosphate group, a phosphonate group, a phosphinate group, a cyano group, an amino group (including an alkylamino group, a dialkylamino group, an arylamino group, a diarylamino group, and an alkylarylamino group), an acylamino group (including an alkylcarbonylamino group, an arylcarbonylamino group, a carbamoyl group, and a ureide group), an amidino group, an imino group, a sulfhydryl group, an alkylthio group, an arylthio group, a thiocarboxylate group, a sulfate group, an alkylsulfinyl group, a sulfonate group, a sulfamoyl group, a sulfonamide group, a nitro group, a trifluoromethyl group, a cyano group, an azide group, a heterocyclic group, an alkylaryl group, an aryl group, and a heteroaryl group. Examples of $R^9$ to $R^{11}$ include, but are by no means limited to, a hydrogen atom, an alkyl group (e.g., $C_1$-$C_{12}$ alkyl group), an alkenyl group, an alkynyl group, a heterocyclic group, an alkylaryl group, an aryl group, and a heteroaryl group. Examples of the substituent on the five- or six-membered ring formed by any pair of adjacent substituents in $R^1$ to $R^{11}$ being joined together that may be in general formula (1) include, but are by no means limited to, the substituents listed here as examples of $R^1$ to $R^8$.

In the compound of general formula (1), preferably, X is a thio group, and each of $R^1$ to $R^8$ is independently a hydrogen atom, a halogen atom, an alkyl group, an alkoxy group, a cyano group, a nitro group, an aryl group, or a heteroaryl group.

If X in the compound of general formula (1) is a thio group (i.e., if the compound is a thioxanthone compound), the compound may be, for example, non-substituted thioxanthone (CAS Number: 492-22-8) or a substituted thioxanthone, such as 2,4-diethylthioxanthone (CAS Number: 82799-44-8), 2-isopropylthioxanthone (CAS Number: 5495-84-1), or 2-chlorothioxanthone (CAS Number: 86-39-5).

If X in the compound of general formula (1) is a sulfinyl group (i.e., if the compound is a thioxanthone oxide), the compound may be, for example, non-substituted thioxanthone oxide (CAS Number: 7605-15-4) or a substituted thioxanthone oxide, such as 3-methylthioxanthone oxide (CAS Number: 654670-82-3) or a thioxanthone oxide derivative described in JP 58-120605 A.

If X in the compound of general formula (1) is a sulfonyl group (i.e., if the compound is a thioxanthone dioxide), the compound may be, for example, non-substituted thioxanthone dioxide (CAS Number: 3166-15-2) or a substituted thioxanthone dioxide, such as 2-methylthioxanthone dioxide (CAS Number: 87548-99-0) or a thioxanthone dioxide derivative described in JP 58-120605 A.

If X in the compound of general formula (1) is a divalent group of —N(R$^9$)— (i.e., if the compound is an acridone compound), the compound may be, for example, non-substituted acridone (CAS Number: 578-95-0) or a substituted acridone, such as N-methyl acridone (CAS Number: 719-54-0), N-methyl-2-iodo acridone (CAS Number: 1493782-35-6), N-butyl-2-chloro acridone (CAS Number: 128420-54-2), or an acridone derivative described in JP 8-67873 A.

If X in the compound of general formula (1) is a divalent group of —C(R$^{10}$)(R$^{11}$)— (i.e., if the compound is an anthrone compound), the compound may be, for example, non-substituted anthrone (CAS Number: 90-44-8) or a substituted anthrone, such as 3-methyl anthrone (CAS Number: 69653-12-9) or benzanthrone (CAS Number: 82-05-3). Any one of these examples of the organic photosensitizing molecules (A) may be used alone; alternatively, two or more of the examples may be used in the form of mixture.

Throughout this application, a "group," when referring to a particular moiety, indicates that the moiety may be unsubstituted or substituted by at least one kind of substituent (up to as many substituents as possible). As an example, an "alkyl group" may be substituted or non-substituted. Any substituent may be used in the compounds described in the present invention.

Examples of such substituents include, but are by no means limited to, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an aryl azo or heterocyclic azo group, an imide group, a phosphino group, a phosphinyl group, a phosphinyloxy group, a phosphinylamino group, a phosphono group, a phospho group, a silyl group, a hydrazino group, a ureide group, a boronate group (—B(OH)$_2$), a phosphato group (—OPO(OH)$_2$), a sulfato group (—OSO$_3$H), and other like, publicly known substituents.

More specifically, the halogen atom may be, a fluorine atom, a chlorine atom, a bromine atom, or an iodine atom.

The alkyl group may be linear, branched, or cyclic and may be substituted or non-substituted. The alkyl group may be an aliphatic alkyl group (preferably, a $C_1$-$C_{30}$ substituted or non-substituted aliphatic alkyl group, such as a methyl group, an ethyl group, a n-propyl group, an isopropyl group, a t-butyl group, a n-octyl group, an eicosyl group, a 2-chloroethyl group, a 2-cyanoethyl group, or a 2-ethyl hexyl group), a cycloalkyl group (preferably, a $C_3$-$C_{30}$ substituted or non-substituted cycloalkyl group, such as a cyclohexyl group, a cyclopentyl group, or a 4-n-dodecyl cyclohexyl group), a bicycloalkyl group (preferably, a $C_5$-$C_{30}$ substituted or non-substituted bicycloalkyl group, i.e., a univalent group, such as a bicyclo[1,2,2]heptan-2-yl group or a bicyclo[2,2,2]octan-3-yl group, obtained by removing one hydrogen atom from a $C_5$-$C_{30}$ bicycloalkane), or a tricycloalkyl group with more rings. The alkyl group in substituents described below (e.g., the alkyl group in an alkylthio group) may be one of these alkyl groups and may be an alkenyl group or an alkynyl group.

The alkenyl group may be linear, branched, or cyclic and may be substituted or non-substituted. The alkenyl group may be an aliphatic alkenyl group (preferably, a $C_2$-$C_{30}$ substituted or non-substituted aliphatic alkenyl group, such as a vinyl group, an allyl group, a prenyl group, a geranyl group, or an oleyl group), a cycloalkenyl group (preferably, a $C_3$-$C_{30}$ substituted or non-substituted cycloalkenyl group, i.e., a univalent group, such as a 2-cyclopenten-1-yl group or a 2-cyclohexen-1-yl group, obtained by removing one hydrogen atom from a $C_3$-$C_{30}$ cycloalkene), or a bicycloalkenyl group (a substituted or non-substituted bicycloalkenyl group, i.e., a univalent group obtained by removing one hydrogen atom from a bicycloalkene having one double bond; preferably, a $C_5$-$C_{30}$ substituted or non-substituted bicycloalkenyl group, such as a bicyclo[2,2,1]hept-2-ene-1-yl group or a bicyclo[2,2,2]oct-2-ene-4-yl group). The alkynyl group is preferably a $C_2$-$C_{30}$ substituted or non-substituted alkynyl group, such as an ethinyl group, a propargyl group, or a trimethylsilylethinyl group.

The aryl group is preferably a $C_6$-$C_{30}$ substituted or non-substituted aryl group, such as a phenyl group, a biphenyl group, a p-tolyl group, a naphthyl group, a m-chlorophenyl group, or an o-hexadecanoylaminophenyl group. The heterocyclic group is preferably a univalent group obtained by removing one hydrogen atom from a five- or six-membered, substituted or non-substituted, aromatic or non-aromatic heterocyclic compound and more preferably a $C_3$-$C_{30}$ five- or six-membered aromatic heterocyclic group. The heterocyclic group may be a 2-furyl group, a 2-thienyl group, a 2-pyrimidinyl group, or a 2-benzothiazolyl group. The heterocyclic group may be a cationic heterocyclic group, such as a 1-methyl-2-pyridinio group or a 1-methyl-2-quinolinio group.

The alkoxy group is preferably a $C_1$-$C_{30}$ substituted or non-substituted alkoxy group, such as a methoxy group, an ethoxy group, an isopropoxy group, a t-butoxy group, a n-octyloxy group, or a 2-methoxy ethoxy group. The aryloxy group is preferably a $C_6$-$C_{30}$ substituted or non-substituted aryloxy group, such as a phenoxy group, a 2-methylphenoxy group, a 4-t-butylphenoxy group, a 3-nitrophenoxy group, or a 2-tetradecanoylaminophenoxy group.

The silyloxy group is preferably a $C_3$-$C_{20}$ silyloxy group, such as a trimethylsilyloxy group or a t-butyldimethylsilyloxy group. The heterocyclic oxy group is preferably a $C_2$-$C_{30}$ substituted or non-substituted heterocyclic oxy group, such as a 1-phenyl tetrazole-5-oxy group or a 2-tetrahydro pyranyloxy group.

The acyloxy group is preferably a formyloxy group, a $C_2$-$C_{30}$ substituted or non-substituted alkylcarbonyloxy group, or a $C_6$-$C_{30}$ substituted or non-substituted arylcarbonyloxy group, such as a formyloxy group, an acetyloxy group, a pivaloyloxy group, a stearoyloxy group, a benzoyloxy group, or a p-methoxyphenylcarbonyloxy group.

The carbamoyloxy group is preferably a $C_1$-$C_{30}$ substituted or non-substituted carbamoyloxy group, such as a N,N-dimethylcarbamoyloxy group, a N,N-diethylcarbamoyloxy group, a morpholinocarbonyloxy group, a N,N-di-n-octylaminocarbonyloxy group, or a N-n-octylcarbamoyloxy group.

The alkylsulfonylamino or arylsulfonylamino group is preferably a $C_1$-$C_{30}$ substituted or non-substituted alkylsulfonylamino group or a $C_6$-$C_{30}$ substituted or non-substituted arylsulfonylamino group, such as a methylsulfonylamino group, a butylsulfonylamino group, a phenylsulfonylamino group, a 2,3,5-trichlorophenylsulfonylamino group, or a p-methylphenylsulfonylamino group.

The alkylthio group is preferably a $C_1$-$C_{30}$ substituted or non-substituted alkylthio group, such as a methylthio group, an ethylthio group, or a n-hexadecylthio group. The arylthio group is preferably a $C_6$-$C_{30}$ substituted or non-substituted arylthio group, such as a phenylthio group, a p-chlorophenylthio group, or a m-methoxyphenylthio group. The heterocyclic thio group is preferably a $C_2$-$C_{30}$ substituted or non-substituted heterocyclic thio group, such as a 2-benzothiazolylthio group or a 1-phenyl tetrazol-5-yl thio group.

The sulfamoyl group is preferably a $C_0$-$C_{30}$ substituted or non-substituted sulfamoyl group, such as a N-ethylsulfamoyl group, a N-(3-dodecyloxypropyl)sulfamoyl group, a N,N-dimethylsulfamoyl group, a N-acetylsulfamoyl group, a N-benzoylsulfamoyl group, or a N—(N'-phenylcarbamoyl)sulfamoyl group.

The alkylsulfinyl or arylsulfinyl group is preferably a $C_1$-$C_{30}$ substituted or non-substituted alkylsulfinyl group or a $C_6$-$C_{30}$ substituted or non-substituted arylsulfinyl group, such as a methylsulfinyl group, an ethylsulfinyl group, a phenylsulfinyl group, or a p-methylphenylsulfinyl group. The alkylsulfonyl or arylsulfonyl group is preferably a $C_1$-$C_{30}$ substituted or non-substituted alkylsulfonyl group or a $C_6$-$C_{30}$ substituted or non-substituted arylsulfonyl group, such as a methylsulfonyl group, an ethylsulfonyl group, a phenylsulfonyl group, or a p-methylphenylsulfonyl group.

The acyl group is preferably a formyl group, a $C_2$-$C_{30}$ substituted or non-substituted alkylcarbonyl group, a $C_7$-$C_{30}$ substituted or non-substituted arylcarbonyl group, or a $C_4$-$C_{30}$ substituted or non-substituted heterocyclic carbonyl group attached to a carbonyl group by a carbon atom, such as an acetyl group, a pivaloyl group, a 2-chloroacetyl group, a stearoyl group, a benzoyl group, a p-n-octyloxyphenylcarbonyl group, a 2-pyridylcarbonyl group, or a 2-furylcarbonyl group.

The aryloxycarbonyl group is preferably a $C_7$-$C_{30}$ substituted or non-substituted aryloxycarbonyl group, such as a phenoxycarbonyl group, an o-chlorophenoxycarbonyl group, a m-nitrophenoxycarbonyl group, or a p-t-butylphenoxycarbonyl group. The alkoxycarbonyl group is preferably a $C_2$-$C_{30}$ substituted or non-substituted alkoxycarbonyl group, such as a methoxycarbonyl group, an ethoxycarbonyl group, a t-butoxycarbonyl group, or a n-octadecyloxycarbonyl group.

The carbamoyl group is preferably a $C_1$-$C_{30}$ substituted or non-substituted carbamoyl group, such as a carbamoyl group, a N-methylcarbamoyl group, a N,N-dimethylcarbamoyl group, a N,N-di-n-octylcarbamoyl group, or a N-(methylsulfonyl)carbamoyl group.

The aryl azo or heterocyclic azo group is preferably a $C_6$-$C_{30}$ substituted or non-substituted aryl azo group or a $C_3$-$C_{30}$ substituted or non-substituted heterocyclic azo group, such as a phenyl azo group, a p-chlorophenyl azo group, or a 5-ethylthio-1,3,4-thiadiazol-2-yl azo group. The imide group is preferably a N-succinimide group or a N-phthalimide group.

The phosphino group is preferably a $C_2$-$C_{30}$ substituted or non-substituted phosphino group, such as a dimethylphosphino group, a diphenylphosphino group, or a methylphenoxyphosphino group. The phosphinyl group is preferably a $C_2$-$C_{30}$ substituted or non-substituted phosphinyl group, such as a phosphinyl group, a dioctyloxyphosphinyl group, or a diethoxyphosphinyl group.

The phosphinyloxy group is preferably a $C_2$-$C_{30}$ substituted or non-substituted phosphinyloxy group, such as a diphenoxyphosphinyloxy group or a dioctyloxyphosphinyloxy group. The phosphinylamino group is preferably a $C_2$-$C_{30}$ substituted or non-substituted phosphinylamino group, such as a dimethoxyphosphinylamino group or a dimethylaminophosphinylamino group.

The silyl group is preferably a $C_3$-$C_{30}$ substituted or non-substituted silyl group, such as a trimethylsilyl group, a t-butyldimethylsilyl group, or a phenyldimethylsilyl group.

The hydrazino group is preferably a $C_0$-$C_{30}$ substituted or non-substituted hydrazino group, such as a trimethyl hydrazino group. The ureide group is preferably a $C_0$-$C_{30}$ substituted or non-substituted ureide group, such as a N,N-dimethyl ureide group.

The definition of these substituents encompasses any two of the substituents jointly forming an aromatic or non-aromatic hydrocarbon or heterocyclic ring. Any of these rings may further jointly form a polycyclic condensed ring, which is also encompassed by the definition of the term. Examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianethrene ring, a chromen ring, a xanthene ring, a phenoxathiin ring, a phenothiazine ring, and a phenazine ring.

Among the substituents listed above, those which contain a hydrogen atom(s) may further have the hydrogen atom(s) replaced by any of the substituents. Examples of such substituents include those halogen atoms, alkyl groups (including a cycloalkyl group, a bicycloalkyl group, and a tricycloalkyl group), alkenyl groups (including a cycloalkenyl group and a bicycloalkenyl group), alkynyl groups, aryl groups, heterocyclic groups, cyano groups, hydroxyl groups, and nitro groups which are listed above.

The organic light-emitting molecules (B) may be any organic compound that is capable of emitting TTA-upconverted light when used together with the organic photosensitizing molecules (A) and is preferably such that the resultant optical wavelength conversion element in accordance with the present invention has a local maximum emission wavelength of less than or equal to 400 nm. This property enables an optical wavelength conversion element capable of converting light in the 250 nm to 499 nm wavelength range in the ultraviolet-to-visible region to light of shorter, less than or equal to 400 nm wavelengths.

Examples of the organic light-emitting molecules (B) include, but are by no means limited to, those among the chemical species listed in the following which have a local maximum emission wavelength of less than or equal to 400 nm: acenaphthene derivatives, acetophenone derivatives, anthracene derivatives, diphenylacetylene derivatives, acridan derivatives, acridine derivatives, acridone derivatives, thioacridone derivatives, angelicin derivatives, anthracene derivatives, anthraquinone derivatives, azafluorene derivatives, azulene derivatives, benzyl derivatives, carbazole derivatives, coronene derivatives, sumanene derivatives, biphenylene derivatives, fluorene derivatives, perylene derivatives, phenanthrene derivatives, phenanthroline derivatives, phenazine derivatives, benzophenone derivatives, pyrene derivatives, benzoquinone derivatives, biacetyl derivatives, bianthranil derivatives, fullerene derivatives, graphene derivatives, carotin derivatives, chlorophyll derivatives, chrysene derivatives, cinnoline derivatives, coumarin derivatives, curcumin derivatives, dansylamide derivatives, flavone derivatives, fluorenone derivatives, fluorescein derivatives, helicene derivatives, indene derivatives, lumichrome derivatives, lumiflavin derivatives, oxadiazole derivatives, oxazole derivatives, periflanthene derivatives, perylene derivatives, phenanthrene derivatives, phenanthroline derivatives, phenazine derivatives, phenol derivatives, phenothiazine derivatives, phenoxazine derivatives, phthalazine derivatives, picene derivatives, porphyrin derivatives, porphycene derivatives, hemiporphycene derivatives, psoralen derivatives, angelicin derivatives, purine derivatives, pyrene derivatives, pyrromethene derivatives, pyridylketone derivatives, phenylketone derivatives, pyridylketone derivatives, thienylketone derivatives, furanylketone derivatives, quinazoline derivatives, quinoline derivatives, quinoxaline derivatives, retinal derivatives, retinol derivatives, rhodamine derivatives, riboflavin derivatives, stilbene derivatives, anthraquinone derivatives, thiophosgene derivatives, thioxanthene derivatives, thymine derivatives, triphenylene derivatives, triphenylmethane derivatives, triaryl derivatives, tryptophan derivatives, uracil derivatives, xanthene derivatives, ferrocene derivatives, azulene derivatives, biacetyl derivatives, terphenyl derivatives, terfuran derivatives, terthiophene derivatives, oligoaryl derivatives, fullerene derivatives, conjugated polyene derivatives, Group 14 element-containing condensed polycyclic aromatic compound derivatives, and condensed polycyclic heteroaromatic compound derivatives.

The organic light-emitting molecules (B) used have a local maximum emission wavelength typically in the 200 nm to 400 nm range, preferably in the 250 nm to 400 nm range, more preferably in the 250 nm to 390 nm range, and even more preferably in the 250 nm to 360 nm range.

Specific examples of the organic light-emitting molecules (B) include, but are by no means limited to, 9,10-diphenylanthracene (CAS Number: 1499-10-1) and derivatives thereof, 9,10-bis(phenylethinyl)anthracene (CAS Number: 10075-85-1) and derivatives thereof (e.g., 1-chloro-9,10-bis(phenylethinyl)anthracene), perylene (CAS Number: 198-55-0) and derivatives thereof (e.g., perylene diimide), pyrene and derivatives thereof, rubrene and derivatives thereof, naphthalene and derivatives thereof (e.g., 1-dodecylnaphthalene, naphthalene diimide, perfluoronaphthalene, 1-cyanonaphthalene, 1-methoxynaphthalene, 2-cyanonaphthalene, 2-methoxynaphthalene, 1-methylnaphthalene, and acenaphthene), 9,10-bis (phenyl ethinyl)naphthacene, 4,4'-bis(5-tetracenyl)-1,1'-biphenylene, indoles, benzofurans, benzothiophenes, biphenyl and derivatives thereof, bifurans, bithiophene, and 4,4-difluoro-4-bora-3a,4a-diaza-s-indacene (boron-dipyrromethene). The organic light-emitting molecules (B) are preferably condensed polycyclic aromatic compounds, such as perylene, pyrene, naphthalene, and derivatives thereof, and especially, aromatic π-conjugated system compounds.

Preferred examples of the organic light-emitting molecules (B) include compounds of general formula (2)

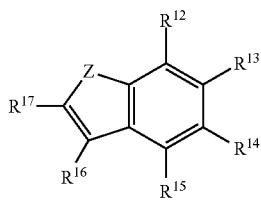

(2)

where Z is a divalent group of —C($R^{18}$)=Y—, a divalent group of —N($R^{20}$)—, an oxy group (—O—), or a thio group, Y is a trivalent group of =C($R^{19}$)— or an aza group (=N—), each of $R^{12}$ to $R^{20}$ is independently any substituent including a hydrogen atom and may be identical to or different from each other, and any pair of adjacent substituents in $R^{12}$ to $R^{20}$ may be joined together to form a five- or six-membered ring having any substituent including a hydrogen atom. In the compound of general formula (2), preferably, each of $R^{12}$ to $R^{19}$ is independently a hydrogen atom, a halogen atom, an alkyl group, an alkoxy group, a cyano group, a nitro group, an aryl group, or a heteroaryl group, and $R^{20}$ is a hydrogen atom, an alkyl group, an alkenyl group, an alkynyl group, a heterocyclic group, an alkylaryl group, an aryl group, or a heteroaryl group.

If Z is a divalent group of —C($R^{18}$)=Y— in the compound of general formula (2), the compound is preferably of general formula (3)

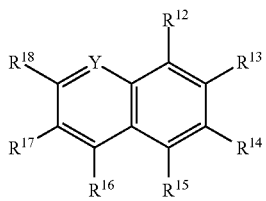

(3)

where Y is a trivalent group of =C($R^{19}$)— or an aza group, each of $R^{12}$ to $R^{19}$ is independently any substituent including a hydrogen atom and may be identical to or different from each other, and any pair of adjacent substituents in $R^{12}$ to $R^{19}$ may be joined together to form a five- or six-membered ring having any substituent including a hydrogen atom.

If Y is a trivalent group of =C($R^{19}$)= in the compound of general formula (3), the compound is preferably of general formula (4)

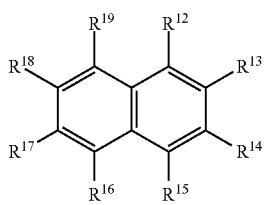

(4)

where each of $R^{12}$ to $R^{19}$ is independently any substituent including a hydrogen atom and may be identical to or different from each other, and any pair of adjacent substituents in $R^{12}$ to $R^{19}$ may be joined together to form a five- or six-membered ring having any substituent including a hydrogen atom. In the compound of general formula (4), preferably, each of $R^{12}$ to $R^{19}$ is independently a hydrogen atom, a halogen atom, an alkyl group, an alkoxy group, a cyano group, a nitro group, an aryl group, or a heteroaryl group.

Other preferred examples of the organic light-emitting molecules (B) include compounds of general formula (5)

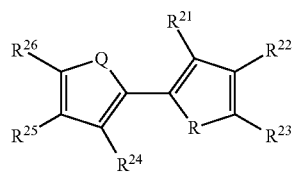

(5)

where each of $R^{21}$ to $R^{26}$ is independently any substituent including a hydrogen atom and may be identical to or different from each other, any pair of adjacent substituents in $R^{21}$ to $R^{26}$ may be joined together to form a five- or six-membered ring having any substituent including a hydrogen atom, Q is a divalent group of —N($R^{27}$)—, an oxy group, or a thio group, and R is a divalent group of —N($R^{28}$)—, an oxy group, or a thio group.

Further preferred examples of the organic light-emitting molecules (B) include compounds of general formula (6)

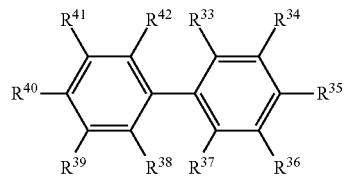

(6)

where each of $R^{33}$ to $R^{42}$ is independently any substituent including a hydrogen atom and may be identical to or different from each other, any pair of adjacent substituents in $R^{33}$ to $R^{42}$ may be joined together to form a five- or six-membered ring having any substituent including a hydrogen atom, $R^{33}$ and $R^{42}$ may be joined together to form a five- or six-membered ring having any substituent including a hydrogen atom, and $R^{37}$ and $R^{38}$ may be joined together to form a five- or six-membered ring having any substituent including a hydrogen atom.

"Any substituent including a hydrogen atom," throughout this specification, refers to a hydrogen atom and any substituent that is not a hydrogen atom.

Examples of $R^{12}$ to $R^{17}$, $R^{21}$ to $R^{26}$, and $R^{33}$ to $R^{42}$ in general formulae (3) to (6) include, but are by no means limited to, a hydrogen atom, an alkyl group (e.g., $C_1$-$C_{12}$ alkyl group), an alkenyl group, an alkynyl group, a halogen atom, a hydroxy group, an alkylcarbonyloxy group, an arylcarbonyloxy group, an alkoxycarbonyloxy group, an aryloxycarbonyloxy group, a carboxylate group, an alkylcarbonyl group, an arylcarbonyl group, an alkoxycarbonyl group, an aminocarbonyl group, an alkylaminocarbonyl group, a dialkylaminocarbonyl group, an alkylthiocarbonyl group, an alkoxyl group, a phosphate group, a phosphonate group, a phosphinate group, a cyano group, an amino group (including an alkylamino group, a dialkylamino group, an acylamino group, a diarylamino group, and an alkylarylamino group), an acylamino group (including an alkylcarbonylamino group, an arylcarbonylamino group, a carbamoyl group, and a ureide group), an amidino group, an imino group, a sulfhydryl group, an alkylthio group, an arylthio group, a thiocarboxylate group, a sulfate group, an alkylsulfinyl group, a sulfonate group, a sulfamoyl group, a sulfonamide group, a nitro group, a trifluoromethyl group, a cyano group, an azide group, a heterocyclic group, an alkylaryl group, an aryl group, and a heteroaryl group. Examples of $R^{20}$, $R^{27}$, and $R^{28}$ include, but are by no means limited to, a hydrogen atom, an alkyl group (e.g., $C_1$-$C_{12}$ alkyl group), an alkenyl group, an alkynyl group, a heterocyclic group, an alkylaryl group, an aryl group, and a heteroaryl group. In general formulae (3) to (6), examples of the substituent on the five- or six-membered ring that may be formed by any pair of adjacent substituents in $R^{12}$ to $R^{28}$ and $R^{33}$ to $R^{42}$ being joined together, examples of the substituent on the five- or six-membered ring having any substituent including a hydrogen atom that may be formed by $R^{33}$ and $R^{42}$ being joined together, and examples of the substituent on the five- or six-membered ring having any substituent including a hydrogen atom that may be formed by $R^{37}$ and $R^{38}$ being joined together include, but are by no means limited to, the substituents listed here as examples of $R^1$ to $R^8$.

If Y in the compound of general formula (3) is a trivalent group of —$C(R^{19})$= (i.e., if the compound is a naphthalene compound), the compound may be, for example, non-substituted naphthalene (CAS Number: 91-20-3) or a substituted naphthalene, such as octafluoronaphthalene (CAS Number: 313-72-4), 2-methoxynaphthalene (CAS Number: 93-04-9), 2-cyanonaphthalene (CAS Number: 613-46-7), 1-dodecylnaphthalene (CAS Number: 38641-16-6), 1-methylnaphthalene (CAS Number: 90-12-0), or acenaphthene (CAS Number: 83-32-9).

If Y in the compound of general formula (3) is an aza group (i.e., if the compound is a quinoline compound), the compound may be, for example, non-substituted quinoline (CAS Number: 91-22-5) or a substituted quinoline, such as 6-tert-butylquinoline (CAS Number: 68141-13-9) or benzo[h]quinoline (CAS Number: 230-27-3).

If Z in the compound of general formula (2) is a divalent group of —$N(R^{20})$— (i.e., if the compound is an indole compound), the compound may be, for example, non-substituted indole (CAS Number: 120-72-9) or a substituted indole, such as 1,2-dimethylindole (CAS Number: 875-79-6) or naphthostyryl (CAS Number: 130-00-7).

If Z in the compound of general formula (2) is an oxy group (i.e., if the compound is a benzofuran compound), the compound may be, for example, non-substituted benzofuran (CAS Number: 271-89-6) or a substituted benzofuran, such as 2-butylbenzofuran (CAS Number: 4265-27-4) or diphenylene oxide (CAS Number: 132-64-9).

If Z in the compound of general formula (2) is a thio group (i.e., if the compound is a benzothiophene compound), the compound may be, for example, non-substituted benzothiophene (CAS Number: 95-15-8) or a substituted benzothiophene, such as 2-methylbenzothiophene (CAS Number: 1195-14-8) or dibenzothiophene (CAS Number: 132-65-0).

If Q in the compound of general formula (5) is a divalent group of —$N(R^{27})$—, and R in the compound of general formula (5) is a divalent group of —$N(R^{28})$— (i.e., if the compound is a bipyrrole compound), the compound may be, for example, non-substituted bipyrrole (CAS Number: 10087-64-6) or a substituted bipyrrole, such as 5,5'-dimethyl-bipyrrole (CAS Number: 90888-56-5) or 1,1'-dimethyl-bipyrrole (CAS Number: 34671-26-6).

If Q in the compound of general formula (5) is a divalent group of —$N(R^{27})$—, and R in the compound of general formula (5) is an oxy group (i.e., if the compound is a furanylpyrrole compound), the compound may be, for example, non-substituted furanylpyrrole (CAS Number: 63122-43-0) or a substituted furanylpyrrole, such as 1-methyl-furanylpyrrole (CAS Number: 124494-77-5) or benzofuranyl indole (CAS Number: 78842-63-4). If Q in the compound of general formula (5) is an oxy group, and R in the compound of general formula (5) is a divalent group of —$N(R^{28})$—, the compound may be of the same class of chemical species as those listed here.

If Q in the compound of general formula (5) is a divalent group of —$N(R^{27})$—, and R in the compound of general formula (5) is a thio group (i.e., if the compound is a thienylpyrrole compound), the compound may be, for example, non-substituted thienylpyrrole (CAS Number: 52707-46-7) or a substituted thienylpyrrole, such as 1-methyl-thienylpyrrole (CAS Number: 34671-27-7) or thienylindole (CAS Number: 55968-16-6). If Q in the compound of general formula (5) is a thio group, and R in the compound of general formula (5) is a divalent group of —$N(R^{28})$—, the compound may be of the same class of chemical species as those listed here.

If both Q and R in the compound of general formula (5) are an oxy group (i.e., if the compound is a bifuran compound), the compound may be, for example, non-substituted bifuran (CAS Number: 5905-00-0) or a substituted bifuran, such as 5,5'-dimethyl-bifuran (CAS Number: 17490-66-3) or 5,5'-dicyano-bifuran (CAS Number: 261719-71-5).

If Q in the compound of general formula (5) is an oxy group, and R in the compound of general formula (5) is a thio group (i.e., if the compound is a thienyl furan compound), the compound may be, for example, non-substituted thienyl furan (CAS Number: 27521-80-8) or a substituted thienyl furan, such as 2-methyl-thienyl furan (CAS Number: 125261-84-9) or thienyl furan carbaldehyde (CAS Number: 32364-30-0). If Q in the compound of general formula (5) is a thio group, and R in the compound of general formula (5) is an oxy group, the compound may be of the same class of chemical species as those listed here.

If both Q and R in the compound of general formula (5) are a thio group (i.e., if the compound is a bithiophene compound), the compound may be, for example, non-substituted bithiophene (CAS Number: 492-97-7) or a substituted bithiophene, such as 5,5'-dimethyl-bithiophene (CAS Number: 16303-58-5) or bithiophene-dimethanol (CAS Number: 170110-96-0).

Examples of the compound of general formula (6) include non-substituted biphenyl (CAS Number: 92-52-4) or a substituted biphenyl, such as p-terphenyl (CAS Number: 92-94-4). Any one of these examples of the organic light-emitting molecules (B) may be used alone; alternatively, two or more of the examples may be used in the form of mixture.

Any combination of the examples of the organic photosensitizing molecules (A) and the organic light-emitting molecules (B) may be freely selected for use. For the purpose of emitting TTA-upconverted light, however, the organic photosensitizing molecules (A) and the organic light-emitting molecules (B) preferably have close energy levels in the lowest triplet excited state in view of efficiency of triplet-triplet energy transfer. Therefore, $\Delta E_T$, defined by the following formula $$\Delta E_T = E_{T,Dye} - E_{T,Emi} \qquad \text{[Math. 1]}$$

where $E_{T,Dye}$ is an energy level of the organic photosensitizing molecules (A) in the lowest triplet excited state, and $E_{T,Emi}$ is the energy level of the organic light-emitting molecules (B) in the lowest triplet excited state, is preferably from −0.5 eV to 2.0 eV, inclusive, more preferably from −0.3 eV to 1.0 eV, inclusive, even more preferably from −0.2 eV to 0.5 eV, inclusive, and still more preferably from −0.1 eV to 0.3 eV, inclusive, for any selected combination of the organic photosensitizing molecules (A) and the organic light-emitting molecules (B). One electronvolt (1 eV) is the energy that a single electron gains when accelerated through an electric potential difference of 1 V.

An appropriate combination of the organic photosensitizing molecules (A) and the organic light-emitting molecules (B) enables an optical wavelength conversion element (photon upconverter) that has a maximum one of local maximum absorption wavelengths in the 250 nm to 499 nm range, preferably in the 330 nm to 499 nm range, more preferably in the 350 nm to 499 nm range, and even more preferably in the 350 nm to 410 nm range and that has a local maximum emission wavelength in a shorter wavelength range than the wavelength range of the absorbed light, specifically in the 200 nm to 400 nm range, preferably in the 250 nm to 400 nm range, more preferably in the 250 nm to 390 nm range, and even more preferably in the 250 nm to 360 nm range.

The optical wavelength conversion element in accordance with the present invention may contain the organic photosensitizing molecules (A) and the organic light-emitting molecules (B) in any amounts. However, both the amount of the organic photosensitizing molecules (A) and the amount of the organic light-emitting molecules (B) are typically from 0.000001 to 10 parts by mass, preferably from 0.00001 to 5 parts by mass, and more preferably from 0.0001 to 1 part by mass, all per 100 parts by mass of the optical wavelength conversion element.

The ionic liquid (C) is a room temperature molten salt (salt that is molten (a liquid) at normal temperature (25° C.)) composed of cations and anions. Combinations of cations and anions can generally produce more than 1,000,000 compounds that are known as ionic liquids. The ionic liquid (C) functions as a medium for the organic photosensitizing molecules (A) and the organic light-emitting molecules (B), a combination that exhibits TTA. The ionic liquid (C) allows therein diffusion of the organic photosensitizing molecules (A) and the organic light-emitting molecules (B).

In the optical wavelength conversion element in accordance with the present invention, the organic photosensitizing molecules (A) and the organic light-emitting molecules (B), a combination that exhibits TTA, need to dissolve and/or disperse in the ionic liquid (C) so that the molecules (A) and (B) become visually homogeneous and transparent. Therefore, the ionic liquid (C) preferably undergoes cation-πc interaction with the organic photosensitizing molecules (A) and the organic light-emitting molecules (B) and is water-immiscible. Throughout this specification, the ionic liquid (C) being "water-immiscible" means that at 25° C., the ionic liquid (C) may mix with 50 mass % or less water to produce a visually homogeneous and transparent mixture (e.g., the ionic liquid (C) may mix with 5 mass % or less water to produce a visually homogeneous and transparent mixture), but the ionic liquid (C) does not mix with more than 50 mass % water to produce a visually homogeneous and transparent mixture.

Specific examples of the cations that constitute the ionic liquid (C) include cations of nitrogen-containing compounds, quaternary phosphonium cations, and sulfonium cations. Examples of the cations of nitrogen-containing compounds include heterocyclic aromatic amine cations, such as imidazolium cations and pyridinium cations; heterocyclic aliphatic amine cations, such as piperidinium cations, pyrrolidinium cations, pyrazolium cations, thiazolium cations, and morpholinium cations; quaternary ammonium cations; aromatic amine cations; aliphatic amine cations; and alicyclic amine cations. Examples of the imidazolium cations include 1-alkyl-3-methylimidazoliums, such as 1-ethyl-3-methylimidazolium, 1-butyl-3-methylimidazolium, 1-hexyl-3-methylimidazolium, and 1-octyl-3-methylimidazolium; 1-alkyl-2,3-dimethylimidazoliums, such as 1-ethyl-2,3-dimethylimidazolium, 1-propyl-2,3-dimethylimidazolium, 1-butyl-2,3-dimethylimidazolium, 1-pentyl-2,3-dimethylimidazolium, 1-hexyl-2,3-dimethylimidazolium, 1-heptyl-2,3-dimethylimidazolium, and 1-octyl-2,3-dimethylimidazolium; 1-cyanomethyl-3-methylimidazolium; and 1-(2-hydroxyethyl)-3-methylimidazolium. Examples of the pyridinium cations include 1-butylpyridinium, 1-hexylpyridinium, N-(3-hydroxypropyl)pyridinium, and N-hexyl-4-dimethylamino pyridinium. Examples of the piperidinium cations include 1-(methoxyethyl)-1-methylpiperidinium. Examples of the pyrrolidinium cations include 1-(2-methoxy ethyl)-1-methylpyrrolidinium and N-(methoxy ethyl)-1-methylpyrrolidinium. Examples of the morpholinium cations include N-(methoxyethyl)-N-methylmorpholium. Examples of the quaternary ammonium cations include N,N-diethyl-N-methyl-N-(2-methoxyethyl)ammonium and N-ethyl-N,N-dimethyl-2-methoxyethylammonium. Examples of the quaternary phosphonium cations include tetraalkyl phosphonium and tetraphenylphosphonium. Examples of the sulfonium cations include trialkylsulfonium and triphenylsulfonium. The ionic liquid (C) may contain either a single one of these types of cations or two or more of these types of cations.

Taking into consideration the dissolution and dispersion stability of the organic photosensitizing molecules (A) and the organic light-emitting molecules (B) in the ionic liquid (C), the cations that constitute the ionic liquid (C) preferably undergo cation-π interaction with the organic photosensitizing molecules (A) and the organic light-emitting molecules (B).

Examples of the anions that constitute the ionic liquid (C), by no means limited in any particular manner, include fluorine-containing compound anions, such as bis(trifluoromethylsulfonyl)imide anions ($[N(SO_2CF_3)_2]^-$), tris(trifluoromethylsulfonyl)methide anions ($[C(SO_2CF_3)_3]^-$), hexafluorophosphate anions ($[PF_6]^-$), tris(pentafluoroethyl), and trifluorophosphate anions ($[(C_2F_5)_3PF_3]^-$); boron-containing compound anions of $[BR^{29}R^{30}R^{31}R^{32}]^-$ (in this and subsequent structural formulae of anions, each of $R^{29}$, $R^{30}$, $R^{31}$, and $R^{32}$ is independently a group of $-(CH_2)_nCH_3$ (where n is an integer from 1 to 9), i.e., a $C_1$-$C_9$ linear alkyl group or aryl group); and bis(fluorosulfonyl)imide anions ($[N(FSO_2)_2]^-$). The ionic liquid (C) may contain either a single one of these types of anions or two or more of these types of anions.

Generally, ionic liquids containing a certain class of anions may mix with water in unlimited amounts, whilst those containing another class of anions may mix with water only in limited amounts or in very small amounts. In the present invention, taking into consideration the dissolution and dispersion stability of the organic photosensitizing molecules (A) and the organic light-emitting molecules (B) in the ionic liquid (C), the anions that constitute the ionic liquid (C) preferably impart water-immiscibility to the ionic liquid.

The ionic liquid (C) may be any combination of the aforementioned specific examples of anions and the aforementioned specific examples of cations. More specific examples of the ionic liquid (C) include, but are by no means limited to, 1-ethyl-3-methylimidazolium bis(trifluoromethylsulfonyl)imide (CAS Number: 174899-82-2; a commercial product available; manufacturer: Ionic Liquids Technologies GmbH), 1-propyl-2,3-dimethylimidazolium bis(trifluoromethylsulfonyl)imide (CAS Number: 169051-76-7; commercial products available; manufacturers: IoLiTec Ionic Liquids Technologies GmbH and Merck KGaA), 1-butyl-3-methylimidazolium bis(trifluoromethylsulfonyl)imide (CAS Number: 174899-83-3; commercial products available; manufacturers: IoLiTec Ionic Liquids Technologies GmbH and Merck KGaA), 1-propyl-2,3-dimethylimidazolium tris(trifluoromethylsulfonyl)methide (CAS Number: 169051-77-8; a commercial product available; manufacturer: Covalent Associates Inc.), N,N-diethyl-N-methyl-N-(2-methoxyethyl)ammonium bis(trifluoromethylsulfonyl)imide (CAS Number: 464927-84-2; a commercial product available; manufacturer: Nisshinbo Holdings Inc.; distributor: Kanto Chemical Co., Inc. (Product Number: 11468-55)), 1-hexyl-3-methylimidazolium bis(trifluoromethylsulfonyl)imide (CAS Number: 382150-50-7; a commercial product available; manufacturer: Merck KGaA), 1-octyl-3-methylimidazolium bis(trifluoromethylsulfonyl)imide (CAS Number: 178631-04-4; a commercial product available; manufacturer: Nisshinbo Holdings Inc.; distributor: Kanto Chemical Co., Inc. (Product Number: 49514-85)), 1-ethyl-2,3-dimethylimidazolium bis(trifluoromethylsulfonyl)imide (CAS Number: 174899-90-2; a commercial product available; distributor: Kanto Chemical Co., Inc. (Product Number: 49515-52)), 1-butyl-2,3-dimethylimidazolium bis(trifluoromethylsulfonyl)imide (CAS Number: 350493-08-2; commercial products available; manufacturers: IoLiTec Ionic Liquids Technologies GmbH and Merck KGaA), ethyl-dimethyl-propylammonium bis(trifluoromethylsulfonyl)imide (CAS Number: 258273-77-7; a commercial product available; manufacturer: Merck KGaA), 1-ethyl-3-methylimidazolium tris(pentafluoroethyl) trifluorophosphate (CAS Number: 377739-43-0; a commercial product available; manufacturer: Merck KGaA), 1-hexyl-3-methylimidazolium tris(pentafluoroethyl) trifluorophosphate (CAS Number: 713512-19-7; a commercial product available; manufacturer: Merck KGaA), 1-butyl-1-methylpyrrolidinium bis(trifluoromethylsulfonyl)imide (CAS Number: 223437-11-4; a commercial product available; manufacturer: Merck KGaA), 1-butyl-1-methylpyrrolidinium tris(pentafluoroethyl) trifluorophosphate (CAS Number: 851856-47-8; a commercial product available; manufacturer: Merck KGaA), methyltri-n-octylammonium bis(trifluoromethylsulfonyl)imide (CAS Number: 375395-33-8; a commercial product available; manufacturer: Merck KGaA), 1-ethyl-3-methylimidazolium tris(trifluoromethylsulfonyl)methide, 1-butyl-3-methylimidazolium tris(trifluoromethylsulfonyl)methide, 1-hexyl-3-methylimidazolium tris(trifluoromethylsulfonyl)methide, 1-octyl-3-methylimidazolium tris(trifluoromethylsulfonyl)methide, 1-butyl-2,3-dimethylimidazolium tris(trifluoromethylsulfonyl)methide, N,N-diethyl-N-methyl-N-(2-methoxyethyl)ammonium tris(trifluoromethylsulfonyl)methide, 1-butyl-3-methylimidazolium tris(pentafluoroethyl)trifluorophosphate, 1-octyl-3-methylimidazolium tris(pentafluoroethyl) trifluorophosphate, 1-propyl-2,3-dimethylimidazolium tris(pentafluoroethyl) trifluorophosphate, 1-butyl-2,3-dimethylimidazolium tris(pentafluoroethyl) trifluorophosphate, N,N-diethyl-N-methyl-N-(2-methoxyethyl)ammonium tris(pentafluoroethyl) trifluorophosphate, 1-ethyl-3-methylimidazolium hexafluorophosphate, 1-butyl-3-methylimidazolium hexafluorophosphate, 1-hexyl-3-methylimidazolium hexafluorophosphate, 1-octyl-3-methylimidazolium hexafluorophosphate, 1-propyl-2,3-dimethylimidazolium hexafluorophosphate, 1-butyl-2,3-dimethylimidazolium hexafluorophosphate, N,N-diethyl-N-methyl-N-(2-methoxyethyl)ammonium hexafluorophosphate, 1-ethyl-3-methylimidazolium $[BR^{29}R^{30}R^{31}R^{32}]^-$, 1-butyl-3-methylimidazolium $[BR^{29}R^{30}R^{31}R^{32}]^-$, 1-hexyl-3-methylimidazolium $[BR^{29}R^{30}R^{31}R^{32}]^-$, 1-octyl-3-methylimidazolium $[BR^{29}R^{30}R^{31}R^{32}]^-$, 1-propyl-2,3-dimethylimidazolium $[BR^{29}R^{30}R^{31}R^{32}]^-$, 1-butyl-2,3-dimethylimidazolium $[BR^{29}R^{30}R^{31}R^{32}]^-$, N,N-diethyl-N-methyl-N-(2-methoxyethyl)ammonium $[BR^{29}R^{30}R^{31}R^{32}]^-$, 1-butylpyridinium hexafluorophosphate, 1-hexylpyridinium hexafluorophosphate, 1-cyanomethyl-3-methylimidazolium bis(trifluoromethylsulfonyl)imide, N-hexyl-4-dimethylamino pyridinium bis(trifluoromethylsulfonyl)imide, 1-(2-hydroxyethyl)-3-methylimidazolium bis(trifluoromethylsulfonyl)imide, N-(3-hydroxypropyl)pyridinium bis(trifluoromethylsulfonyl)imide, N-ethyl-N,N-dimethyl-2-methoxyethylammonium tris(pentafluoroethyl) trifluorophosphate, 1-(2-hydroxyethyl)-3-methylimidazolium tris(pentafluoroethyl) trifluorophosphate, N-(3-hydroxypropyl)pyridinium tris(pentafluoroethyl) trifluorophosphate, N-(methoxyethyl)-N-methylmorpholium tris(pentafluoroethyl) trifluorophosphate, 1-(2-methoxyethyl)-1-methyl-pyrrolidinium tris(pentafluoroethyl) trifluorophosphate, 1-(methoxyethyl)-1-methylpiperidinium tris(pentafluoroethyl) trifluorophosphate, 1-(methoxyethyl)-1-methylpiperidinium bis(trifluoromethylsulfonyl)imide, N-(methoxyethyl)-1-methylpyrrolidinium bis(trifluoromethylsulfonyl)imide, and N-(methoxyethyl)-N-methylmorpholium bis(trifluoromethylsulfonyl). Any one of these examples of the ionic liquid (C) may be used alone; alternatively, two or more of the examples may be used in the form of mixture.

In the present invention, taking into consideration the dissolution and dispersion stability of the organic photosensitizing molecules (A) and the organic light-emitting molecules (B) in the ionic liquid (C), those preferred among the examples of the ionic liquid (C) listed above are combinations of the cations that undergo cation-π interaction with the organic photosensitizing molecules (A) and the organic light-emitting molecules (B) and the anions that impart water-immiscibility to the ionic liquid and are by itself water-immiscible.

Among the specific examples of the ionic liquid (C) listed above, those especially preferred include 1-ethyl-3-methylimidazolium bis(trifluoromethylsulfonyl)imide, 1-propyl-2,3-dimethylimidazolium bis(trifluoromethylsulfonyl)imide, 1-butyl-3-methylimidazolium bis(trifluoromethylsulfonyl)imide, 1-propyl-2,3-dimethylimidazolium tris(trifluoromethylsulfonyl)methide, N,N-diethyl-N-methyl-N-(2-methoxyethyl)ammonium bis(trifluoromethylsulfonyl)imide, 1-hexyl-3-methylimidazolium bis(trifluoromethylsulfonyl)imide, 1-octyl-3-methylimidazolium bis(trifluoromethylsulfonyl)imide, 1-ethyl-2,3-dimethylimidazolium bis(trifluoromethylsulfonyl)imide, 1-butyl-2,3-dimethylimidazolium bis(trifluoromethylsulfonyl)imide, ethyl-dimethyl-propylammonium bis(trifluoromethylsulfonyl)imide, 1-ethyl-3-methylimidazolium tris(pentafluoroethyl) trifluorophosphate, 1-hexyl-3-methylimidazolium tris(pentafluoroethyl) trifluorophosphate, 1-butyl-1-methylpyrrolidinium bis(trifluoromethylsulfonyl)imide, 1-butyl-1-methylpyrrolidinium tris(pentafluoroethyl) trifluorophosphate, and methyltri-n-octylammonium bis(trifluoromethylsulfonyl)imide.

The ionic liquid (C), at 26° C., has a viscosity of typically 10 mPa·s or greater, preferably 50 mPa·s or greater, and more preferably 70 mPa·s or greater. These viscosity values enable an optical wavelength conversion element with a further improved optical wavelength conversion efficiency.

The ionic liquid (C) in the optical wavelength conversion element in accordance with the present invention preferably produces water with a pH larger than 5 when washed with a volume of ultrapure water that is 9 times as much as the volume of the ionic liquid (C). This property enables an optical wavelength conversion element with a further improved optical wavelength conversion efficiency and a further improved temporal stability. The pH of the water produced when the ionic liquid (C) is washed with a volume of ultrapure water that is 9 times as much as the volume of the ionic liquid (C), as mentioned throughout this specification, is measured by adding to the ionic liquid (C) a volume of ultrapure water that is 9 times as much as the volume of the ionic liquid (C) (9 times as much in volume ratio), stirring the resultant mixture, thereafter separating out an aqueous layer, and then measuring the pH of the aqueous layer as the pH of interest. "Ultrapure water," throughout this specification, refers to water having an electric resistivity of greater than or equal to 15 MΩ·cm as measured by a method defined in JIS K 0552.

Many commercial ionic liquids produce acid water with a pH of less than or equal to 5 when the ionic liquids are washed with a volume of ultrapure water that is 9 times as much as the volume of the ionic liquids. If such a commercial ionic liquid is to be used, impurities need to be removed from the commercial ionic liquid before use in order to obtain an ionic liquid (C) that, when washed with a volume of ultrapure water that is 9 times as much as the volume of the ionic liquid (C), produces water with a pH larger than 5.

Impurities may be removed from the ionic liquid, for example, by one of the following six methods. (1) The ionic liquid is processed with activated charcoal. (2) The ionic liquid is washed with water. (3) The ionic liquid is washed with an organic solvent (see, for example, JP 2012-144441 A). (4) The ionic liquid is dissolved in a solvent to obtain a solution, and the solution is cooled to crystallize the ionic liquid in the solution and then filtered to separate out the crystallized ionic liquid (recrystallization; see, for example, JP 2010-184902 A). (5) The ionic liquid is dissolved in a solvent to obtain a solution, and the solution is passed through a column filled with a filling agent, such as alumina (column chromatography; for example, JP 2005-314332 A). (6) The ionic liquid is processed with a metal hydride (see, for example, JP 2005-89313 A). Two or more of these methods may be used in any combination. For example, method (2) may be implemented by adding water (preferably, ultrapure water) to the ionic liquid, stirring the resultant mixture, removing an aqueous layer, and repeating this washing process until the water resulting from the washing comes to have a pH larger than 5. Thereafter, the liquid mixture is heated under reduced pressure to distill (dry) off water.

The amount of the ionic liquid (C) is typically greater than or equal to 10 parts by mass and preferably greater than or equal to 30 parts by mass, per 100 parts by mass of the optical wavelength conversion element.

The optical wavelength conversion element in accordance with the present invention can be produced by dissolving and/or dispersing the organic photosensitizing molecules (A) and the organic light-emitting molecules (B) in the ionic liquid (C) by a conventional, publicly known technique to obtain a solution or dispersion liquid. In this method, where necessary, various additives may be additionally mixed with the organic photosensitizing molecules (A) and the organic light-emitting molecules (B) in the ionic liquid (C) by a conventional, publicly known technique to obtain a solution or dispersion liquid. In addition, in the same method, where necessary, the organic photosensitizing molecules (A) and the organic light-emitting molecules (B) may be ground to fine particles in a single publicly known disperser, such as an ultrasonic disperser, a bead mill, a homogenizer, a wet jet mill, a ball mill, an attritor, a sand mill, a roll mill, or a microwave disperser, or any combination of these dispersers, for fine dispersion in order to obtain a solution or dispersion liquid.

The optical wavelength conversion element in accordance with the present invention may be produced by other methods. As an example, first, the organic photosensitizing molecules (A) and the organic light-emitting molecules (B) are dissolved and/or dispersed in a volatile organic solvent. The obtained solution and/or dispersion fluid is then mixed with the ionic liquid (C) while stirring to prepare a visually homogeneous and transparent solution and/or dispersion fluid from which the volatile organic solvent is removed under reduced pressure until only a trace amount of the volatile organic solvent is left. This method, capable of readily delivering optical wavelength conversion elements that mix well until being homogeneous and transparent with a high stability and optical wavelength conversion efficiency, is a preferred method to obtain the optical wavelength conversion element in accordance with the present invention.

The volatile organic solvent used in this method may be any organic solvent that can dissolve and/or disperse the organic photosensitizing molecules (A) and the organic light-emitting molecules (B), mix with the ionic liquid (C) in such a manner as to produce a homogeneous and transparent mixture, and is so volatile that the organic solvent can be removed under reduced pressure until practically a trace amount of the volatile organic solvent is left. A "trace amount" of the volatile organic solvent being left, throughout this specification, means that the volatile organic solvent in the ionic liquid (C) does not stand out above noise levels and is hardly detectable in optical absorption spectrum measurement. The volatile organic solvent is preferably capable of dissolving the organic photosensitizing molecules (A) and the organic light-emitting molecules (B). The volatile organic solvent may be, for example, an aromatic solvent, such as toluene, benzene, or xylene. If a volatile organic solvent is to be used that is capable of dissolving the organic photosensitizing molecules (A) and the organic light-emitting molecules (B), a suitable volatile organic solvent may be selected that suits the solubility of the organic photosensitizing molecules and the organic light-emitting molecules.

The mixing and stirring described above may involve the use of a publicly known technique or device, such as ultrasound, bubbling, a stirrer, a liquid delivery pump, a pulverizer, a bead mill, a homogenizer, a wet jet mill, or microwave. Any one of these techniques and devices may be used alone; alternatively, two or more of the techniques and devices may be used in any combination.

The optical wavelength conversion element in accordance with the present invention may, where necessary, further contain an ionic or nonionic gelator (D), an antifoaming agent, a leveling agent, an optical stabilizer, an antioxidant, a polymerization inhibitor, an antistatic agent, a UV absorbing agent, and/or like various additives as a component(s) other than the organic photosensitizing molecules (A), the organic light-emitting molecules (B), and the ionic liquid (C) for better convenience in handling and other purposes.

The optical wavelength conversion element in accordance with the present invention may further contain a gelator (D) as mentioned above. Optical wavelength conversion elements that contain a gelator (D) exhibit limited fluidity due to the presence of the gelator (D) when compared with optical wavelength conversion elements that contain no gelator (D), and therefore are unlikely to leak out when used in solar cells, photocatalysts, photocatalytic hydrogen and oxygen generating devices, photon upconversion filters, and like articles.

The optical wavelength conversion element in accordance with the present invention further containing the gelator (D) is preferably in a gel state. Due to this property, the optical wavelength conversion element is more unlikely to leak out when used in solar cells, photocatalysts, photocatalytic hydrogen and oxygen generating devices, photon upconversion filters, and like articles.

The gelator (D) may be any material that dissolves in the ionic liquid (C) to form a gel that exhibits such optical transparency that the gel does not disrupt the light absorption by the organic photosensitizing molecules (A) and the light emission by the organic light-emitting molecules (B). The gelator (D) is preferably an ionic gelator or a nonionic polymer because these agent and polymer can form a gel that exhibits sufficient optical transparency. More preferably, the gelator (D) is an ionic gelator because a small amount of the agent can readily form a gel.

The ionic gelator is preferably a compound of the following general formula

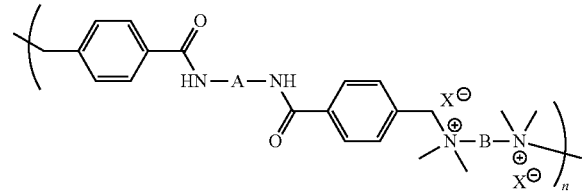

(A)

where A is a divalent or cyclohexanediyl group with one or more aromatic rings that may contain a substituent, B is a $C_1$-$C_{10}$ alkylene group that may contain a substituent, $X^-$ is a monovalent anion, and n is a positive integer in each molecule and is from 1 to 800 when averaged for all molecules.

The cyclohexanediyl group is, for example, a cyclohexane-1,4-diyl group. B in general formula (A) is preferably a $C_1$-$C_6$ alkylene group that may contain a substituent and more preferably a $C_2$-$C_6$ alkylene group that may contain a substituent. Examples of the substituent that may be contained in the alkylene group include a $C_1$-$C_6$ alkyl group, such as a methyl group, an ethyl group, and a propyl group; and a $C_1$-$C_6$ alkoxy group, such as a methoxy group, an ethoxy group, and a propoxy group. Specific examples of B in general formula (A) include a methylene group, an ethane-1,2-diyl group, a propane-1,4-diyl group, a butane-1,4-diyl group, a hexane-1,6-diyl group, and a 2-butene-1,4-diyl group.

$X^-$ in general formula (A) is by no means limited and may be, for example, a halide ion ($F^-$, $Cl^-$, $Br^-$, or $I^-$), a bis(trifluoromethane sulfonyl)amide ion, a bis(fluorosulfonyl)amide ion, a tetrafluoroborate ion ($BF_4^-$), a hexafluorophosphate ion ($PF_6^-$), a thiocyanate ion ($SCN^-$), a nitrate ion ($NO_3^-$), a methosulfate ion ($CH_3OSO_3^-$), a hydrogencarbonate ion ($HCO_3^-$), a hypophosphite ion ($H_2PO_2^-$), an oxo-acid ion of a halogen ($YO_4^-$, $YO_3^-$, $YO_2^-$, or $YO^-$, where Y is Cl, Br, or I), a tris(trifluoromethane sulfonyl) carbonate ion, a trifluoromethanesulfonate ion, a dicyanamide ion, an acetate ion ($CH_3COO^-$), a halogenated acetate ion (($CZ_nH_{3-n}$)$COO^-$, where Z is F, Cl, Br, or I, and n is 1, 2, or 3), or a tetraphenylborate ion ($BPh_4^-$) or a derivative thereof (B $(Aryl)_4^-$, where Aryl is a substituted phenyl group). $X^-$ in general formula (A) is preferably a bis(trifluoromethane sulfonyl)amide ion, a bis(fluorosulfonyl)amide ion, or a tetrafluoroborate ion ($BF_4^-$).

Preferred examples of the compound of general formula (A) include compounds of the following general formulae

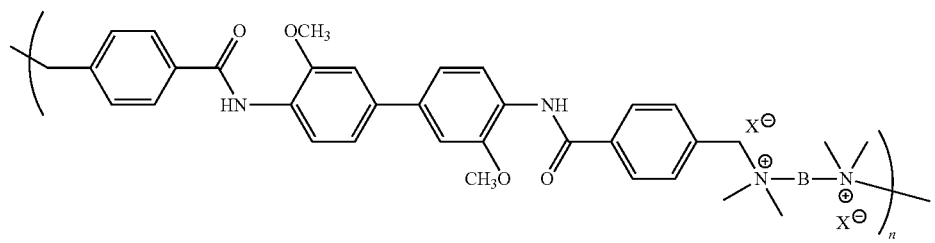

(A1)

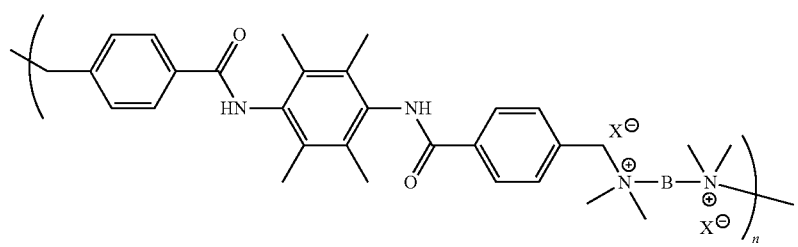

(A2)

-continued

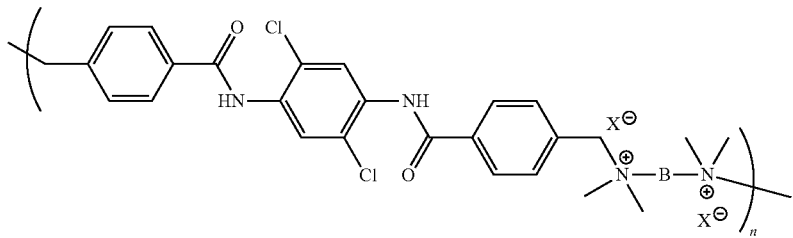
(A3)

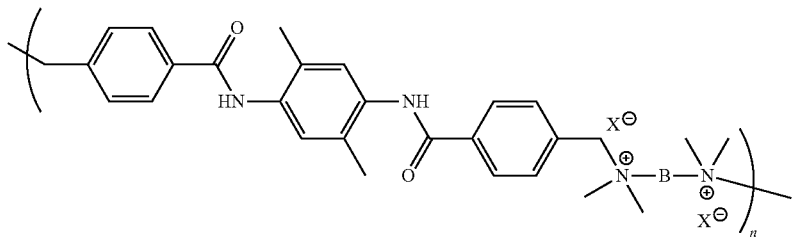
(A4)

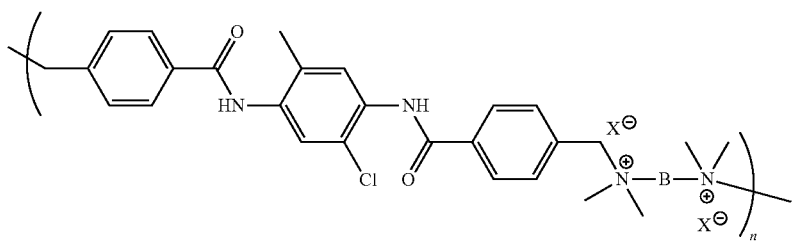
(A5)

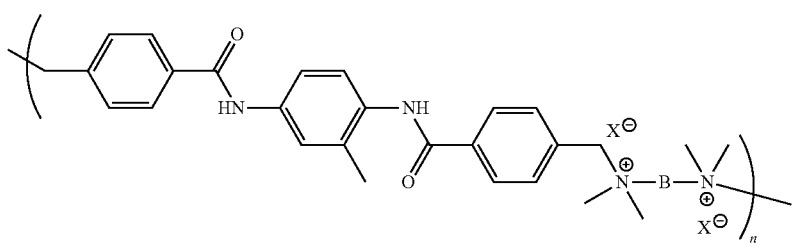
(A6)

where B is an ethylene group, a 1,3-propylene group, a 1,4-butylene group, or a 1,6-hexylene group, $X^-$ is at least one species selected from a halide ion ($F^-$, $Cl^-$, $Br^-$, or $I^-$), a bis(trifluoromethane sulfonyl)amide ion, a bis(fluorosulfonyl)amide ion, a tetrafluoroborate ion ($BF_4^-$), a hexafluorophosphate ion ($PF_6^-$), a thiocyanate ion ($SCN^-$), a nitrate ion ($NO_3^-$), a methosulfate ion ($CH_3OSO_3^-$), a hydrogencarbonate ion ($HCO_3^-$), a hypophosphite ion ($H_2PO_2^-$), an oxo-acid ion of a halogen ($YO_4^-$, $YO_3^-$, $YO_2^-$, or $YO^-$, where Y is Cl, Br, or I), a tris(trifluoromethane sulfonyl) carbonate ion, a trifluoromethanesulfonate ion, a dicyanamide ion, an acetate ion ($CH_3COO^-$), a halogenated acetate ion (($CZ_nH_{3-n}$)$COO^-$, where Z is F, Cl, Br, or I, and n is 1, 2, or 3), or a tetraphenylborate ion ($BPh_4^-$) or a derivative thereof (B $(Aryl)_4^-$, where Aryl is a substituted phenyl group), and n is a positive integer in each molecule and is from 1 to 800 when averaged for all molecules,

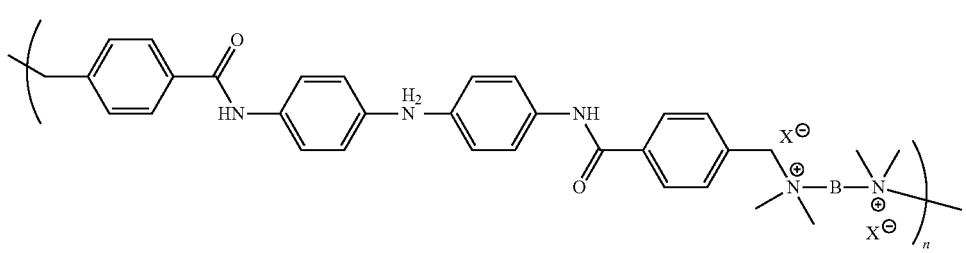
(A7)

-continued
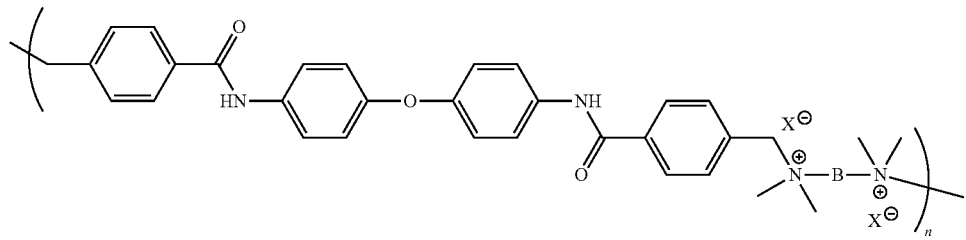
(A8)
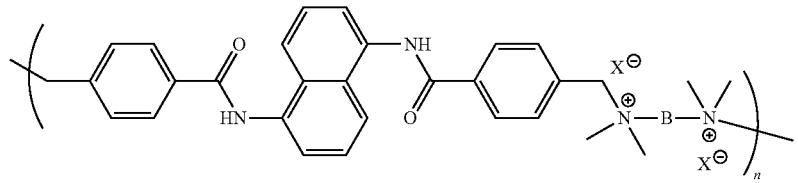
(A9)
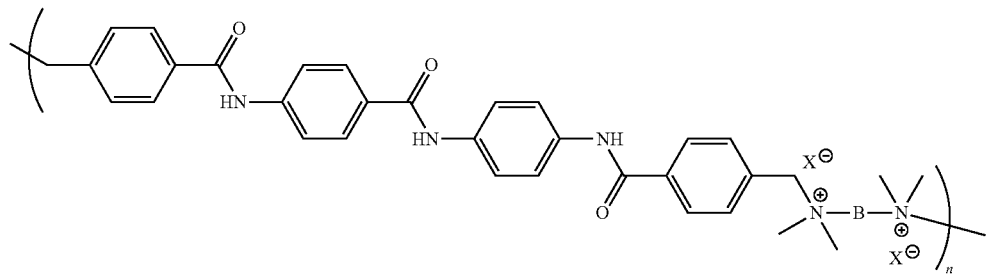
(A10)
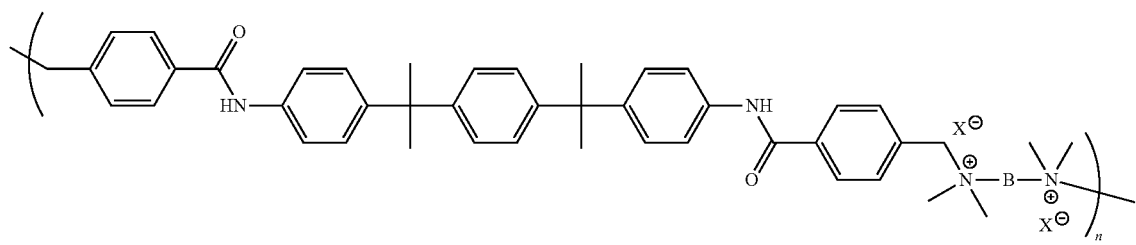
(A11)
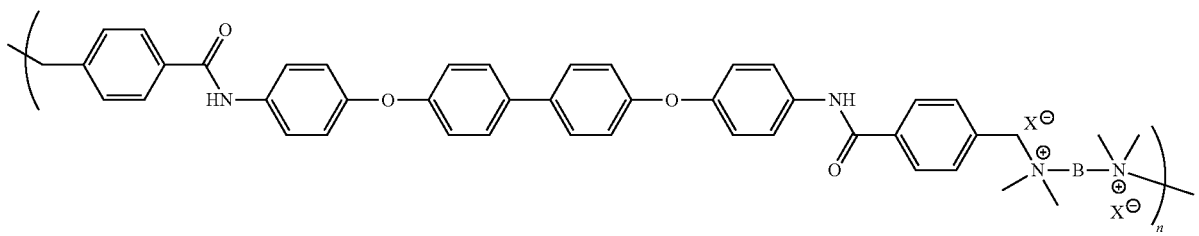
(A12)
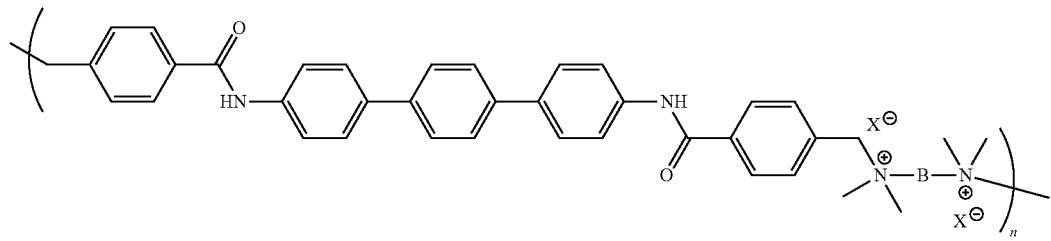
(A13)

where B is the same as B in formulae (A1) to (A6), and
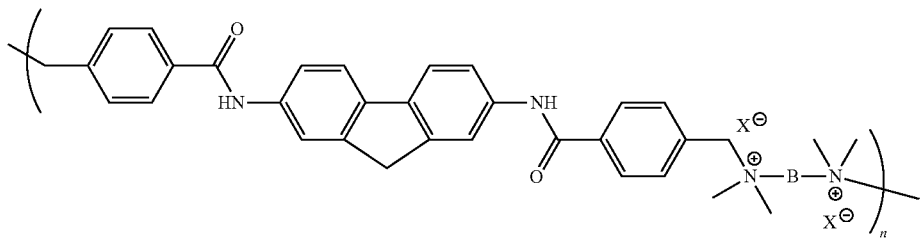
(A14)
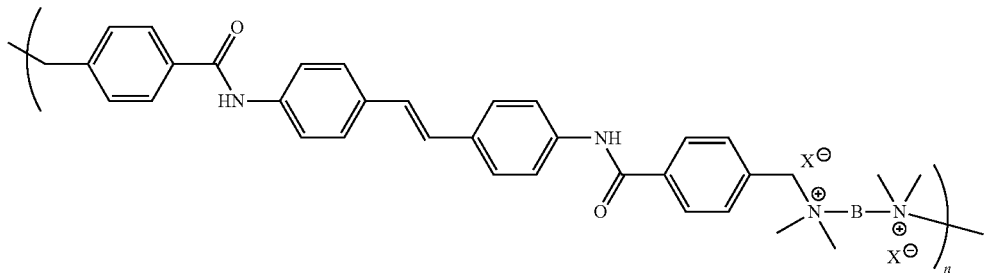
(A15)
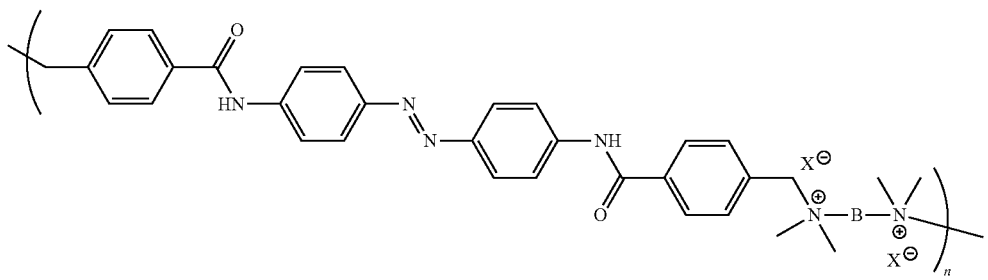
(A16)
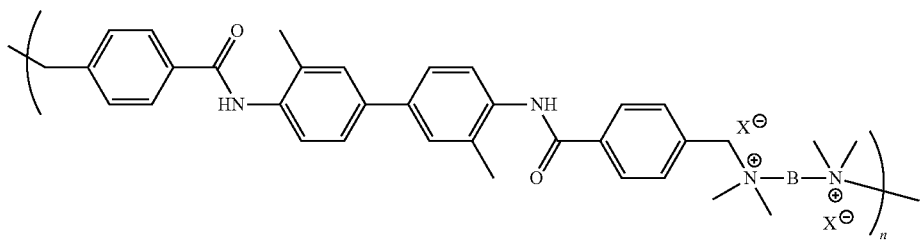
(A17)
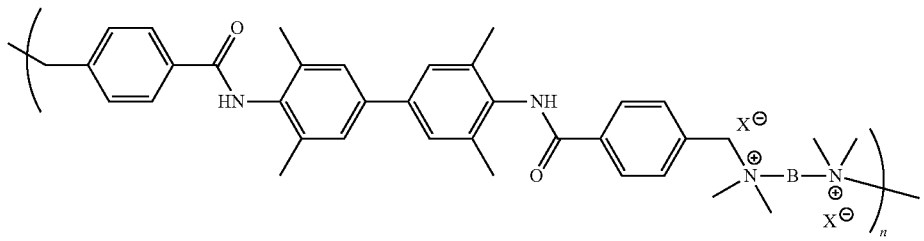
(A18)
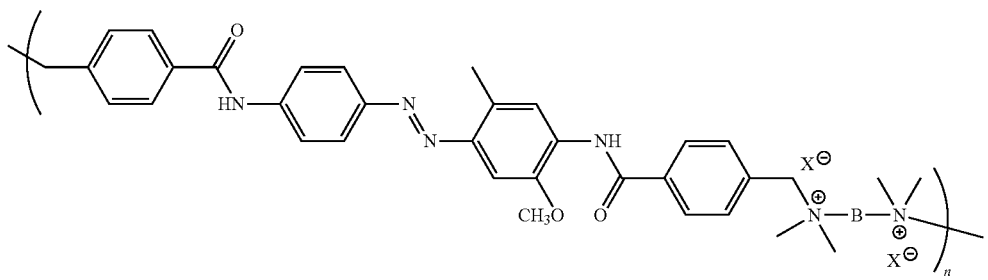
(A19)

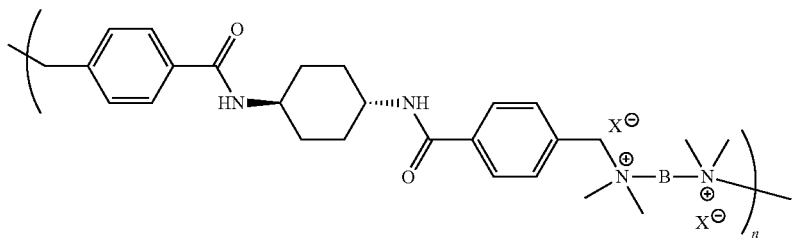

(A20)

where B is the same as B in formulae (A1) to (A6).

The ionic gelator in the optical wavelength conversion element in accordance with the present invention has a concentration of typically from 0.3 g/L to 100 g/L, preferably from 0.5 g/L to 60 g/L, and more preferably from 1 g/L to 20 g/L. The concentration may however vary depending on the value of n of the ionic gelator and other factors. If the ionic gelator has a concentration of less than 0.3 g/L, the optical wavelength conversion element may not gelate sufficiently. If the ionic gelator has a concentration larger than 100 g/L, the ionic gelator may form a gel with low optical transparency when dissolved in the ionic liquid (C), which may degrade the light wavelength conversion characteristics of the optical wavelength conversion element.

The nonionic polymer may be at least one polymer of a compound that is capable of forming a nonionic polymer through a polymerization reaction that will be described later in detail. The nonionic polymer preferably has low absorbance.

If the gelator (D) is an ionic gelator, the optical wavelength conversion element in accordance with the present invention containing the gelator (D) may be produced, for example, by one of the following three methods.

(1) The organic photosensitizing molecules (A) are dissolved and/or dispersed in the ionic liquid (C) to prepare a first solution and/or dispersion liquid. The organic light-emitting molecules (B) are dissolved and/or dispersed in the ionic liquid (C) to prepare a second solution and/or dispersion liquid. A mixture of an ionic gelator and the ionic liquid (C) is dissolved in a volatile organic solvent to prepare a liquid mixture (solution). The second solution and/or dispersion liquid and the liquid mixture are mixed with the first solution and/or dispersion liquid. After that, the volatile organic solvent is distilled off.

(2) The organic photosensitizing molecules (A) and the organic light-emitting molecules (B) are dissolved and/or dispersed in the ionic liquid (C) to prepare a solution and/or dispersion liquid, which is mixed with a mixture (solution or gel) of an ionic gelator and the ionic liquid (C).

(3) The organic photosensitizing molecules (A) and the organic light-emitting molecules (B) are dissolved and/or dispersed in the ionic liquid (C) to prepare a solution and/or dispersion liquid, which is mixed with a solution prepared by dissolving an ionic gelator in a volatile organic solvent. After that, the volatile organic solvent is distilled off.

If the mixture of the ionic gelator and the ionic liquid (C) is a gel, method (1) is preferred to other methods (1) and (2). According to method (1), the mixture of the ionic gelator and the ionic liquid (C) is used in liquid form. The mixture therefore has lower viscosity and is easier to handle than the mixture used as is in method (2) which is highly viscous and often difficult-to-handle. Method (1) can hence achieve a more accurate concentration of the ionic gelator in the optical wavelength conversion element and produce a more uniform optical wavelength conversion element.

The liquid mixture used in method (1) prepared by dissolving the mixture of the ionic gelator and the ionic liquid (C) in a volatile organic solvent may be prepared, for example, by one of the following two methods. (i) The ionic liquid (C), the volatile organic solvent, and the ionic gelator are mixed and stirred to obtain a uniform mixture. (ii) The mixture of the ionic gelator and the ionic liquid (C) is prepared. The volatile organic solvent is then added to this mixture, and the resultant mixture is stirred to obtain a uniform mixture. Method (ii) often requires heating at relatively high temperatures (e.g., 140° C. or above) in the preparation of the mixture of the ionic gelator and the ionic liquid (C). On the other hand, method (i) is capable of producing a uniform mixture through mixing without heating, thereby reducing thermally caused coloring and other forms of degradation of the mixture. Method (i) is therefore preferred to method (ii).

Optical wavelength conversion elements containing the ionic gelator (D) can be produced by various methods as described here. Any method may be used that, in the production of the optical wavelength conversion element, does not involve thermal processing at high temperature, enables easy preparation of a uniform gelator mixture, allows for precise weighing, and also enables easy uniform mixing with, for example, the organic photosensitizing molecules (A), the organic light-emitting molecules (B), and the ionic liquid (C).

The solution and/or dispersion liquid obtained, for use in methods (2) and (3), by dissolving and/or dispersing the organic photosensitizing molecules (A) and the organic light-emitting molecules (B) in the ionic liquid (C) may be produced, for example, by dissolving the organic photosensitizing molecules (A) in a volatile organic solvent to prepare a solution of the organic photosensitizing molecules (A), dissolving the organic light-emitting molecules (B) in a volatile organic solvent to prepare a solution of the organic light-emitting molecules (B), mixing and stirring the solution of the organic photosensitizing molecules (A), the solution of the organic light-emitting molecules (B), and the ionic liquid (C) to form a uniform mixture, and subsequently distilling off the volatile organic solvent.

The volatile organic solvent used in the production of the optical wavelength conversion element in accordance with the present invention may be any substance that dissolves and/or disperses the ionic gelator and/or mixes well with the ionic liquid (C) to form a homogeneous and transparent mixture and that has such volatility that the substance can be removed under reduced pressure until practically a trace amount of the substance is left. A "trace amount" of the volatile organic solvent being left, throughout this specification, means that the volatile organic solvent in the ionic liquid (C) does not stand out above noise levels and is hardly detectable in optical absorption spectrum measurement. The volatile organic solvent is preferably capable of dissolving the ionic gelator. Examples of the volatile organic solvent include methanol and other alcohol-based solvents.

If the gelator (D) is a nonionic polymer, the optical wavelength conversion element in accordance with the present invention containing the gelator (D) may be produced, for example, by one of the following two methods. (I) The organic photosensitizing molecules (A) and the organic light-emitting molecules (B) are dissolved and/or dispersed in the volatile organic solvent and the ionic liquid (C) to obtain a mixed liquid with which the nonionic polymer is impregnated. The volatile organic solvent is then removed under reduced pressure. (II) The organic photosensitizing molecules (A) and the organic light-emitting molecules (B) are dissolved and/or dispersed in the ionic liquid (C) to obtain a solution and/or dispersion liquid. A compound capable of forming a nonionic polymer through a polymerization reaction (hereinafter, referred to as a "polymerizable compound" and will be described later in detail) is mixed with the solution and/or dispersion liquid. The polymerizable compound is then subjected to a polymerization reaction to form the nonionic polymer.

The solution and/or dispersion liquid obtained by dissolving and/or dispersing the organic photosensitizing molecules (A) and the organic light-emitting molecules (B) in the volatile organic solvent and the ionic liquid (C) may be produced, for example, by dissolving the organic photosensitizing molecules (A) in the volatile organic solvent to prepare a solution of the organic photosensitizing molecules (A), dissolving the organic light-emitting molecules (B) in the volatile organic solvent to also prepare a solution of the organic light-emitting molecules (B), and mixing and stirring the solution of the organic photosensitizing molecules (A), the solution of the organic light-emitting molecules (B), and the ionic liquid (C) to obtain a uniform mixture. The solution of the organic photosensitizing molecules (A), the solution of the organic light-emitting molecules (B), and the ionic liquid (C) may be mixed in any order. As an example, the solution of the organic light-emitting molecules (B) may be mixed with the ionic liquid (C) before the solution of the organic photosensitizing molecules (A) is mixed with the solution of the organic light-emitting molecules (B).

In the mixed liquid in method (I), the organic photosensitizing molecules (A) and the organic light-emitting molecules (B) may be dissolved and/or dispersed in only either one of the volatile organic solvent and the ionic liquid (C). Alternatively, the organic photosensitizing molecules (A) and the organic light-emitting molecules (B) may be dissolved and/or dispersed in both the volatile organic solvent and the ionic liquid (C) at a given ratio.

The solution and/or dispersion liquid obtained for use in method (II) by dissolving and/or dispersing the organic photosensitizing molecules (A) and the organic light-emitting molecules (B) in the ionic liquid (C) may be produced by dissolving and/or dispersing the organic photosensitizing molecules (A) and the organic light-emitting molecules (B) in the ionic liquid (C) by a conventional, publicly known technique. In this method, the solution and/or dispersion liquid may be obtained by mixing various additives with the organic photosensitizing molecules (A) and the organic light-emitting molecules (B) in the ionic liquid (C) by a conventional, publicly known technique where necessary. Also in the same method, the solution and/or dispersion liquid may be obtained by grinding the organic photosensitizing molecules (A) and the organic light-emitting molecules (B) to fine particles in a single publicly known disperser, such as an ultrasonic disperser, a bead mill, a homogenizer, a wet jet mill, a ball mill, an attritor, a sand mill, a roll mill, or a microwave disperser, or any combination of these dispersers, in order to achieve fine dispersion, where necessary.

Alternatively, the solution and/or dispersion liquid obtained for use in method (II) by dissolving and/or dispersing the organic photosensitizing molecules (A) and the organic light-emitting molecules (B) in the ionic liquid (C) may be produced by the following, second method as an example. First, the organic photosensitizing molecules (A) and the organic light-emitting molecules (B) are dissolved and/or dispersed in a volatile organic solvent. Next, the obtained solution and/or dispersion fluid is mixed with the ionic liquid (C) while stirring, to obtain a visually homogeneous and transparent solution and/or dispersion fluid. Then, the volatile organic solvent is removed from the solution and/or dispersion fluid under reduced pressure until only a trace amount of the volatile organic solvent is left. This second method is preferred as a method to prepare the solution or dispersion liquid obtained by dissolving and/or dispersing the organic photosensitizing molecules (A) and the organic light-emitting molecules (B) in the ionic liquid (C) because the method readily provides an optical wavelength conversion element in a homogeneous and transparent mixed state and imparts a high stability and high optical wavelength conversion efficiency to the optical wavelength conversion element.

The volatile organic solvent for use in method (I) and the second method may be any organic solvent that dissolves and/or disperses the organic photosensitizing molecules (A) and the organic light-emitting molecules (B), mixes well with the ionic liquid (C) to form a homogeneous and transparent mixture, and has such volatility that the organic solvent can be removed under reduced pressure until practically a trace amount of the organic solvent is left. A "trace amount" of the volatile organic solvent being left, throughout this specification, means that the volatile organic solvent in the ionic liquid (C) does not stand out above noise levels and is hardly detectable in optical absorption spectrum measurement. The volatile organic solvent is preferably capable of dissolving the organic photosensitizing molecules (A) and the organic light-emitting molecules (B). Examples of the volatile organic solvent include toluene, benzene, xylene, and like aromatic solvents. If a volatile organic solvent is to be used that is capable of dissolving the organic photosensitizing molecules (A) and the organic light-emitting molecules (B), a suitable volatile organic solvent may be selected that suits the solubility of the organic photosensitizing molecules and the organic light-emitting molecules.

The mixing and stirring in method (I) and the second method may involve the use of a publicly known technique or device, such as ultrasound, bubbling, a stirrer, a liquid delivery pump, a pulverizer, a bead mill, a homogenizer, a wet jet mill, or microwave. Any one of these techniques and devices may be used alone; alternatively, two or more of the techniques and devices may be used in any combination.

Generally, the gelator (D) is used in larger amounts to achieve sufficient gelation if a nonionic gelator is used in the optical wavelength conversion element in accordance with the present invention than if an ionic gelator is used. The amount of the ionic liquid (C) contained in every 100 parts by mass of the optical wavelength conversion element is typically 10 parts by mass or more and preferably 30 parts by mass or more.

The nonionic polymer for use in method (I), by no means limited in any particular manner, is preferably a nonionic acrylic resin for high absorption and swellability thereof for the solution or dispersion liquid obtained by dissolving and/or dispersing the organic photosensitizing molecules (A) and the organic light-emitting molecules (B) in the ionic liquid (C). The nonionic acrylic resin is a polymer of a nonionic monomer composed primarily of a (meth)acrylate ((meth)acrylic acid ester), such as methyl methacrylate, methyl acrylate, butyl acrylate, or hydroxyethyl methacrylate. Throughout this specification, "(meth)acrylate" refers to "acrylate" and/or "methacrylate," whilst "(meth)acrylic" refers to "acrylic" and/or "methacrylic." The nonionic polymer for use in method (I) may be of any shape and may be shaped like a thin film.

The polymerizable compound for use in method (II) may be a compound capable of forming a nonionic polymer through a thermal polymerization reaction or a compound capable of forming a nonionic polymer through a photopolymerization reaction.

Examples of the compound capable of forming a nonionic polymer through a thermal polymerization reaction include nonionic (meth)acrylic acid esters, such as methyl methacrylate, methyl acrylate, butyl acrylate, and hydroxyethyl methacrylate; nonionic (meth)acrylonitriles, such as acrylonitrile and methacrylonitrile; nonionic styrene compounds, such as styrene, α-methylstyrene, p-methoxystyrene, and p-cyanostyrene; nonionic vinyl carboxylates, such as vinyl acetate; nonionic chlorine-containing monomers, such as vinyl chloride and vinylidene chloride; nonionic (meth) acrylamides, such as acrylamide; nonionic fluorine-containing monomers, such as tetrafluoroethylene; nonionic vinyl ketones, such as methylvinyl ketone; olefins, such as ethylene; and other monomers. Any one of these compounds may be used alone; alternatively, two or more of the compounds may be used in the form of mixture. "(Meth)acrylonitrile," throughout this specification, refers to "acrylonitrile" and/or "methacrylonitrile."

To form a nonionic polymer using any of these compounds capable of forming a nonionic polymer through a thermal polymerization reaction, the compound(s) may be subjected to a thermal polymerization reaction after adding, for example, an azo compound, an organic peroxide, or a like radical thermal polymerization initiator to the compound(s).

Other examples of the compound capable of forming a nonionic polymer through a thermal polymerization reaction include epoxy resins. Examples of the epoxy resins include epoxy resins with aliphatic cyclic structures, bisphenol-A epoxy resins, and aromatic polyfunctional epoxy resins with three or more intramolecular epoxy groups. To form a nonionic polymer using any of these epoxy resins, the epoxy resin(s) may be thermally cured by using, for example, an acid anhydride, an acid anhydride derivative, an imidazole, or a like basic curing agent. This method delivers nonionic polymers that show little coloring after curing.

Examples of the compound capable of forming a nonionic polymer through a photopolymerization reaction include monomers containing a polymerizable group, such as a vinyl group, a vinyl ether group, an allyl group, a maleimide group, or a (meth)acryloyl group. Preferred among these examples are monomers containing a (meth)acryloyl group for better reactivity thereof. Examples of the monomers containing a (meth)acryloyl group include (meth)acrylate monomers, such as monofunctional (meth)acrylate monomers having a structure that contains a single (meth)acryloyl group, difunctional (meth)acrylate monomers having a structure that contains two (meth)acryloyl groups, and trifunctional and polyfunctional (meth)acrylate monomers having a structure that contains three or more acryloyl groups. "(Meth)acryloyl," throughout this specification, refers to "acryloyl" and/or "methacryloyl."

Examples of the monofunctional (meth)acrylate monomers include phenoxyethyl (meth)acrylate, phenyl(poly) ethoxy (meth)acrylate, p-cumylphenoxyethyl (meth)acrylate, tribromophenyloxyethyl (meth)acrylate, phenylthioethyl (meth)acrylate, 2-hydroxy-3-phenyloxypropyl (meth)acrylate, phenylphenol(poly)ethoxy (meth)acrylate, phenylphenol epoxy (meth)acrylate, acryloylmorpholine, 2-hydroxypropyl (meth)acrylate, 4-hydroxybutyl (meth)acrylate, cyclohexane-1,4-dimethanol mono(meth)acrylate, tetrahydrofurfuryl (meth)acrylate, isobornyl (meth)acrylate, dicyclopentanyl (meth)acrylate, dicyclopentenyl (meth)acrylate, or dicyclopentenyloxyethyl (meth)acrylate. "(Poly)ethoxy," throughout this specification, refers to "ethoxy" and/or "polyethoxy."

Examples of the difunctional (meth)acrylate monomers include 1,4-butanediol di(meth)acrylate, 1,6-hexanediol di(meth)acrylate, 1,9-nonanediol di(meth)acrylate, tricyclodecane dimethanol di(meth)acrylate, bisphenol A polyethoxy di(meth)acrylate, bisphenol A polypropoxy di(meth) acrylate, bisphenol F polyethoxy di(meth)acrylate, ethylene glycol di(meth)acrylate, polyethylene glycol di(meth)acrylate, and a di(meth)acrylate of E-caprolactone adduct of neopentyl glycol hydroxypivalate (e.g., KAYARAD® HX-220 and KAYARAD® HX-620; manufacturer: Nippon Kayaku Co., Ltd.).

Examples of the trifunctional and polyfunctional (meth) acrylate monomers include tris(acryloxyethyl) isocyanurate, pentaerythritol tetra(meth)acrylate, dipentaerythritol hexa (meth)acrylate, dipentaerythritol penta(meth)acrylate, tripentaerythritol hexa(meth)acrylate, tripentaerythritol penta (meth)acrylate, trimethylolpropane tri(meth)acrylate, trimethylolpropane polyethoxy tri(meth)acrylate, and ditrimethylolpropane tetra(meth)acrylate.

Examples of the monomers containing a (meth)acryloyl group include (meth)acrylate oligomers, such as urethane (meth)acrylate, epoxy (meth)acrylate, and polyester (meth) acrylate. Any one of these examples may be used alone; alternatively, two or more of the examples may be used in the form of mixture.

To form a nonionic polymer using the compound capable of forming a nonionic polymer through a photopolymerization reaction, at least one of photopolymerization initiators (e.g., benzoins, acetophenones, anthraquinones, thioxanthones, ketals, benzophenones, and phosphine oxides) is added to the compound capable of forming a nonionic polymer through a photopolymerization reaction to obtain a mixture that is irradiated with ultraviolet light for a photopolymerization reaction of the compound.

The optical wavelength conversion element in accordance with the present invention has a water content of preferably 1 mass % or less, more preferably 0.1 mass % or less, even more preferably 0.01 mass % or less, and most preferably 0.001 mass % or less. The resultant optical wavelength conversion element has a further improved optical wavelength conversion efficiency.

The optical wavelength conversion element in accordance with the present invention has an oxygen concentration of preferably 100 mass ppm or less, more preferably 10 mass ppm or less, even more preferably 1 mass ppm or less, and most preferably 0.1 mass ppm or less. The resultant optical wavelength conversion element has a further improved optical wavelength conversion efficiency.

The optical wavelength conversion element in accordance with the present invention may further contain a polymer, such as acrylic polymer, polyester elastomer, urethane polymer, or nitrile rubber, a monomer, such as acrylic-based monomer (an acrylic acid ester and/or a methacrylic acid ester) or an epoxy-based monomer, or an inorganic or organic light scattering filler where necessary. The optical wavelength conversion element in accordance with the present invention contain a solvent where necessary, but preferably contains no solvent. The amount of the ionic liquid (C) contained in every 100 parts by mass of the optical wavelength conversion element is typically 10 parts by mass or more even if the optical wavelength conversion element contains any of these components.

The optical wavelength conversion element in accordance with the present invention is a visually homogeneous and transparent solution and/or dispersion fluid and has a good stability. The optical wavelength conversion element in accordance with the present invention is applicable to solar cells, photocatalysts, photocatalytic hydrogen and oxygen generating devices, photon upconversion filters, and like articles.

A solar cell in accordance with the present invention contains therein the optical wavelength conversion element in accordance with the present invention.

An exemplary solar cell in accordance with the present invention will be described in reference to FIG. 1. A solar cell in accordance with an example of the present invention, as illustrated in FIG. 1, includes a photoelectric conversion layer (photovoltaic layer) 1, strips of light-receiving face electrodes 7 disposed on a light-incident face of the photoelectric conversion layer 1, a transparent back-face electrode 2 stacked on a back face of the photoelectric conversion layer 1 (opposite from the light-incident face of the photoelectric conversion layer 1), a transparent insulating film 3 stacked on a back face of the transparent back-face electrode 2 (opposite from a light-incident face of the transparent back-face electrode 2), an upconversion layer 4 containing the optical wavelength conversion element in accordance with the present invention and stacked on a back face of the transparent insulating film 3 (opposite from a light-incident face of the transparent insulating film 3), and a light reflecting film 5 stacked on a back face of the upconversion layer 4 (opposite from a light-incident face of the upconversion layer 4).

The photoelectric conversion layer 1, by no means limited in any particular manner, may be an organic photoelectric conversion layer used in, for example, dye-sensitized solar cells and organic thin film solar cells, a compound semiconductor-based photoelectric conversion layer, or a silicon-based photoelectric conversion layer.

The light-receiving face electrodes 7 and the light reflecting film 5 may be composed of a metal, such as Ag, Al, Ti, Cr, Mo, W, Ni, or Cu. The transparent back-face electrode 2 may be composed of a transparent conductor, such as ITO (indium tin oxide), SnO$_2$, or ZnO. The transparent insulating film 3 may be composed of a resin, such as polyethylene terephthalate, a polycarbonate, a polyimide resin, an acrylic resin, or a polyether nitrile.

The upconversion layer 4 may be formed of either a cell and an optical wavelength conversion element sealed in the cell similarly to a photon upconversion filter in accordance with the present invention (details will be given later) or an optical wavelength conversion element alone. If the upconversion layer 4 is formed of an optical wavelength conversion element alone, the transparent insulating film 3, the upconversion layer 4, and the light reflecting film 5 may be sealed with a sealing member (e.g., sealing resin) along the periphery thereof.

According to the arrangement in FIG. 1, the upconversion layer 4 upconverts (converts light of relatively long wavelengths to light of relatively short wavelengths) incident light 6 from the sun. This upconversion increases the intensity of light in the range of wavelengths that can be exploited by the photoelectric conversion layer 1 for electric power generation, which in turn further improves the electric power generation efficiency of the solar cell.

The arrangement in FIG. 1 shows the upconversion layer 4 being located between the transparent insulating film 3 and the light reflecting film 5. The upconversion layer 4 may, however, be disposed in a different location, for example, on light-incident faces of the light-receiving face electrodes 7, in which case there may be provided a transparent insulating film between the upconversion layer 4 and the light-receiving face electrodes 7.

In the solar cell in FIG. 1, the light-receiving face electrodes 7 may be replaced by transparent electrodes formed across the entire light-incident face of the photoelectric conversion layer 1. In addition, the transparent insulating film 3 may be omitted in the solar cell in FIG. 1. If the upconversion layer 4 is formed of an optical wavelength conversion element alone, the transparent insulating film 3 is preferably disposed between the optical wavelength conversion element and the transparent back-face electrode 2 to prevent contacts between the optical wavelength conversion element and the transparent back-face electrode 2. Furthermore, in the solar cell in FIG. 1, if the upconversion layer 4 is relocated to the light-incident faces of the light-receiving face electrodes 7, and the transparent insulating film 3 is omitted, the transparent back-face electrode 2 may be replaced by a light reflecting electrode to omit the light reflecting film 5.

A photocatalyst in accordance with the present invention contains therein the optical wavelength conversion element in accordance with the present invention. For example, a photocatalytic layer may be disposed in the solar cell in FIG. 1, replacing the light-receiving face electrodes 7, the photoelectric conversion layer 1, the transparent back-face electrode 2, and the transparent insulating film 3, to obtain a photocatalyst with high catalytic efficiency.

Figure 2:
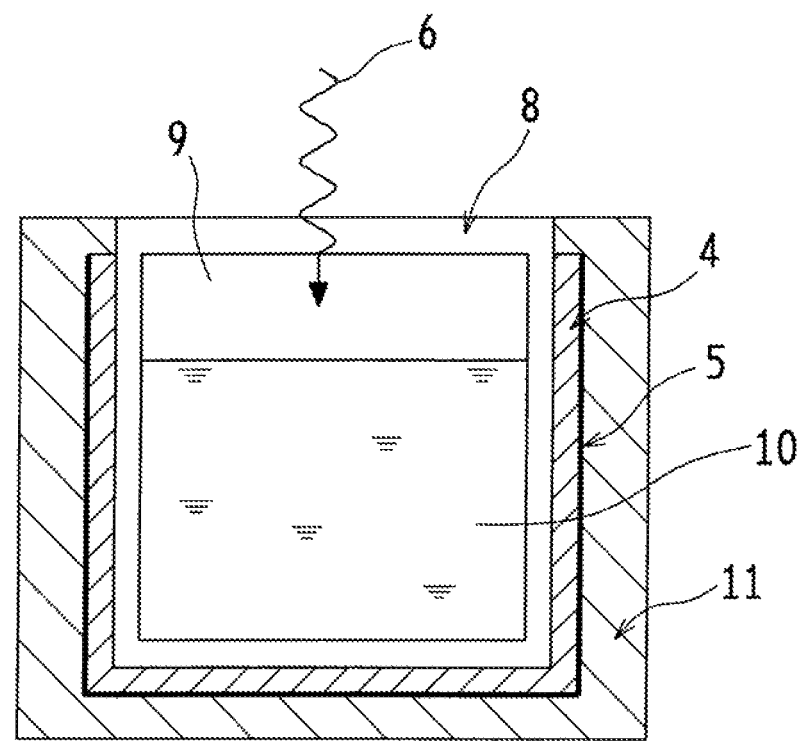
FIG. 2 is a cross-sectional view of a photocatalyst in accordance with an example of the present invention.

A photocatalyst in accordance with an example of the present invention, as illustrated in FIG. 2, includes a glass channel 8, an upconversion layer 4, a light reflecting film 5, and a mechanical support 11. The glass channel 8 contains water 10 to which the photocatalyst has been added (photocatalytic layer) and has a remaining space thereof (where there is no water 10) filled with a gas 9. The upconversion layer 4 is formed on the side and bottom faces of the glass channel 8. The light reflecting film 5 is formed on the exterior faces of the upconversion layer 4. The mechanical support 11 is formed on the exterior faces of the light reflecting film 5 to support the light reflecting film 5.

According to the arrangement in FIG. 2, the upconversion layer 4 upconverts (converts light of relatively long wavelengths to light of relatively short wavelengths) incident light 6 from the sun. This upconversion increases the intensity of light in the range of wavelengths that can be exploited by the photocatalyst added to the water 10 for a catalytic reaction, which in turn further improves photocatalytic conversion efficiency.

A photocatalytic hydrogen and oxygen generating device in accordance with the present invention contains therein the optical wavelength conversion element in accordance with the present invention. For example, a photocatalytic layer may be disposed in the solar cell in FIG. 1, replacing the light-receiving face electrodes 7, the photoelectric conversion layer 1, the transparent back-face electrode 2, and the transparent insulating film 3, to obtain a photocatalytic hydrogen and oxygen generating device with a high hydrogen and oxygen generating efficiency.

A photon upconversion filter in accordance with the present invention converts light of relatively long wavelengths to light of relatively short wavelengths and includes the optical wavelength conversion element in accordance with the present invention and a cell. The optical wavelength conversion element has an oxygen concentration of 100 mass ppm or less as it is sealed in the cell.

The cell may be any cell that is transparent to light and may be fabricated, for example, by placing two plates of glass (e.g., quartz glass or borosilicate glass), one on top of the other, and fusion-joining the peripheries of the plates.

The optical wavelength conversion element as sealed in the cell has an oxygen concentration of preferably 100 mass ppm or less, more preferably 10 mass ppm or less, even more preferably 1 mass ppm or less, and most preferably 0.1 mass ppm or less. If the optical wavelength conversion element has an oxygen concentration of 100 mass ppm or less as it is sealed in the cell, the oxygen concentration is maintained at low values. The resultant photon upconversion filter stably exhibits such a high optical wavelength conversion efficiency that the filter is viable even under sunlight or similar, low intensity light.

The photon upconversion filter may be obtained, for example, by injecting the optical wavelength conversion element into the cell, deoxidizing the element as necessary to lower oxygen concentration in the element to 100 mass ppm or less, and sealing the cell. The deoxidation may be done by one of the following three methods. (1) The optical wavelength conversion element is processed under reduced pressure using, for example, a vacuum pump, such as a rotary pump or a turbomolecular pump. (2) The optical wavelength conversion element is bubbled with an inert gas, such as nitrogen gas or argon gas. (3) The optical wavelength conversion element is frozen and thereafter processed under reduced pressure using a vacuum pump (vacuum deaeration, freeze vacuum degassing).

This photon upconversion filter may be used as the upconversion layer 4 in the aforementioned solar cell, photocatalyst, and photocatalytic hydrogen and oxygen generating device.

An oxygen getter may coexist in the solar cells, photocatalysts, photocatalytic hydrogen and oxygen generating devices, photon upconversion filters, and like articles that contain the optical wavelength conversion element in accordance with the present invention, to lower oxygen concentration in the optical wavelength conversion element. In addition, a water absorbing material may coexist in the solar cells, photocatalysts, photocatalytic hydrogen and oxygen generating devices, photon upconversion filters, and like articles that contain the optical wavelength conversion element in accordance with the present invention, to lower oxygen concentration in the optical wavelength conversion element.

EXAMPLES OF THE INVENTION

Next, the present invention will be described in more detail by way of examples. The present invention is by no means limited by these examples.

Example 1

Preparation of Optical Wavelength Conversion Element

400 µL of 1-butyl-2,3-dimethylimidazolium bis(trifluoromethylsulfonyl)imide (CAS Number: 350493-08-2; manufacturer: IoLiTec Ionic Liquids Technologies GmbH; hereinafter "Ionic Liquid #1") as the water-immiscible ionic liquid (C) was put in a glass vial (capacity: approximately 8 mL) at room temperature. Subsequently, approximately 20 µL of a stock solution, or a $4 \times 10^{-3}$ M toluene solution of 10-methyl-9-acridone (CAS Number: 719-54-0; manufacturer: Tokyo Chemical Industry Co., Ltd.; hereinafter, "Sensitizing Molecules #1") as the organic photosensitizing molecules (A), was added to this Ionic Liquid #1 to obtain a visually non-homogeneous mixed liquid. Similar to the method described in Patent Document 3, this mixed liquid underwent repeated suction-and-ejection using a glass Pasteur pipette (manufacturer: Fisher Scientific Inc.; Product Number: 5-5351-01) until a visually homogeneous and transparent, single-layer mixed liquid was obtained. Immediately after that, the glass vial was capped, and the mixed liquid therein was stirred and homogenized for approximately 7 minutes in an ultrasonic bath sonicator (manufacturer: Branson Ultrasonics Corp.; Product Number: Model 3510). Subsequently, the glass vial was uncapped, placed inside a vacuum container, and vacuumed at room temperature for approximately 1 hour using a scroll pump (manufacturer: Edwards; Product Number: XDS35i; Design Ultimate Pressure is less than 1 Pa). As a result, the toluene, a volatile component, was removed until only a trace amount of the toluene was left, and a visually homogeneous and transparent, single-layer solution and/or dispersion fluid (liquid) was obtained.

Subsequently, approximately 200 µL of a stock solution, which is a $2 \times 10^{-2}$ M methanol solution of naphthalene (CAS Number: 91-20-3; manufacturer: Sigma-Aldrich Co. LLC; hereinafter, "Light-emitting Molecules #1") as the organic light-emitting molecules (B), was added to this liquid (visually homogeneous and transparent, single-layer solution and/or dispersion fluid) to obtain another visually non-homogeneous mixed liquid. Similar to the earlier process, this mixed liquid underwent the repeated suction-and-ejection using the same type of glass Pasteur pipette as that used earlier until a visually homogeneous and transparent, single-layer mixed liquid was obtained. Immediately after that, the glass vial was capped, and the mixed liquid therein was stirred and homogenized for approximately 7 minutes in the same ultrasonic bath sonicator as that used earlier. Subsequently, similar to the earlier process, the glass vial was uncapped, placed inside a vacuum container, and vacuumed at room temperature for approximately 2 hours using the same scroll pump as that used earlier. As a result, the methanol, a volatile component, was removed until only a trace amount of the methanol was left, and a visually homogeneous and transparent, single-layer solution and/or dispersion fluid (liquid) was obtained.

By the above procedures, a visually homogeneous and transparent liquid (optical wavelength conversion element) was obtained which contained the Sensitizing Molecules #1 and the Light-emitting Molecules #1 in the Ionic Liquid #1, from which the volatile solvent used in the stock solution had been removed until only a trace amount of the volatile solvent had been left, and in which the amount of dissolved 02 had been sufficiently suppressed as a result of the vacuuming.

Evaluation of Optical Wavelength Conversion Element

Subsequently, similar to the method described in Patent Document 3, in a glovebox filled with inert argon gas, a portion of the liquid (visually homogeneous and transparent liquid as the optical wavelength conversion element) was injected into a square quartz tube (inner dimensions: 1 mm×1 mm; outer dimensions: 2 mm×2 mm; length: approximately 25 mm) with one open end to fill up to approximately ¾ of the length of the tube. The open end of the quartz tube was sealed using lead soldering, which formed a sample that was sealed in the quartz tube to be used for evaluations of upconversion emission.

This upconversion emission evaluation sample was held in a purpose-made sample holder and irradiated by continuous wave laser light (wavelength: 405 nm; spot diameter: approximately 0.8 mm; hereafter "Continuous Wave Laser Light #1") as excitation light that was emitted from a continuous wave laser generator (manufacturer: World Star Technologies Inc.; Product Number: TECBL-30GC-405). Photoemission from the sample was rendered collimated light using a converging lens placed in the direction perpendicular to the incident excitation light and then refocused using another lens onto the entrance slit of a monochromator (manufacturer: Roper Scientific GmbH; Product Number: SP-2300i). The emission spectrum (spectral profile and intensity) was measured using an electronically cooled silicon CCD (charge coupled device) detector (manufacturer: Roper Scientific GmbH; Product Number: Pixis 100BR) mounted after the monochromator.

Figure 3:
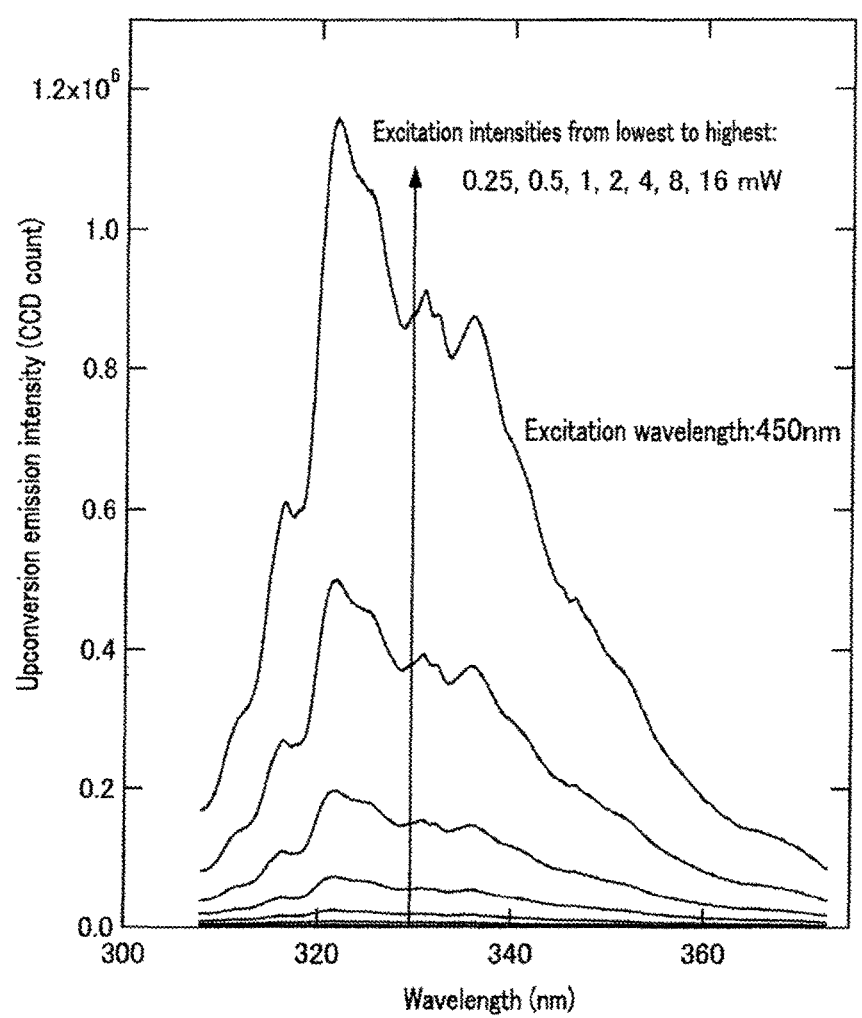
FIG. 3 is a diagram showing an upconversion emission spectrum of an optical wavelength conversion element obtained in Example 1.
Figure 4:
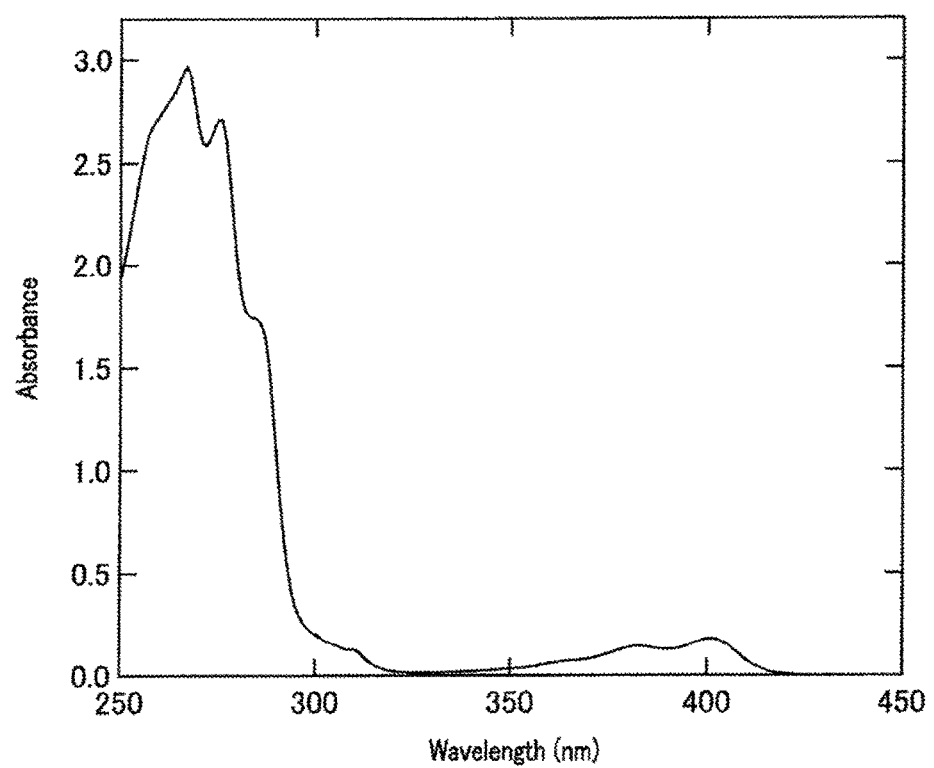
FIG. 4 is a diagram showing an optical absorption spectrum of the optical wavelength conversion element obtained in Example 1.

Surprisingly, as shown in FIG. 3, the results of the measurement showed a remarkable upconverted light emission that mainly distributed from 315 nm to 340 nm in the ultraviolet region, which is far shorter in wavelength than the excitation wavelength (405 nm) (the optical wavelength conversion element exhibited the local emission maxima at 316.4 nm, 321.7 nm, 330.9 nm, 332.1 nm, and 335.9 nm). FIG. 3 shows the changes in the emission spectrum caused by changing the power (excitation intensity) of the Continuous Wave Laser Light #1 irradiated onto the sample for 0.25 mW, 0.5 mW, 1 mW, 2 mW, 4 mW, 8 mW, and 16 mW. These changes confirm that the intensity of the upconverted photoemission increases with increasing the power of the excitation light. The results mean that the optical wavelength conversion element in accordance with the present example is capable of producing ultraviolet lights of short wavelength (lights with wavelength of 350 nm or shorter) from visible lights (lights with wavelength of 400 nm or longer), and thus mean a significantly meaningful and novel invention that solves the problems described in the above heading, "Problems to Be Solved by the Invention." In addition, FIG. 4 shows an optical absorption spectrum (the optical path length is 1 mm; the same shall apply hereinafter) of the optical wavelength conversion element, which was measured using a UV-visible-near-infrared spectrophotometer (manufacturer: Shimadzu Corporation; Product Number: UV-3600; the same shall apply hereinafter). The wavelength corresponding to the longest-wavelength-lying peak in the spectrum of optical absorption attributable to the 10-methyl-9-acridone as the organic photosensitizing molecules (A) of the wavelength conversion element was 401 nm.

Example 2

Figure 5:
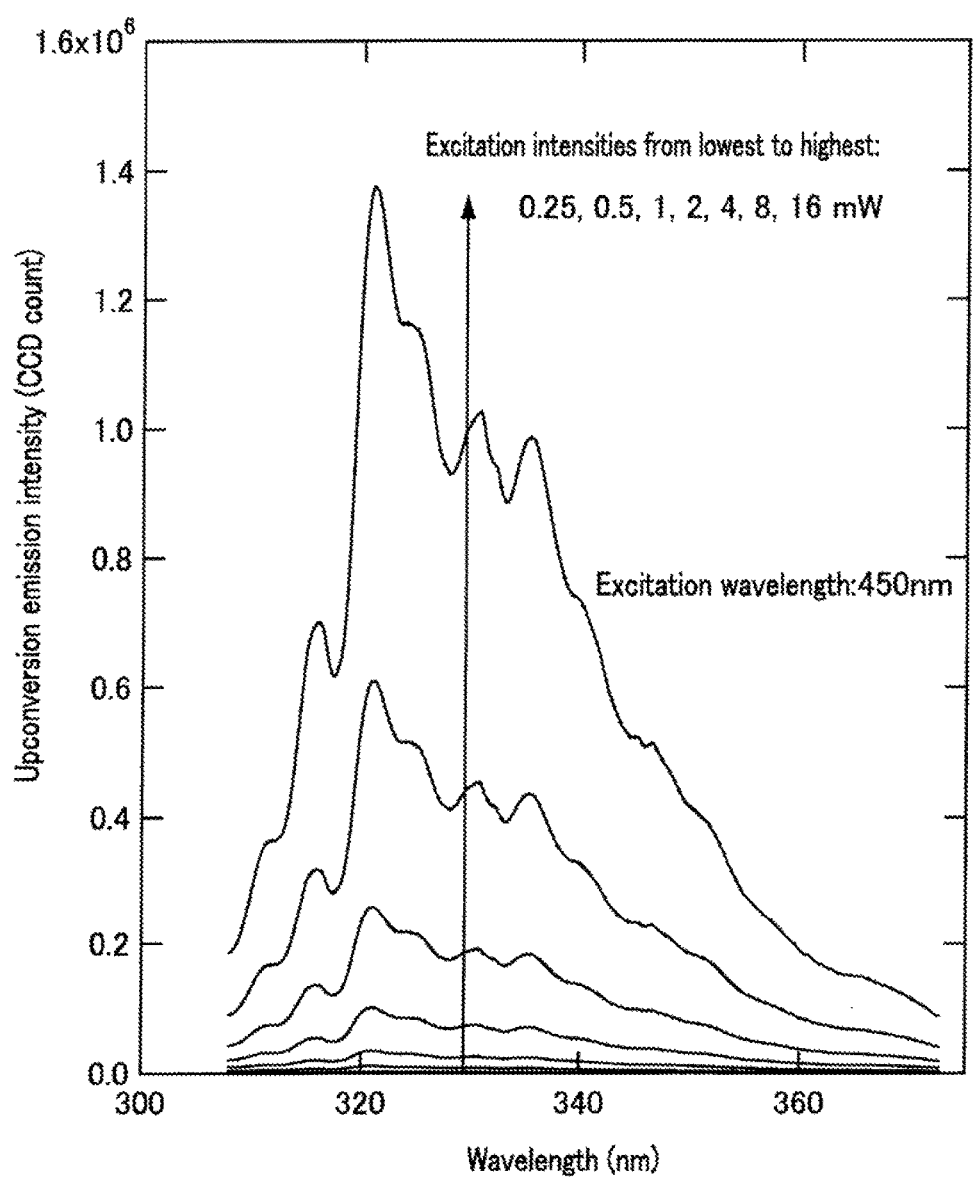
FIG. 5 is a diagram showing an upconversion emission spectrum of an optical wavelength conversion element obtained in Example 2.
Figure 6:
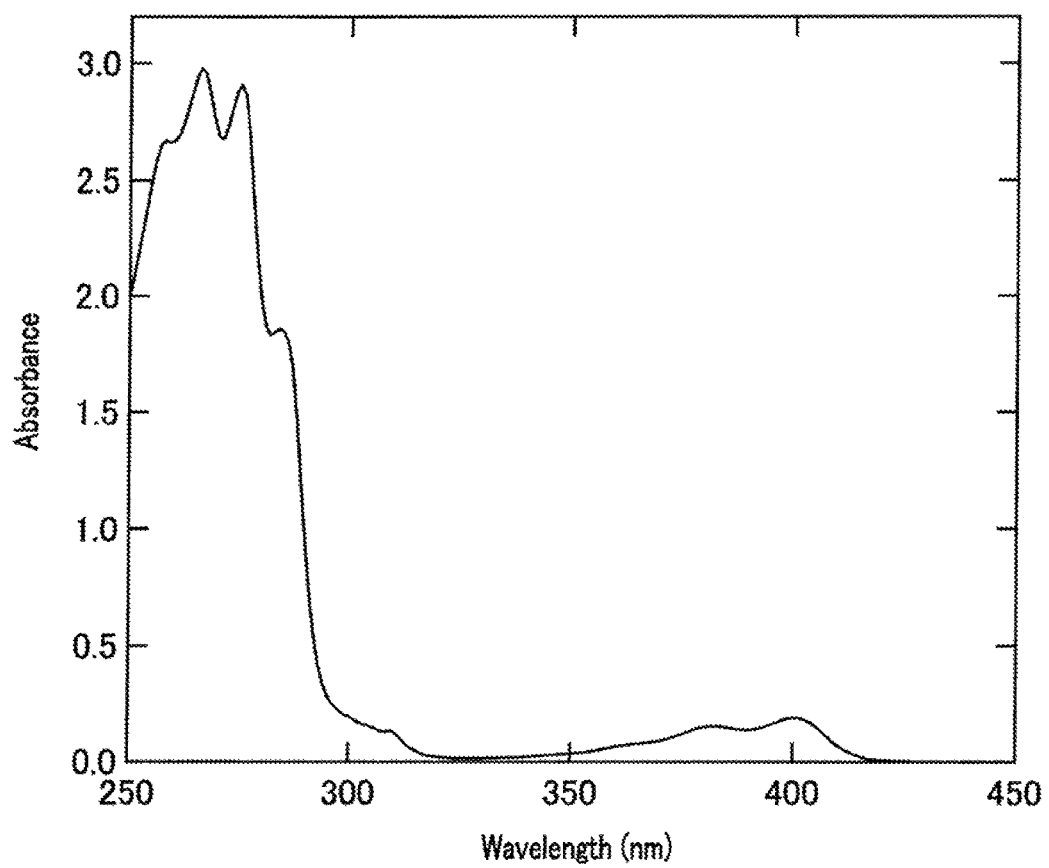
FIG. 6 is a diagram showing an optical absorption spectrum of the optical wavelength conversion element obtained in Example 2.

Another optical wavelength conversion element was prepared and evaluated by completely the same procedures as in Example 1, except that 1-butyl-1-methylpyrrolidinium bis(trifluoromethylsulfonyl)imide (CAS Number: 223437-11-4; manufacturer: Merck KGaA; hereinafter "Ionic Liquid #2") as the water-immiscible ionic liquid (C) was used in place of the Ionic Liquid #1 in Example 1. Results are shown in FIG. 5 (the optical wavelength conversion element showed photoemission maxima at 315.9 nm, 321.0 nm, 330.8 nm, and 335.4 nm in wavelength). The results are similar to those shown in FIG. 3, except for the slightly different shapes of the upconversion emission spectra that are attributable to the use of ionic liquids of different properties. The results shown in FIGS. 3 and 5 confirm that the present invention can be carried out irrespective of the type of ionic liquid used. In addition, FIG. 6 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 10-methyl-9-acridone as the organic photosensitizing molecules (A) of the wavelength conversion element was 400 nm.

Based on these findings, the following descriptions will present further examples of the present invention implemented using various combinations of the organic photosensitizing molecules (A) and the organic light-emitting molecules (B).

Example 3

Another optical wavelength conversion element was prepared by the same preparation procedures as those for the optical wavelength conversion element of Example 1, except that the Ionic Liquid #2 was used in place of the Ionic Liquid #1 and that 1-cyanonaphthalene (CAS Number: 86-53-3; manufacturer: Sigma-Aldrich Co. LLC; hereinafter, "Light-emitting Molecules #2") as the organic light-emitting molecules (B) was used in place of the Light-emitting Molecules #1.

Figure 7:
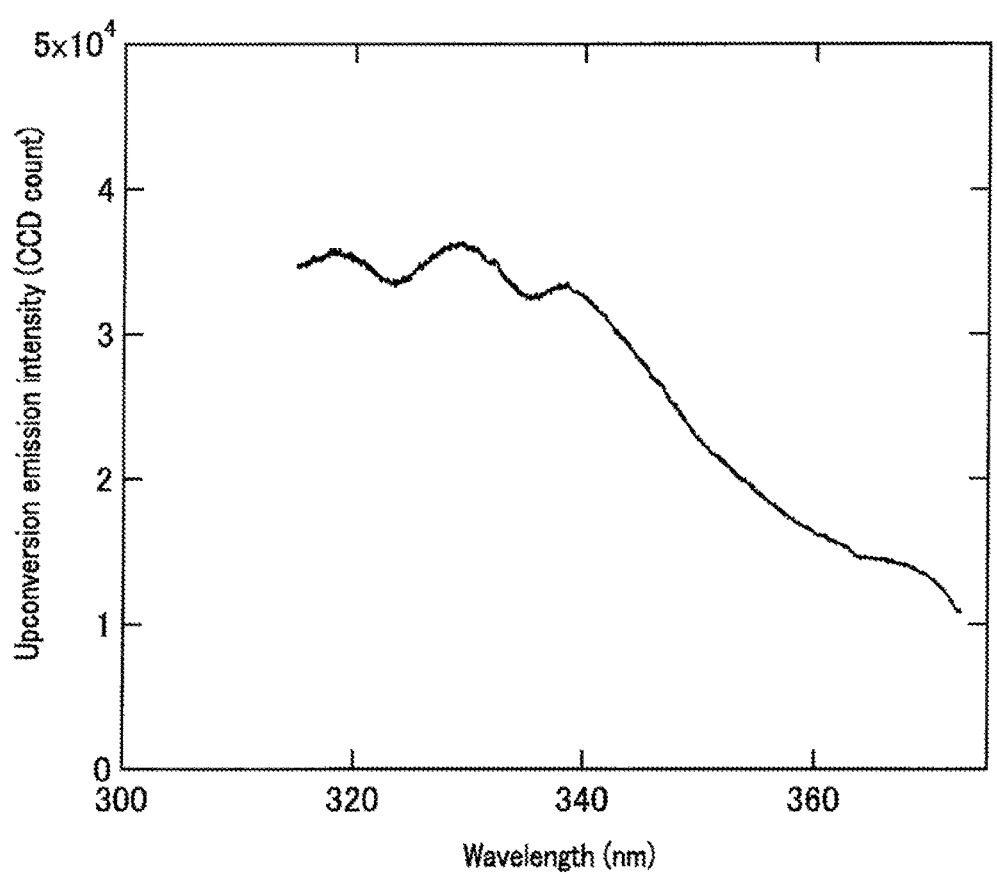
FIG. 7 is a diagram showing an upconversion emission spectrum of an optical wavelength conversion element obtained in Example 3.
Figure 8:
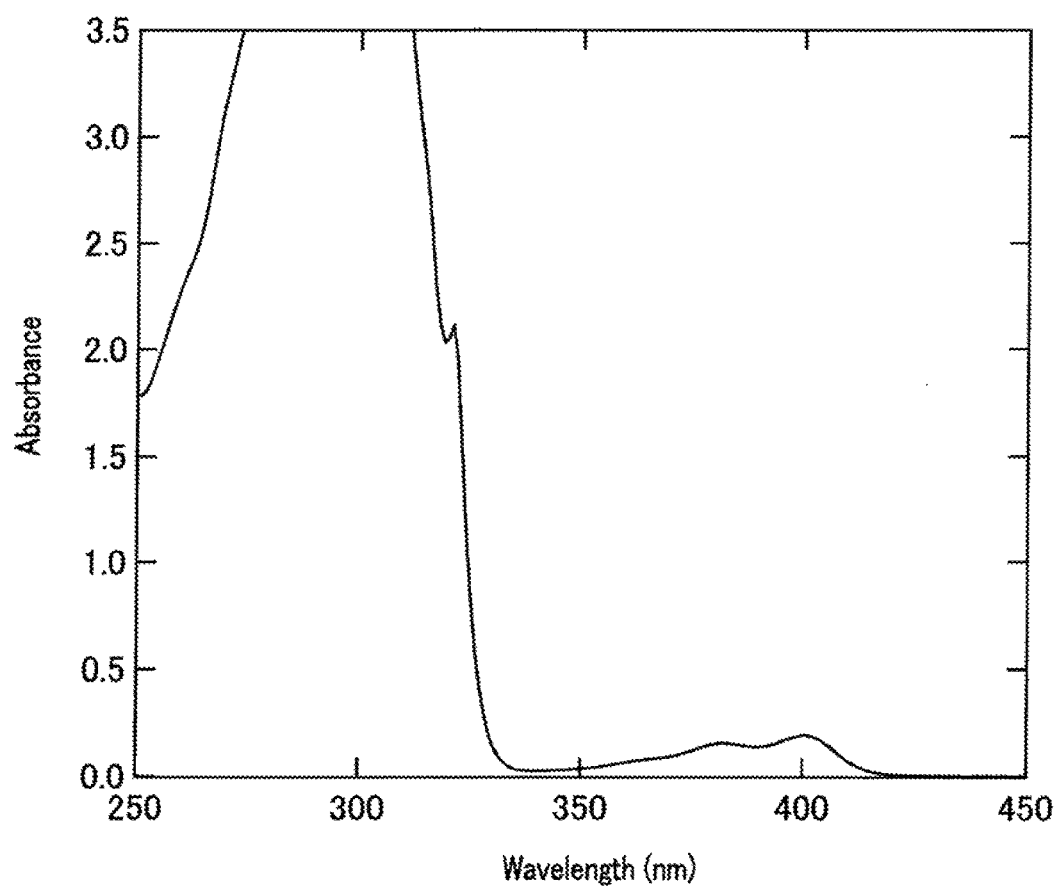
FIG. 8 is a diagram showing an optical absorption spectrum of the optical wavelength conversion element obtained in Example 3.

The Continuous Wave Laser Light #1 was irradiated onto this optical wavelength conversion element at a power of 5 mW. The measurement was performed by the same evaluation procedures as those for the optical wavelength conversion element of Example 1. The obtained upconversion emission spectrum is shown in FIG. 7 (the optical wavelength conversion element showed photoemission maxima at 318.3 nm, 329.1 nm, and 338.2 nm in wavelength). In addition, FIG. 8 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 10-methyl-9-acridone as the organic photosensitizing molecules (A) of the wavelength conversion element was 400.5 nm.

Example 4

Another optical wavelength conversion element was prepared by the same preparation procedures as those for the optical wavelength conversion element of Example 1, except that the Ionic Liquid #2 was used in place of the Ionic Liquid #1 and that 2-methoxynaphthalene (CAS Number: 93-04-9; manufacturer: Tokyo Chemical Industry Co., Ltd.) as the organic light-emitting molecules (B) was used in place of the Light-emitting Molecules #1.

Figure 9:
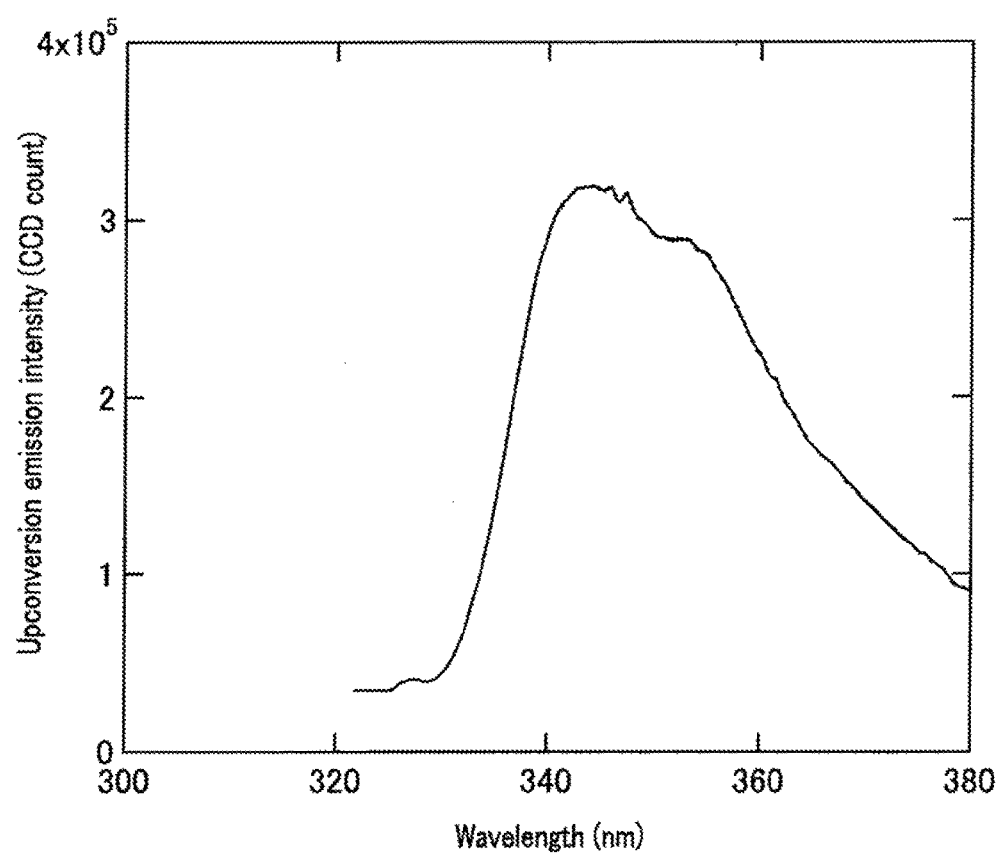
FIG. 9 is a diagram showing an upconversion emission spectrum of an optical wavelength conversion element obtained in Example 4.
Figure 10:
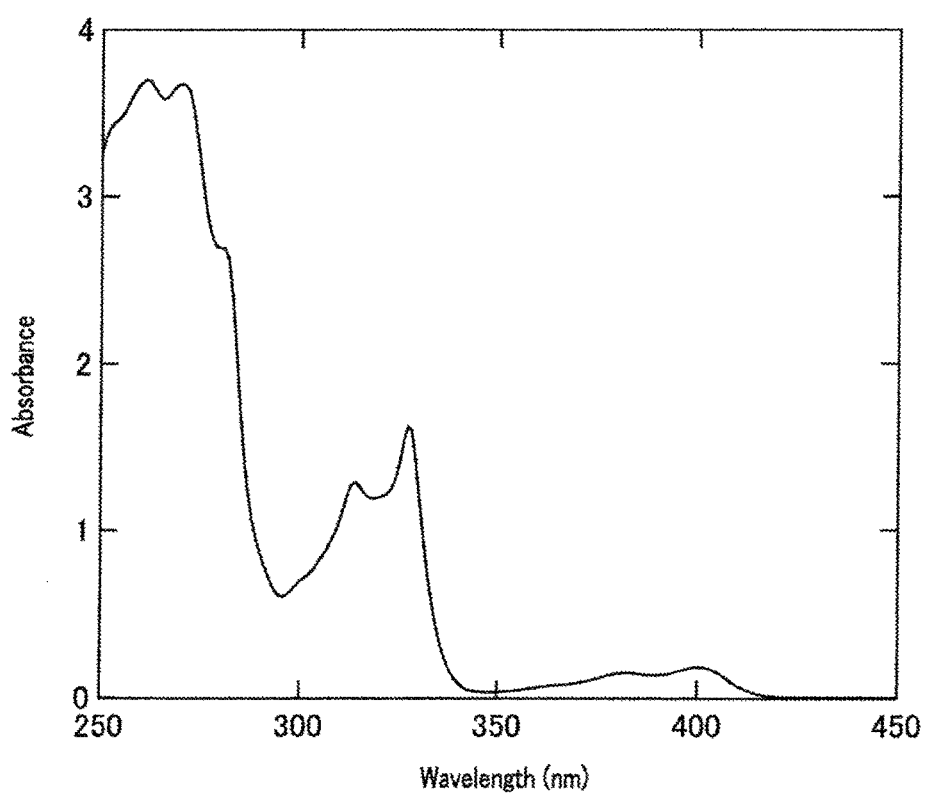
FIG. 10 is a diagram showing an optical absorption spectrum of the optical wavelength conversion element obtained in Example 4.

The Continuous Wave Laser Light #1 was irradiated onto this optical wavelength conversion element at a power of 5 mW. The measurement was performed by the same evaluation procedures as those for the optical wavelength conversion element of Example 1. The obtained upconversion emission spectrum is shown in FIG. 9 (the optical wavelength conversion element showed photoemission maximum at 343.7 nm in wavelength). In addition, FIG. 10 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 10-methyl-9-acridone as the organic photosensitizing molecules (A) of the wavelength conversion element was 400.5 nm.

Example 5

Another optical wavelength conversion element was prepared by the same preparation procedures as those for the optical wavelength conversion element of Example 1, except that the Ionic Liquid #2 was used in place of the Ionic Liquid #1 and that approximately 80 µL of a stock solution in which 2,4-diethylthioxanthone (CAS Number: 82799; manufacturer: Nippon Kayaku Co., Ltd.) as the organic photosensitizing molecules (A) was dissolved in methanol to a concentration of $2\times10^{-3}$ M was added in place of approximately 20 µL of the stock solution in which the Sensitizing Molecules #1 were dissolved in toluene to a concentration of $4\times10^{-3}$ M.

Figure 11:
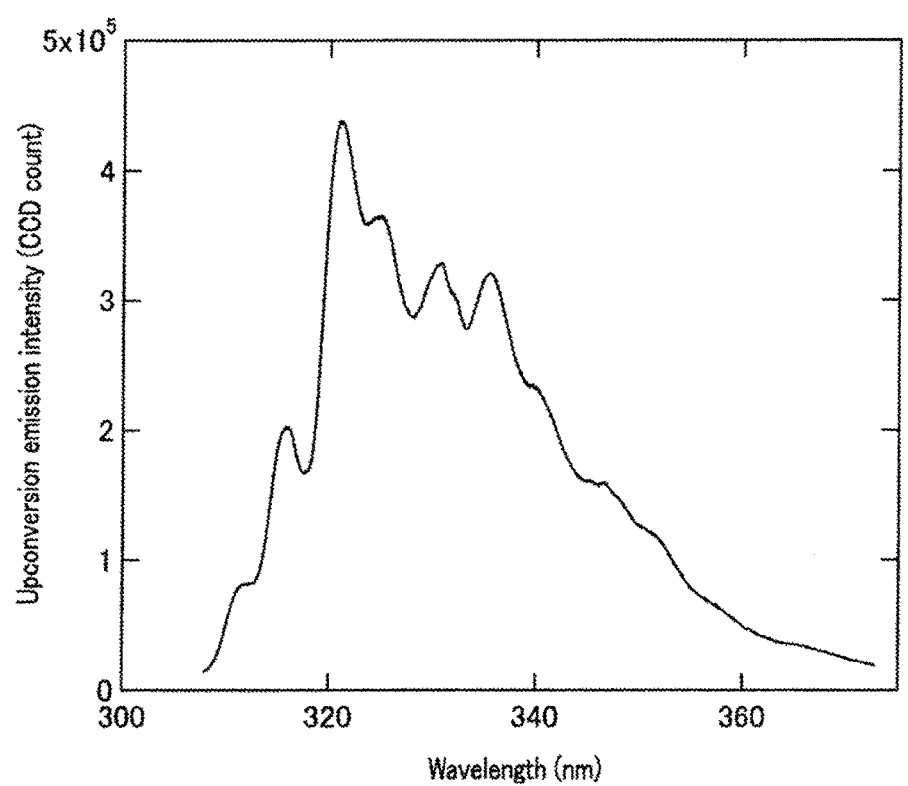
FIG. 11 is a diagram showing an upconversion emission spectrum of an optical wavelength conversion element obtained in Example 5.
Figure 12:
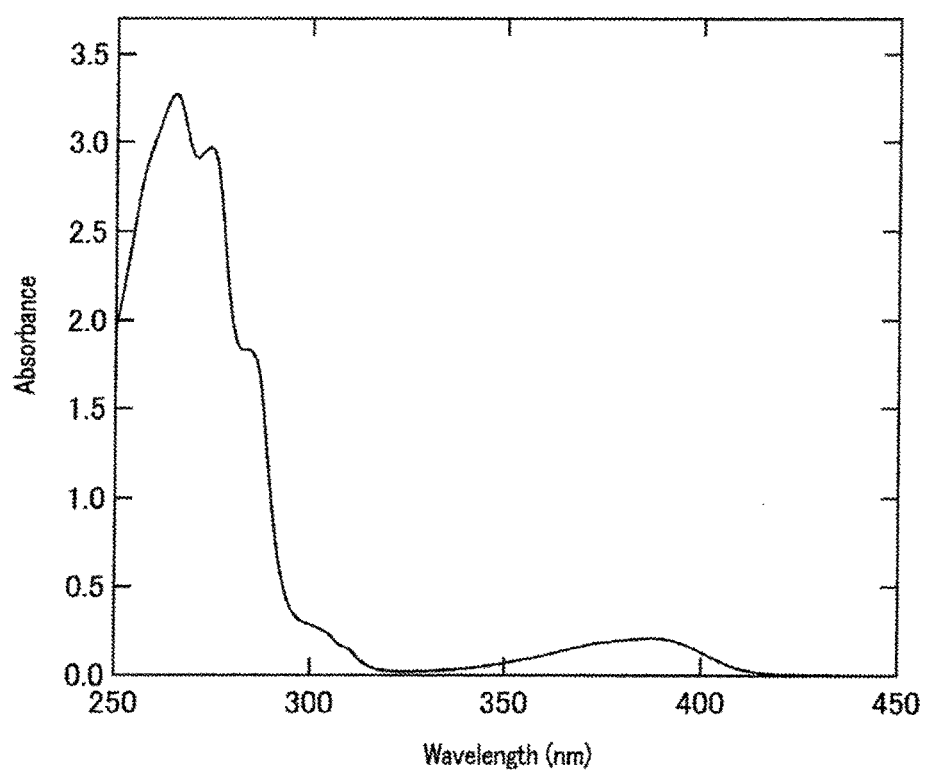
FIG. 12 is a diagram showing an optical absorption spectrum of the optical wavelength conversion element obtained in Example 5.

The Continuous Wave Laser Light #1 was irradiated onto this optical wavelength conversion element at a power of 5 mW. The measurement was performed by the same evaluation procedures as those for the optical wavelength conversion element of Example 1. The obtained upconversion emission spectrum is shown in FIG. 11 (the optical wavelength conversion element showed photoemission maxima at 315.9 nm, 321.0 nm, 324.8 nm, 330.8 nm, and 335.5 nm in wavelength). In addition, FIG. 12 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 2,4-diethylthioxanthone as the organic photosensitizing molecules (A) of the wavelength conversion element was 387 nm.

Example 6

Figure 13:
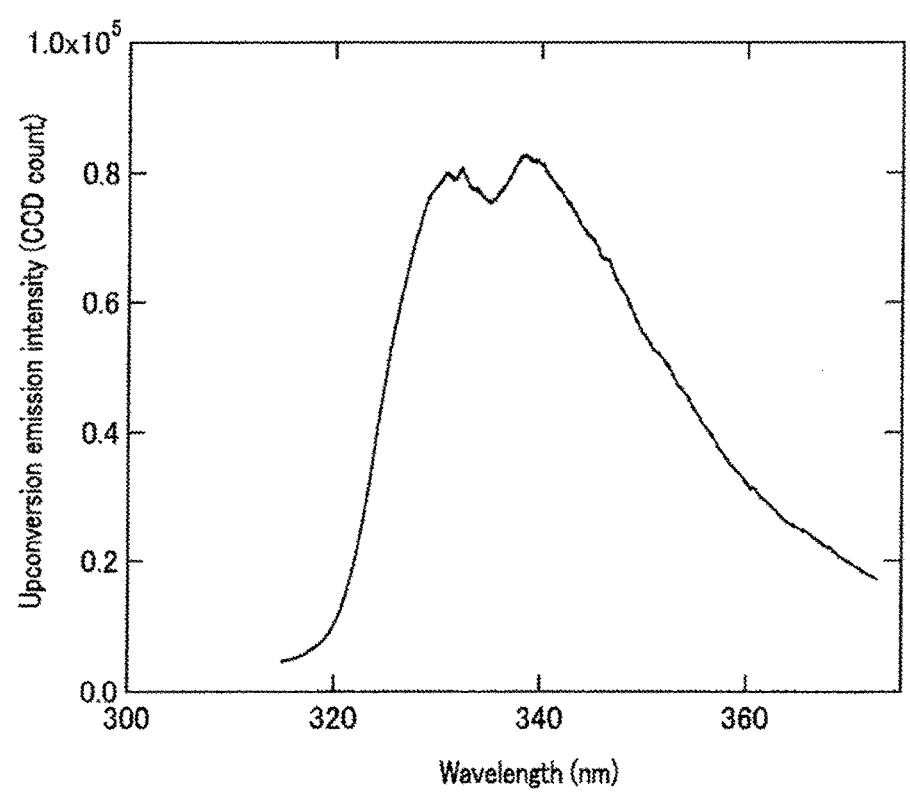
FIG. 13 is a diagram showing an upconversion emission spectrum of an optical wavelength conversion element obtained in Example 6.
Figure 14:
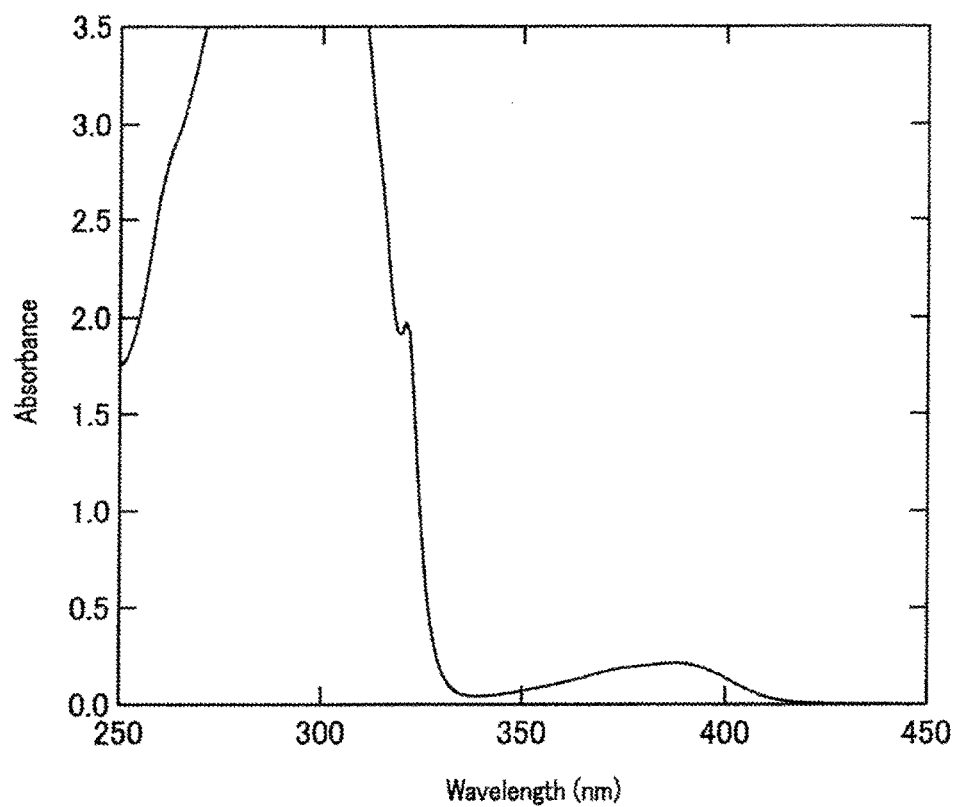
FIG. 14 is a diagram showing an optical absorption spectrum of the optical wavelength conversion element obtained in Example 6.

Another optical wavelength conversion element was prepared by the same procedures as those in Example 5, except that the Light-emitting Molecules #2 was used in place of the Light-emitting Molecules #1. The Continuous Wave Laser Light #1 was irradiated onto this optical wavelength conversion element at a power of 5 mW. The measurement was performed by the same evaluation procedures as those for the optical wavelength conversion element of Example 1. The obtained upconversion emission spectrum is shown in FIG. 13 (the optical wavelength conversion element showed photoemission maxima at 331.2 nm and 338.4 nm in wavelength). FIG. 14 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 2,4-diethylthioxanthone as the organic photosensitizing molecules (A) of the wavelength conversion element was 388 nm.

Example 7

Another optical wavelength conversion element was prepared by the same preparation procedures as those for the optical wavelength conversion element of Example 1, except that the Ionic Liquid #2 was used in place of the Ionic Liquid #1, that approximately 50 µL of a stock solution in which the Sensitizing Molecules #1 were dissolved in toluene to a concentration of $1\times10^{-3}$ M was added in place of approximately 20 µL of the stock solution in which the Sensitizing Molecules #1 were dissolved in toluene to a concentration of $4\times10^{-3}$ M, and that approximately 120 µL of a stock solution in which 2-cyanonaphthalene (CAS Number: 613-46-7; manufacturer: Tokyo Chemical Industry Co., Ltd.) as the organic light-emitting molecules (B) was dissolved in methanol to a concentration of $1\times10^{-2}$ M was added in place of approximately 200 µL of the stock solution in which the Light-emitting Molecules #1 were dissolved in methanol to a concentration of $2\times10^{-2}$ M.

Figure 15:
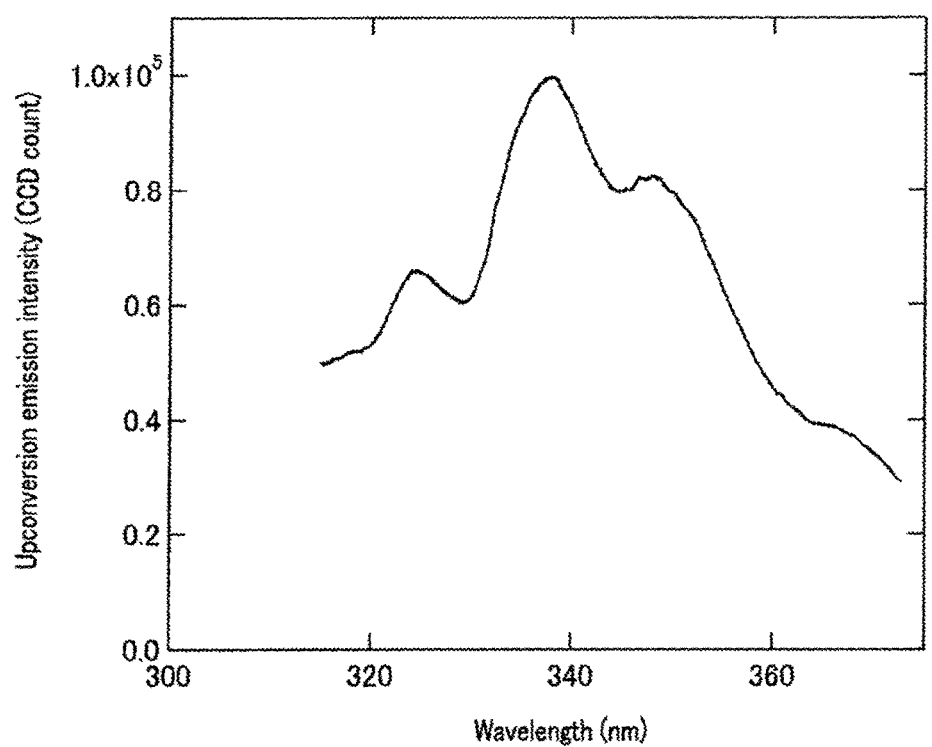
FIG. 15 is a diagram showing an upconversion emission spectrum of an optical wavelength conversion element obtained in Example 7.
Figure 16:
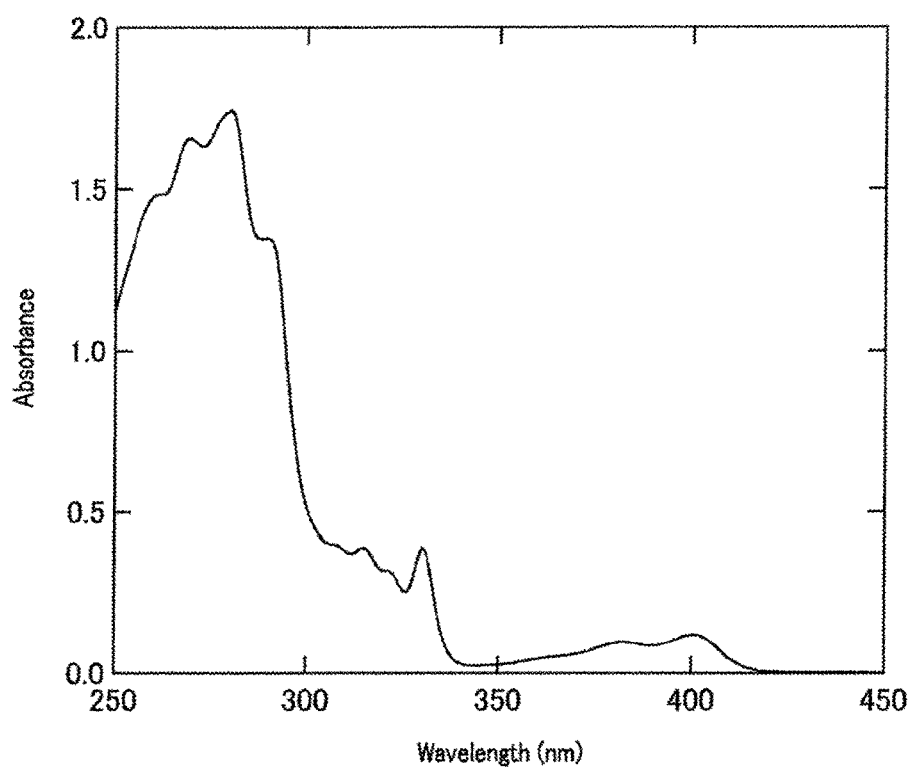
FIG. 16 is a diagram showing an optical absorption spectrum of the optical wavelength conversion element obtained in Example 7.

The Continuous Wave Laser Light #1 was irradiated onto this optical wavelength conversion element at a power of 5 mW. The measurement was performed by the same evaluation procedures as those for the optical wavelength conversion element of Example 1. The obtained upconversion emission spectrum is shown in FIG. 15 (the optical wavelength conversion element showed photoemission maxima at 324.4 nm, 338.0 nm, and 348.0 nm in wavelength). In addition, FIG. 16 shows an optical absorption spectrum of the optical wavelength conversion element as measured with the aforementioned UV-visible-near-infrared spectrophotometer. The wavelength corresponding to the longest-wavelength-lying peak in the spectrum of optical absorption attributable to the 10-methyl-9-acridone as the organic photosensitizing molecules (A) of the wavelength conversion element was 400.5 nm.

The results of Examples 1 to 7 have demonstrated the existences of photoemissions that possess photoemission maxima appeared at shorter wavelengths than the wavelength of absorbed lights, as a result of absorption of lights with ultraviolet-to-visible wavelengths. Thus, it is concluded that the optical wavelength conversion elements (photon upconverters) that can convert lights with ultraviolet-to-visible wavelengths into lights possessing shorter wavelengths has been obtained.

Example 8

Another optical wavelength conversion element was prepared by the same procedures as in Example 1, except that purified and preliminarily dried methyltri-n-octylammonium bis(trifluoromethylsulfonyl)imide (CAS Number: 375395-33-8; manufacturer: Merck KGaA) was used as the ionic liquid (C) in place of the Ionic Liquid #1, that 60 µL of a stock solution in which the Sensitizing Molecules #1 were dissolved in toluene to a concentration of $1\times10^{-3}$ M was used in place of approximately 20 µL of the stock solution in which the Sensitizing Molecules #1 were dissolved in toluene to a concentration of $4\times10^{-3}$ M, that 100 µL of a stock solution in which the Light-emitting Molecules #1 were dissolved in methanol to a concentration of $6.0\times10^{-2}$ M was used in place of approximately 200 µL of the stock solution in which the Light-emitting Molecules #1 were dissolved in methanol to a concentration of $2\times10^{-2}$ M, that the durations of both two rounds of the stirring and homogenization in the ultrasonic bath sonicator were changed to 5 minutes, and that the vacuuming was performed in a pass box of a glovebox.

The prepared optical wavelength conversion element was injected into a quartz tube (inner dimensions: 1 mm on each side) with one open end in argon atmosphere in the glovebox. The open end of the quartz tube was sealed using soldering. This optical wavelength conversion element contained $1.33 \times 10^{-4}$ M Sensitizing Molecules #1 and $1.5 \times 10^{-2}$ M Light-emitting Molecules #1.

Example 9

Another optical wavelength conversion element was prepared by the same procedures as in Example 8, except that 30 µL of a stock solution in which 1-dodecylnaphthalene (CAS Number: 38641-16-6) as the organic light-emitting molecules (B) was dissolved in toluene to a concentration of $1.33 \times 10^{-1}$ M was used in place of 100 µL of the stock solution in which the Light-emitting Molecules #1 were dissolved in methanol to a concentration of $6.0 \times 10^{-2}$ M and that the duration of the second round of vacuuming was changed to 3 hours.

The prepared optical wavelength conversion element was injected into a quartz tube (inner dimensions: 1 mm on each side) with one open end in argon atmosphere in a glovebox. The open end of the quartz tube was sealed using soldering. This optical wavelength conversion element contained $1.33 \times 10^{-4}$ M Sensitizing Molecules #1 and $1.0 \times 10^{-2}$ M 1-dodecylnaphthalene.

Figure 17:
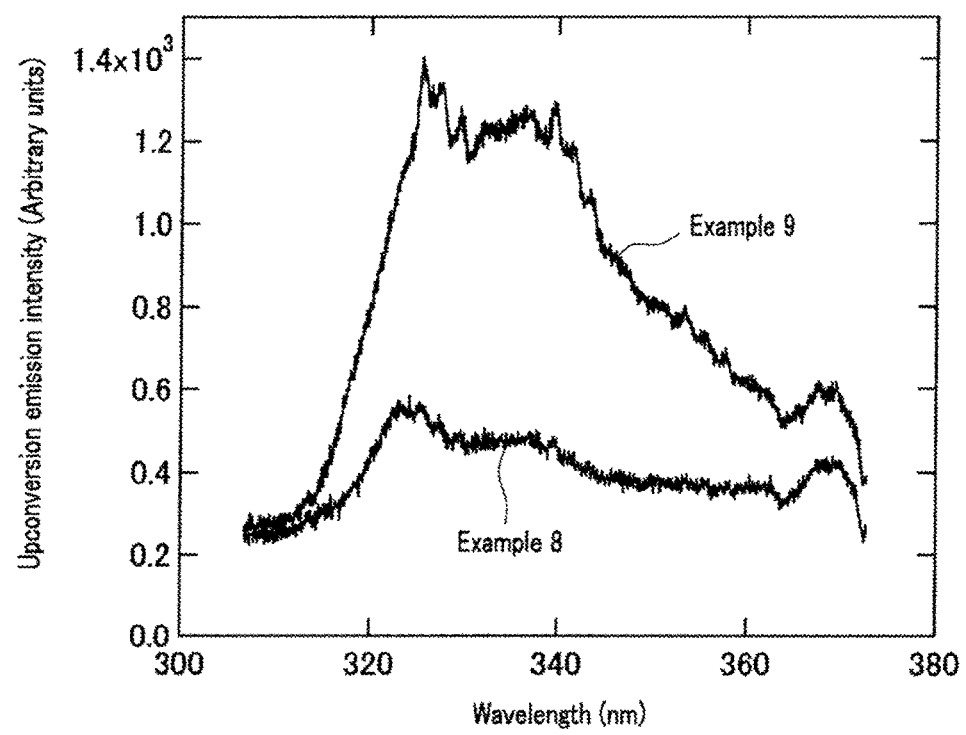
FIG. 17 is a diagram showing upconversion emission spectra of optical wavelength conversion elements obtained in Examples 8 and 9.

The Continuous Wave Laser Light #1 was irradiated onto the optical wavelength conversion elements of Example 8 and Example 9 at an excitation intensity (power) of 3 mW. The measurement was performed by evaluation procedures similar to those for the optical wavelength conversion element of Example 1. The obtained upconversion emission spectra are shown in FIG. 17.

These results show that the optical wavelength conversion element prepared using 1-dodecylnaphthalene as the organic light-emitting molecules (B), similar to the optical wavelength conversion element prepared using naphthalene as the organic light-emitting molecules (B), exhibits distinct upconverted light emission at far shorter wavelengths in the ultraviolet region than the excitation wavelength (405 nm) (in this case, mainly distributed from approximately 320 nm to 360 nm in the ultraviolet region). Comparison of Example 8 and Example 9 shows that the optical wavelength conversion element prepared by using 1-dodecylnaphthalene as the organic light-emitting molecules (B) has higher emission intensities than the optical wavelength conversion element prepared using naphthalene as the organic light-emitting molecules (B).

Example 10

Another optical wavelength conversion element was prepared by the same preparation procedures as those for the optical wavelength conversion element of Example 1, except that 53 µL of a stock solution in which the Sensitizing Molecules #1 were dissolved in toluene to a concentration of $1.0 \times 10^{-3}$ M was used in place of approximately 20 µL of the stock solution in which the Sensitizing Molecules #1 were dissolved in toluene to a concentration of $4 \times 10^{-3}$ M, that 40 µL of a stock solution in which 1-methylnaphthalene as the organic light-emitting molecules (B) was dissolved in methanol to a concentration of $5.0 \times 10^{31~2}$ M was used in place of approximately 200 µL of the stock solution in which the Light-emitting Molecules #1 were dissolved in methanol to a concentration of $2 \times 10^{-2}$ M, that the durations of both two rounds of the stirring and homogenization in the ultrasonic bath sonicator were changed to 5 minutes, and that the vacuuming was performed in a pass box in a glovebox.

The prepared optical wavelength conversion element was injected into a quartz tube (inner dimensions: 1 mm on each side) with one open end in argon atmosphere in the glovebox. The open end of the quartz tube was sealed using soldering. This optical wavelength conversion element contained $1.33 \times 10^{-4}$ M Sensitizing Molecules #1 and $5.0 \times 10^{-3}$ M 1-methylnaphthalene.

Figure 18:
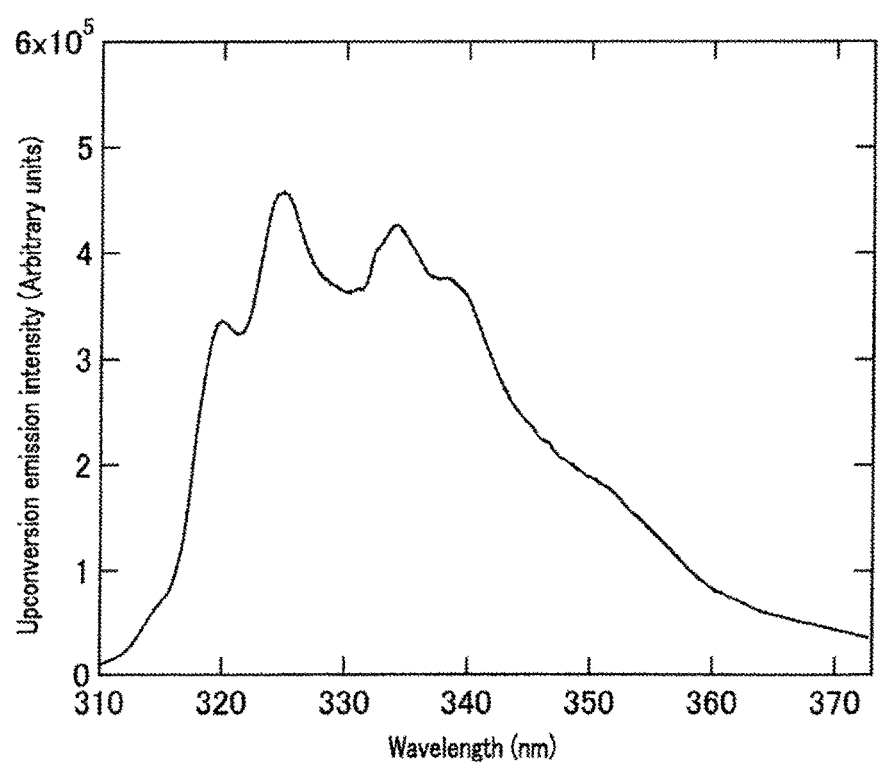
FIG. 18 is a diagram showing an upconversion emission spectrum of an optical wavelength conversion element obtained in Example 10.
Figure 19:
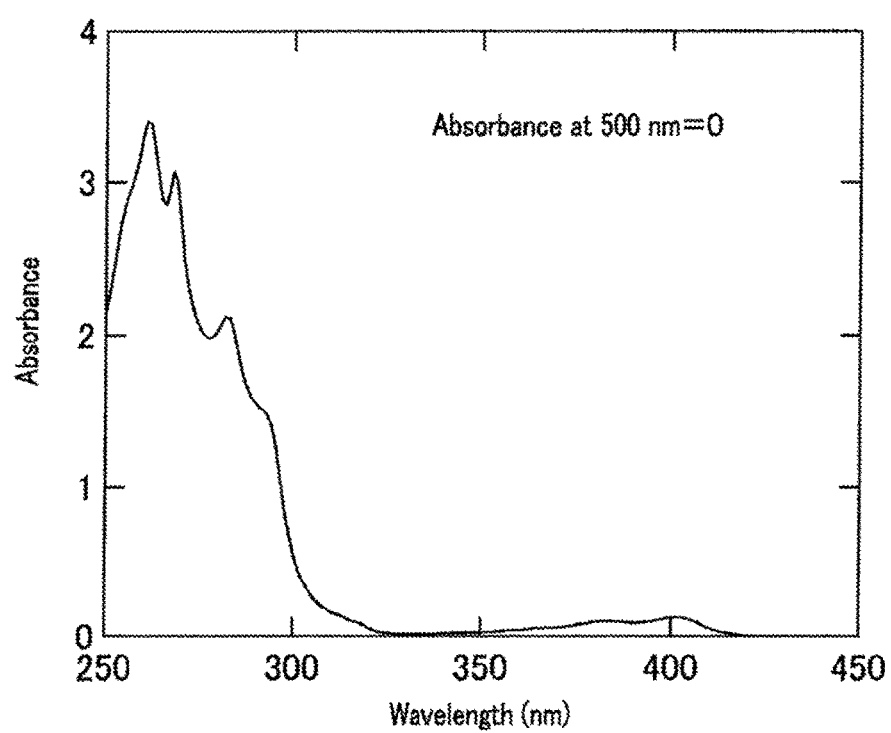
FIG. 19 is a diagram showing an optical absorption spectrum of the optical wavelength conversion element obtained in Example 10.

The Continuous Wave Laser Light #1 was irradiated onto the optical wavelength conversion element of the present example at an excitation intensity (power) of 3 mW. The measurement was performed by evaluation procedures similar to those for the optical wavelength conversion element of Example 1. The obtained upconversion emission spectrum is shown in FIG. 18. FIG. 19 shows an optical absorption spectrum of the optical wavelength conversion element as measured with the aforementioned UV-visible-near-infrared spectrophotometer.

These results show that the optical wavelength conversion element prepared using 1-methylnaphthalene as the organic light-emitting molecules (B) also exhibits distinct upconverted light emission at far shorter wavelengths in the ultraviolet region than the excitation wavelength (405 nm) (in this case, mainly distributed from approximately 320 nm to 350 nm in the ultraviolet region).

Example 11

Another optical wavelength conversion element was prepared by the same procedures as in Example 10, except that 40 µL of a stock solution in which acenaphthene as the organic light-emitting molecules (B) was dissolved in methanol to a concentration of $5.0 \times 10^{-2}$ M was used in place of 40 µL of the stock solution in which 1-methylnaphthalene as the organic light-emitting molecules (B) was dissolved in methanol to a concentration of $5.0 \times 10^{-2}$ M.

The prepared optical wavelength conversion element was injected into a quartz tube (inner dimensions: 1 mm on each side) with one open end in argon atmosphere in a glovebox. The open end of the quartz tube was sealed using soldering. This optical wavelength conversion element contained $1.33 \times 10^{-4}$ M Sensitizing Molecules #1 and $5.0 \times 10^{-3}$ M acenaphthene.

Figure 20:
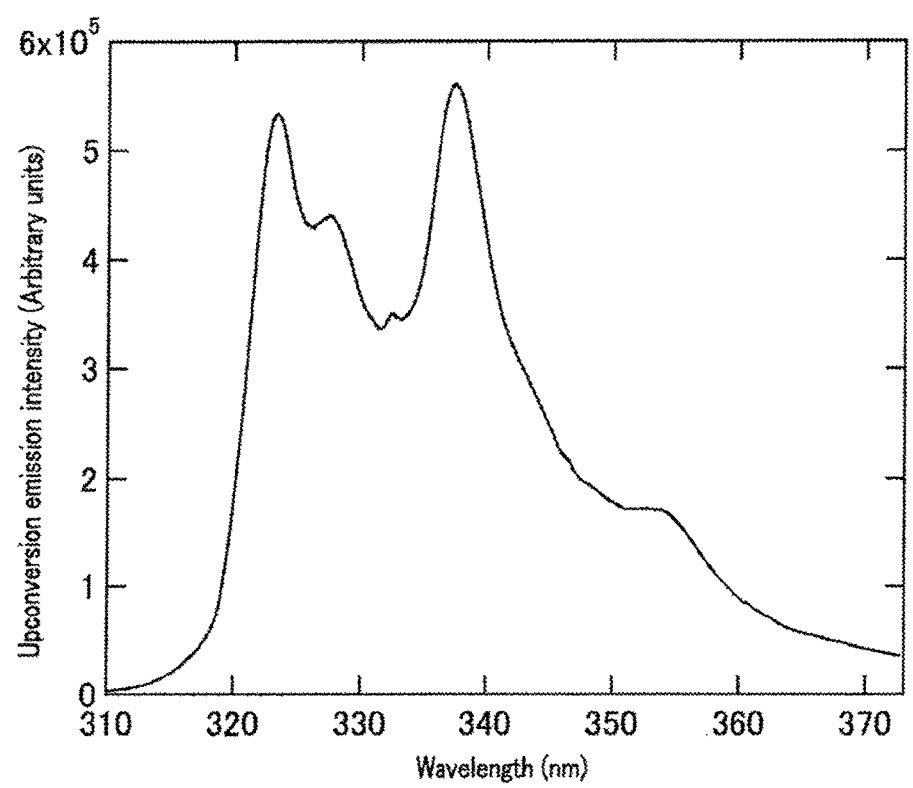
FIG. 20 is a diagram showing an upconversion emission spectrum of an optical wavelength conversion element obtained in Example 11.
Figure 21:
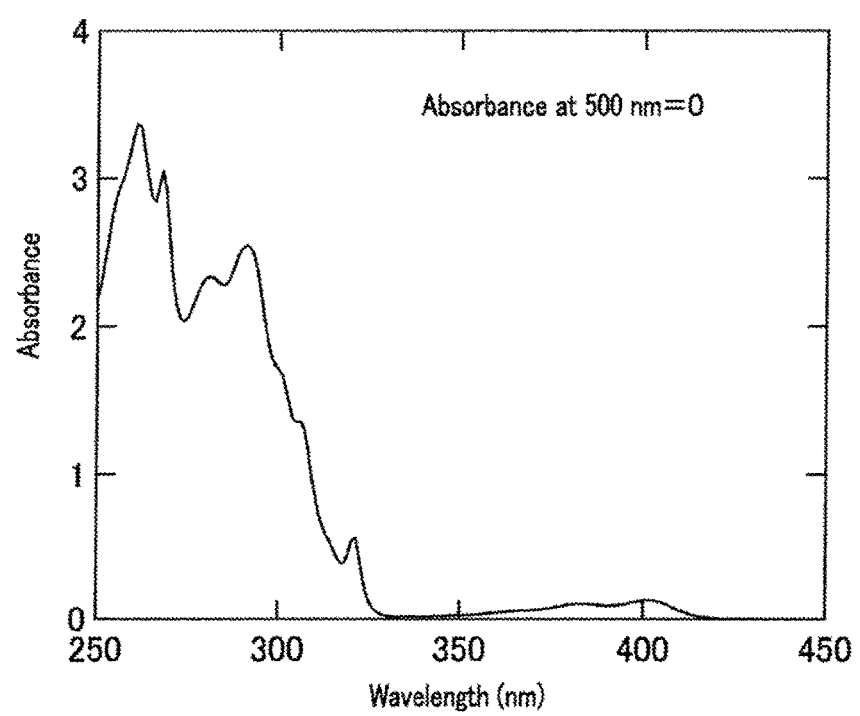
FIG. 21 is a diagram showing an optical absorption spectrum of the optical wavelength conversion element obtained in Example 11.

The Continuous Wave Laser Light #1 was irradiated onto the optical wavelength conversion element of the present example at an excitation intensity (power) of 3 mW. The measurement was performed by evaluation procedures similar to those for the optical wavelength conversion element of in Example 1. The obtained upconversion emission spectrum is shown in FIG. 20. FIG. 21 shows an optical absorption spectrum of the optical wavelength conversion element as measured with the aforementioned UV-visible-near-infrared spectrophotometer.

These results show that the optical wavelength conversion element prepared by using acenaphthene as the organic light-emitting molecules (B) also exhibits distinct upconverted light emission at far shorter wavelengths in the ultraviolet region than the excitation wavelength (405 nm) (in this case, mainly distributed from approximately 320 nm to 350 nm in the ultraviolet region).

Example 12

Another optical wavelength conversion element was prepared by the same procedures as in Example 10, except that 133 µL of a stock solution in which p-terphenyl as the organic light-emitting molecules (B) was dissolved in toluene to a concentration of $1.5 \times 10^{-2}$ M was used in place of 40 μL of the stock solution in which 1-methylnaphthalene as the organic light-emitting molecules (B) was dissolved in methanol to a concentration of $5.0 \times 10^{-2}$ M.

The prepared optical wavelength conversion element was injected into a quartz tube (inner dimensions: 1 mm on each side) with one open end in argon atmosphere in a glovebox. The open end of the quartz tube was sealed using soldering. This optical wavelength conversion element contained $1.33 \times 10^{-4}$ M Sensitizing Molecules #1 and $5.0 \times 10^{-3}$ M p-terphenyl.

Figure 22:
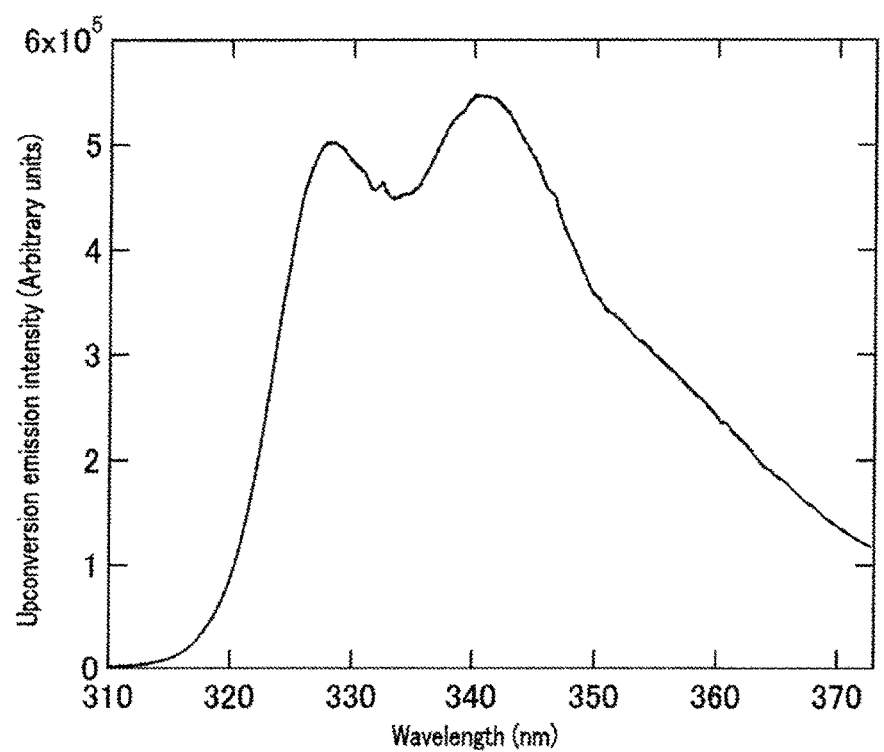
FIG. 22 is a diagram showing an upconversion emission spectrum of an optical wavelength conversion element obtained in Example 12.
Figure 23:
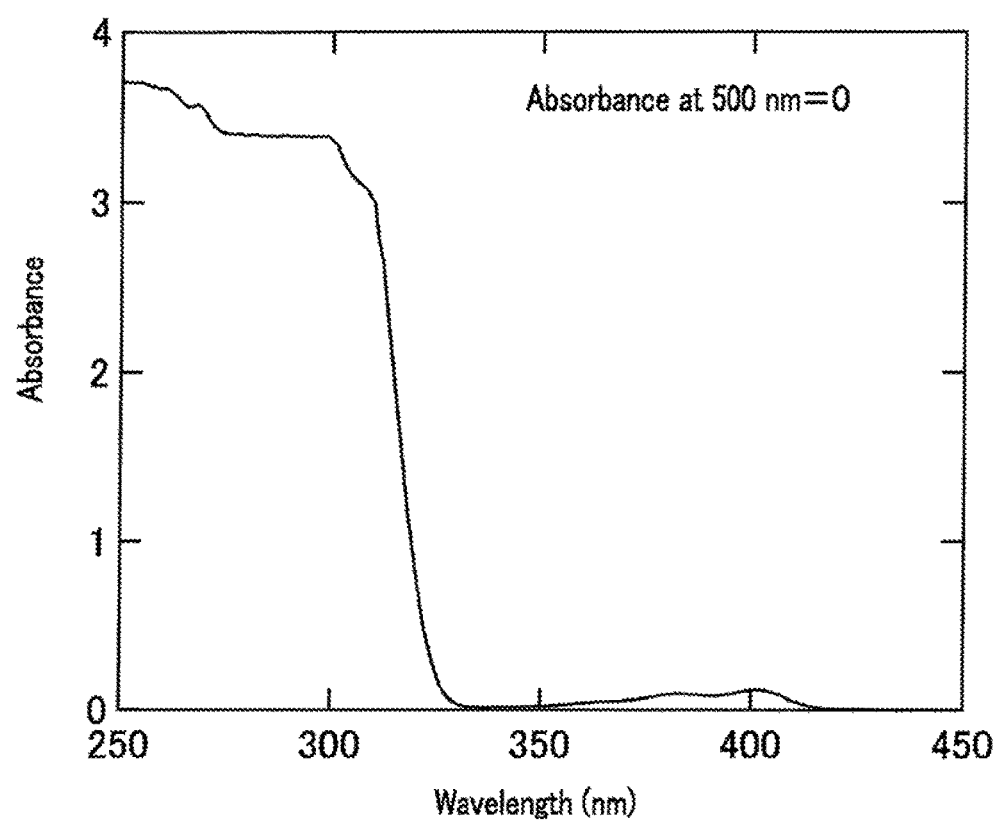
FIG. 23 is a diagram showing an optical absorption spectrum of the optical wavelength conversion element obtained in Example 12.

The Continuous Wave Laser Light #1 was irradiated onto the optical wavelength conversion element of the present example at an excitation intensity (power) of 3 mW. The measurement was performed by evaluation procedures similar to those for the optical wavelength conversion element of Example 1. The obtained upconversion emission spectrum is shown in FIG. 22. FIG. 23 shows an optical absorption spectrum of the optical wavelength conversion element as measured with the aforementioned UV-visible-near-infrared spectrophotometer.

These results show that the optical wavelength conversion element prepared by using p-terphenyl as the organic light-emitting molecules (B) also exhibits distinct upconverted light emission at far shorter wavelengths in the ultraviolet region than the excitation wavelength (405 nm) (in this case, mainly distributed from approximately 320 nm to 360 nm in the ultraviolet region).

Synthesis Example 1 of Gelator (D)

A compound, poly[(dimethylimino)hexane-1,6-diyl(dimethylimino)methylene-1,4-phenylene carbonylimino trans-cyclohexane-1,4-diyliminocarbonyl-1,4-phenylenemethylene bis(trifluoromethane sulfonyl)amide], of

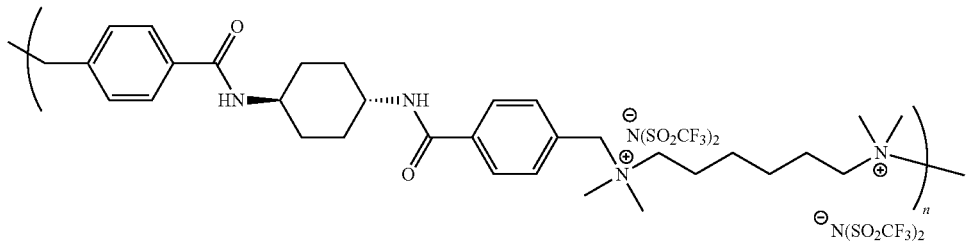

(hereinafter, "Ionic Gelling Agent #1") was synthesized as the gelator (D) (ionic gelator) by the method described by Jun'ichi Nagasawa, et al., ACS Macro Lett., 2012, 1 (9), pp. 1108-1112. The obtained Ionic Gelator #1 had a degree of polymerization, n, of approximately 62 as calculated from the weight average molecular weight thereof. The obtained Ionic Gelator #1 was identified by the following NMR spectroscopy.

$^1$H NMR (400 MHz, DMSO-d6): δ 1.28-1.55 (m, 8H), 1.75-1.98 (m, 8H), 2.95 (s, 12H), 3.22-3.37 (m, 4H), 3.75-3.88 (m, 2H), 4.56 (s, 4H), 7.64 (d, J=7.4 Hz, 4H), 7.99 (d, J=7.4 Hz, 4H), 8.40 (d, J=6.9 Hz, 2H) ppm Example 13

Preparation of Mixture of Gelator (D) and Ionic Liquid (C)

First, 48 mg of the Ionic Gelator #1 obtained in Synthesis Example 1 of the gelator (D) was put into a washed glass vial (capacity: 8 mL), and 150 μL of methanol was dispensed dropwise. Next, the vial was capped and heated for 20 minutes on a hotplate set at 80° C. Next, 400 μL of a purified Ionic Liquid #1 was added into the vial. Immediately after that, the contents of the vial underwent the repeated suction-and-ejection using the same type of glass Pasteur pipette as that used in Example 1 until a uniform mixture was obtained. Then, after the vial was capped, the mixture was subjected to ultrasonic dispersion for 15 minutes in the same ultrasonic bath sonicator as that used in Example 1. Next, the vial was heated for 10 minutes on the hotplate set at 80° C. Subsequently, the vial was uncapped, placed inside a vacuum dry oven (manufacturer: Yamato Scientific Co., Ltd.; Product Number: ADP200), and vacuum heated at 90° C. for 2 hours. The vial was taken out of the vacuum dry oven when the temperature was lowered to 80° C. The vial was then capped and stored overnight in a dark place for cooling. A mixture of the Ionic Gelator #1 and the Ionic Liquid #1 containing 120 g/L Ionic Gelator #1 (gel; "gel stock") as a mixture of the gelator (D) and the ionic liquid (C) was hence obtained.

Preparation of Liquid Gel Stock

250 μL of the gel stock in the vial was measured out and put into another vial. Methanol (250 μL) was dispensed dropwise to the gel stock (Ionic Liquid #1:methanol=1:1 (volume ratio)). Immediately following the dropwise dispensing, the gel dissolved, turning into a liquid. Thereafter, the vial was capped and subjected to ultrasonic dispersion for 10 minutes in the same ultrasonic bath sonicator as that used in Example 1 to improve the uniformity of the liquid gel stock. A highly uniform liquid gel stock containing 60 g/L Ionic Gelator #1 was hence obtained.

Preparation of Ionic Liquid Solution of Organic Photosensitizing Molecules (A)

565 μL of the purified Ionic Liquid #1 (ionic liquid (C)) was put into a washed glass vial (capacity: 8 mL), and 80 μL of a $1 \times 10^{-3}$ M toluene solution of the Sensitizing Molecules #1 as the organic photosensitizing molecules (A) was added. Next, the contents of the vial underwent the repeated suction-and-ejection using the same type of glass Pasteur pipette as that used in Example 1 until a uniform mixture was obtained. Then, after the vial was capped, the mixture was subjected to ultrasonic dispersion for 5 minutes in the same ultrasonic bath sonicator as that used in Example 1. Next, the vial was uncapped, and immediately after that, put in a pass box of a glovebox. The pass box, containing the vial, was vacuumed for 1 hour using the same scroll pump as that used in Example 1 to remove toluene. The vial was then taken out of the glovebox. An ionic liquid solution of the Sensitizing Molecules #1 was hence obtained as an ionic liquid solution of the organic photosensitizing molecules (A).

Preparation of Ionic Liquid Solution of Organic Photosensitizing Molecules (A), Organic Light-Emitting Molecules (B), and Gelator (D)

A $6.0 \times 10^{-2}$ M methanol solution (150 µL) of the Light-emitting Molecules #1 as the organic light-emitting molecules (B) and a liquid gel stock (70 µL) containing 35 µL of methanol and 35 µL of the Ionic Liquid #1 were added to the ionic liquid solution of the Sensitizing Molecules #1 in a vial. Next, the contents of the vial underwent the repeated suction-and-ejection using the same type of glass Pasteur pipette as that used in Example 1 until a uniform mixture was obtained. Then, after the vial was capped, the mixture was subjected to ultrasonic dispersion for 5 minutes in the same ultrasonic bath sonicator as that used in Example 1. Next, the vial was uncapped, and immediately after that, put in the pass box of the glovebox. The pass box, containing the vial, was vacuumed for 2 hours using the same scroll pump as that used in Example 1 to remove methanol. Next, the vial was transferred into the main box of the glovebox and capped in argon atmosphere. An ionic liquid solution of the Sensitizing Molecules #1, the Light-emitting Molecules #1, and the Ionic Gelator #1 (hereinafter, a "sample solution") was hence obtained as an ionic liquid solution of the organic photosensitizing molecules (A), the organic light-emitting molecules (B), and the gelator (D).

Heating and Sealing

A vial containing the sample solution was placed on a hotplate set at 80° C. and heated for 10 minutes in argon atmosphere in the main box of the glovebox. Next, in the argon-filled main box of the glovebox, a portion of the sample solution in the vial was injected into a quartz tube (inner dimensions: 2 mm on each side) with one open end through a syringe with a hypodermic needle. The open end of the quartz tube was sealed using soldering in the main box of the glovebox, and the sample solution was left to sit approximately 1 day. On the following day, the sample solution in the quartz tube was found to have gelated.

An optical wavelength conversion element in accordance with an example of the present invention was hence obtained. The optical wavelength conversion element contained $1.33 \times 10^{-4}$ M Sensitizing Molecules #1, $1.5 \times 10^{-2}$ M Light-emitting Molecules #1, and 7 g/L Ionic Gelator #1.

Figure 24:
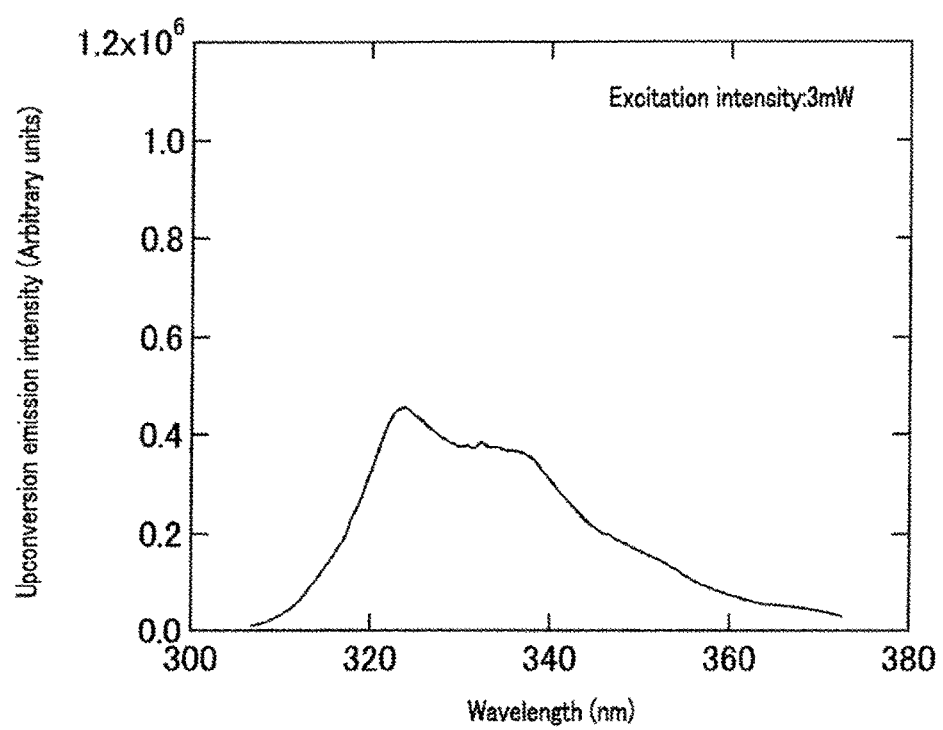
FIG. 24 is a diagram showing an upconversion emission spectrum of an optical wavelength conversion element obtained in Example 13.

The Continuous Wave Laser Light #1 was irradiated onto the optical wavelength conversion element of the present example at an excitation intensity of 3 mW. The measurement was performed by evaluation procedures similar to those for the optical wavelength conversion element of Example 1. The obtained upconversion emission spectrum is shown in FIG. 24.

These results show that the optical wavelength conversion element containing the gelator (D), similar to the optical wavelength conversion element containing no gelator (D), exhibits upconverted light emission at far shorter wavelengths in the ultraviolet region than the excitation wavelength (405 nm) (in this case, mainly distributed from approximately 320 nm to 350 nm in the ultraviolet region).

Example 14

Preparation of Liquid Gel Stock

The purified Ionic Liquid #1 (400 µL) as the ionic liquid (C) and methanol (400 µL) were put into a washed glass vial (capacity: 8 mL) (Ionic Liquid #1:methanol=1:1 (volume ratio)), and the Ionic Gelator #1 (20 mg) obtained in Synthesis Example 1 of the gelator (D) was added. The vial was firmly capped and subjected to ultrasonic dispersion for 30 minutes in the same ultrasonic bath sonicator as that used in Example 1. A colorless transparent liquid gel stock was hence obtained that contained 25 g/L Ionic Gelator #1 which mixed visually uniformly in a mixed solution of the Ionic Liquid #1 and methanol.

Preparation of Ionic Liquid Solution of Organic Photosensitizing Molecules (A)

An ionic liquid solution of the Sensitizing Molecules #1 was prepared by the same procedures as in Example 13, except that the amount of the Ionic Liquid #1 used was changed to 344 and that the amount of the $1 \times 10^{-3}$ M toluene solution used of the Sensitizing Molecules #1 was changed to 53 µL.

Preparation of Ionic Liquid Solution of Organic Photosensitizing Molecules (A), Organic Light-Emitting Molecules (B), and Gelator (D)

An ionic liquid solution of the Sensitizing Molecules #1, the Light-emitting Molecules #2, and the Ionic Gelator #1 was obtained by the same procedures as in Example 13, except that a $6.0 \times 10^{-2}$ M methanol solution (100 µL) of the Light-emitting Molecules #2 (1-cyanonaphthalene) was used in place of the $6.0 \times 10^{-2}$ M methanol solution (150 µL) of the Light-emitting Molecules #1 as the organic light-emitting molecules (B) and that 112 µL of a liquid gel stock, prepared by the procedures of the present example, containing 56 µL of methanol and 56 µL of the Ionic Liquid #1, was used in place of 70 µL of the liquid gel stock prepared by the procedures of Example 13.

Heating and Sealing

An optical wavelength conversion element was obtained by the same procedures as in Example 13, except that the heating temperature was changed to 70° C. This optical wavelength conversion element contained $1.33 \times 10^4$ M Sensitizing Molecules #1, $1.5 \times 10^{-2}$ M Light-emitting Molecules #2, and 7 g/L Ionic Gelator #1.

Figure 25:
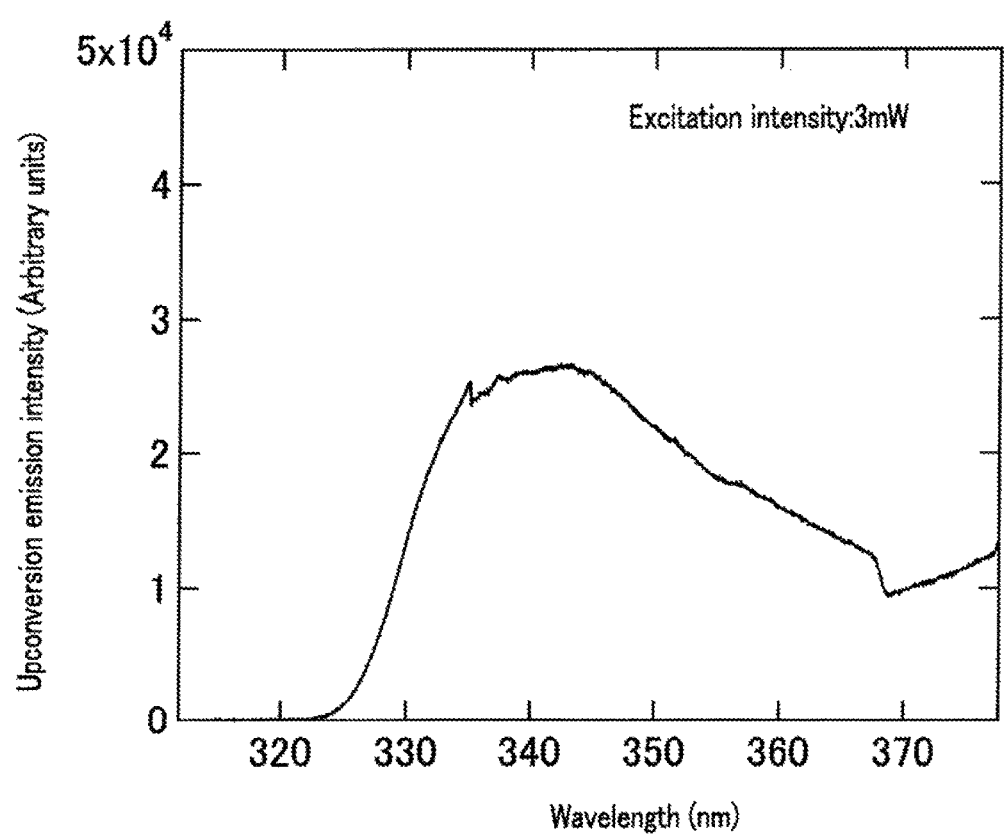
FIG. 25 is a diagram showing an upconversion emission spectrum of an optical wavelength conversion element obtained in Example 14 (excitation intensity: 3 mW).
Figure 26:
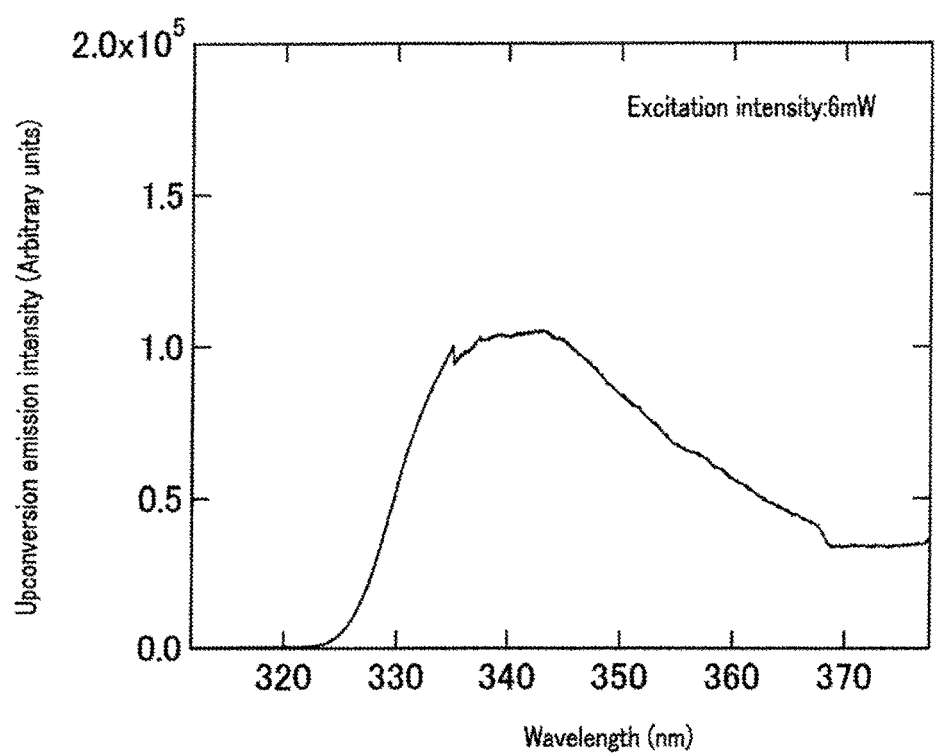
FIG. 26 is a diagram showing an upconversion emission spectrum of the optical wavelength conversion element obtained in Example 14 (excitation intensity: 6 mW).

The Continuous Wave Laser Light #1 was irradiated onto the optical wavelength conversion element of the present example at excitation intensities of 3 mW and 6 mW. The measurement was performed by evaluation procedures similar to those for the optical wavelength conversion element of Example 1. The obtained upconversion emission spectra are shown in FIGS. 25 and 26.

These results show that the optical wavelength conversion element containing the gelator (D) and prepared by using 1-cyanonaphthalene as the organic light-emitting molecules (B), similar to the optical wavelength conversion element containing the gelator (D) and prepared by using naphthalene as the organic light-emitting molecules (B), exhibits upconverted light emission at far shorter wavelengths in the ultraviolet region than the excitation wavelength (405 nm) (in this case, mainly distributed from approximately 330 nm to 360 nm in the ultraviolet region).

The present invention may be implemented in various forms without departing from its spirit and main features. Therefore, the aforementioned examples are for illustrative purposes only in every respect and should not be subjected to any restrictive interpretations. The scope of the present invention is defined only by the claims and never bound by the specification. Those modifications and variations that may lead to equivalents of claimed elements are all included within the scope of the invention.

The present application hereby claims priority on Japanese Patent Application, Tokugan, No. 2014-017103 filed Jan. 31, 2014 in Japan and Japanese Patent Application, Tokugan, No. 2014-023668 filed Feb. 10, 2014 in Japan, the entire contents of which are hereby incorporated herein by reference.

REFERENCE SIGNS LIST

1 Photovoltaic layer
2 Transparent back-face electrode
3 Transparent insulating film
4 Upconversion layer
5 Light reflecting film
7 Light-receiving face electrode
8 Glass channel
9 Gas
10 Photocatalyst-containing water
11 Mechanical support

The invention claimed is:

1. A visually homogeneous and transparent optical wavelength conversion element comprising: a combination of organic photosensitizing molecules (A) and organic light-emitting molecules (B) that exhibits triplet-triplet annihilation; and an ionic liquid (C), the element being produced by dissolving and/or dispersing the combination in the ionic liquid (C), wherein the organic photosensitizing molecules (A) have either an only one local maximum absorption wavelength or a plurality of local maximum absorption wavelengths, and either the single local maximum absorption wavelength or a maximum one of the plurality of local maximum absorption wavelengths is from 250 nm to 499 nm.

2. The optical wavelength conversion element according to claim 1, wherein the optical wavelength conversion element has a local maximum emission wavelength of 400 nm or below.

3. The optical wavelength conversion element according to claim 2, wherein the organic photosensitizing molecules (A) are a compound of general formula (1)

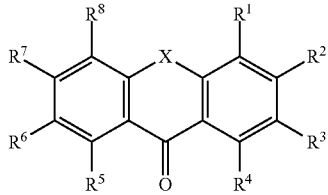

(1)

where each of $R^1$ to $R^8$ is independently any substituent including a hydrogen atom and may be identical to or different from each other, any pair of adjacent substituents in $R^1$ to $R^8$ may be joined together to form a five- or six-membered ring having any substituent including a hydrogen atom, X is a thio group (—S—), a sulfinyl group (—S(=O)—), a sulfonyl group (—S(=O)$_2$—), a divalent group of —N($R^9$)—, or a divalent group of —C($R^{10}$)($R^{11}$)—, and each of $R^9$ to $R^{11}$ is independently any substituent including a hydrogen atom.

4. The optical wavelength conversion element according to claim 3, wherein in general formula (1), X is a thio group, and each of $R^1$ to $R^8$ is independently a hydrogen atom, a halogen atom, an alkyl group, an alkoxy group, a cyano group, a nitro group, an aryl group, or a heteroaryl group.

5. The optical wavelength conversion element according to claim 1, wherein the organic photosensitizing molecules (A) are a compound of general formula (1)

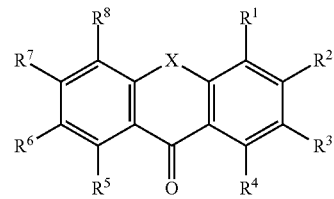

(1)

where each of $R^1$ to $R^8$ is independently any substituent including a hydrogen atom and may be identical to or different from each other, any pair of adjacent substituents in $R^1$ to $R^8$ may be joined together to form a five- or six-membered ring having any substituent including a hydrogen atom, X is a thio group (—S—), a sulfinyl group (—S(=O)—), a sulfonyl group (—S(=O)$_2$—), a divalent group of —N($R^9$)—, or a divalent group of —C($R^{10}$)($R^{11}$)—, and each of $R^9$ to $R^{11}$ is independently any substituent including a hydrogen atom.

6. The optical wavelength conversion element according to claim 5, wherein in general formula (1), X is a thio group, and each of $R^1$ to $R^8$ is independently a hydrogen atom, a halogen atom, an alkyl group, an alkoxy group, a cyano group, a nitro group, an aryl group, or a heteroaryl group.

7. The optical wavelength conversion element according to claim 1, wherein the organic light-emitting molecules (B) are a compound of general formula (2)

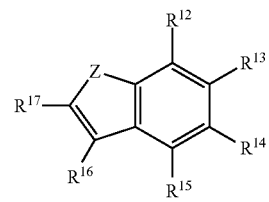

(2)

where Z is a divalent group of —C($R^{18}$)=Y—, a divalent group of —N($R^{20}$)—, an oxy group (—O—), or a thio group, Y is a trivalent group of =C($R^{19}$)— or an aza group (=N—), each of $R^{12}$ to $R^{20}$ is independently any substituent including a hydrogen atom and may be identical to or different from each other, and any pair of adjacent substituents in $R^{12}$ to $R^{20}$ may be joined together to form a five- or six-membered ring having any substituent including a hydrogen atom.

8. The optical wavelength conversion element according to claim 7, wherein in general formula (2), each of $R^{12}$ to $R^{19}$ is independently a hydrogen atom, a halogen atom, an alkyl group, an alkoxy group, a cyano group, a nitro group, an aryl group, or a heteroaryl group, and $R^{20}$ is a hydrogen atom, an alkyl group, an alkenyl group, an alkynyl group, a heterocyclic group, an alkylaryl group, an aryl group, or a heteroaryl group.

9. The optical wavelength conversion element according to claim 1, wherein the organic light-emitting molecules (B) are a compound of general formula (6)

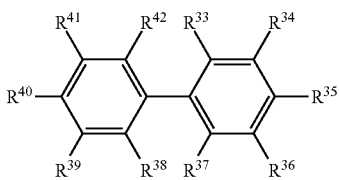

(6)

where each of $R^{33}$ to $R^{42}$ is independently any substituent including a hydrogen atom and may be identical to or different from each other, any pair of adjacent substituents in $R^{33}$ to $R^{42}$ may be joined together to form a five- or six-membered ring having any substituent including a hydrogen atom, $R^{33}$ and $R^{42}$ may be joined together to form a five- or six-membered ring having any substituent including a hydrogen atom, and $R^{37}$ and $R^{38}$ may be joined together to form a five- or six-membered ring having any substituent including a hydrogen atom.

10. The optical wavelength conversion element according to claim 9, wherein in general formula (6), each of $R^{33}$ to $R^{42}$ is independently a hydrogen atom, a halogen atom, an alkyl group, an alkoxy group, a cyano group, a nitro group, an aryl group, or a heteroaryl group.

11. The optical wavelength conversion element according to claim 1, further comprising a gelator (D).

12. The optical wavelength conversion element according to claim 11, wherein the optical wavelength conversion element is in a gel state.

13. The optical wavelength conversion element according to claim 9, wherein the gelator (D) is an ionic gelator.

14. The optical wavelength conversion element according to claim 11, wherein the gelator (D) is a nonionic polymer.

15. A solar cell comprising the optical wavelength conversion element according to claim 1.

16. A photocatalyst comprising the optical wavelength conversion element according to claim 1.

17. A photocatalytic hydrogen and oxygen generating device comprising the optical wavelength conversion element according to claim 1.

18. A photon upconversion filter converting light of relatively long wavelengths to light of relatively short wavelengths,
the filter comprising:
the optical wavelength conversion element according to claim 1; and
a cell,
wherein the optical wavelength conversion element is sealed in the cell.

* * * * *